(12) United States Patent
Yamaguchi et al.

(10) Patent No.: US 7,968,888 B2
(45) Date of Patent: Jun. 28, 2011

(54) SOLID-STATE IMAGE SENSOR AND MANUFACTURING METHOD THEREOF

(75) Inventors: Takumi Yamaguchi, Kyoto (JP); Takahiko Murata, Osaka (JP); Shigetaka Kasuga, Osaka (JP)

(73) Assignee: Panasonic Corporation, Osaka (JP)

( * ) Notice: Subject to any disclaimer, the term of this patent is extended or adjusted under 35 U.S.C. 154(b) by 1048 days.

(21) Appl. No.: 11/422,708

(22) Filed: Jun. 7, 2006

(65) Prior Publication Data
US 2006/0278948 A1 Dec. 14, 2006

(30) Foreign Application Priority Data

Jun. 8, 2005 (JP) ................................ 2005-168701
Jun. 8, 2005 (JP) ................................ 2005-168724
Jun. 8, 2005 (JP) ................................ 2005-168725
Jun. 8, 2005 (JP) ................................ 2005-168726

(51) Int. Cl.
*H01L 31/00* (2006.01)

(52) U.S. Cl. .......... 257/72; 257/432; 257/434; 257/435; 257/232; 257/444; 257/137; 257/E31; 257/E27.133; 257/E37.001; 257/184; 257/187; 257/259; 257/292; 257/461

(58) Field of Classification Search .................. 257/444, 257/72, 184, 187, 259, 292, 461, 432, 434, 257/435, 232, 137, E31, E27.133, E37.001
See application file for complete search history.

(56) References Cited

U.S. PATENT DOCUMENTS

| | | | | |
|---|---|---|---|---|
| 5,537,146 A | * | 7/1996 | Tohyama ...................... 348/311 |
| 5,824,236 A | | 10/1998 | Hawkins et al. |
| 5,844,290 A | * | 12/1998 | Furumiya ...................... 257/432 |
| 6,030,852 A | * | 2/2000 | Sano et al. ...................... 438/69 |
| 6,211,916 B1 | | 4/2001 | Hawkins et al. |
| 6,316,814 B1 | * | 11/2001 | Nagata et al. ................. 257/435 |
| 6,852,562 B1 | * | 2/2005 | Hopper et al. .................. 438/57 |
| 7,297,570 B2 | * | 11/2007 | Kim ............................... 438/70 |
| 2003/0122209 A1 | * | 7/2003 | Uya ............................... 257/435 |
| 2005/0274968 A1 | * | 12/2005 | Kuo et al. ....................... 257/98 |
| 2006/0102827 A1 | | 5/2006 | Kasuga et al. |

(Continued)

FOREIGN PATENT DOCUMENTS

JP 5-315579 11/1993

(Continued)

OTHER PUBLICATIONS

English language Abstract of JP 6-224398, Aug. 12, 1994.

(Continued)

*Primary Examiner* — Wael M Fahmy
*Assistant Examiner* — Marc Armand
(74) *Attorney, Agent, or Firm* — Greenblum & Bernstein, P.L.C.

(57) ABSTRACT

An object of the present invention is to provide a small solid-state image sensor which realizes significant improvement in sensitivity. The solid-state image sensor of the present invention includes a semiconductor substrate in which photoelectric conversion units are formed, a light-blocking film which is formed above the semiconductor substrate and has apertures formed so as to be positioned above respective photoelectric conversion units, and a high refractive index layer formed in the apertures. Here, each aperture has a smaller aperture width than a maximum wavelength in a wavelength of light in a vacuum converted from a wavelength of the light entering the photoelectric conversion unit through the apertures, and the high refractive index is made of a high refractive index material having a refractive index which allows transmission of light having the maximum wavelength through the aperture.

3 Claims, 32 Drawing Sheets

U.S. PATENT DOCUMENTS

2007/0194357 A1 * 8/2007 Oohashi et al. .............. 257/292

FOREIGN PATENT DOCUMENTS

| JP | 5-326902 | 12/1993 |
|---|---|---|
| JP | 5-326903 | 12/1993 |
| JP | 6-140612 | 5/1994 |
| JP | 6-224398 | 8/1994 |
| JP | 7-176708 | 7/1995 |
| JP | 8-288482 | 11/1996 |
| JP | 10-22488 | 1/1998 |
| JP | 10-73703 | 3/1998 |
| JP | 10-214953 | 8/1998 |
| JP | 10-341012 | 12/1998 |
| JP | 2000-164837 | 6/2000 |
| JP | 2001-8104 | 1/2001 |
| JP | 2001-332711 | 11/2001 |
| JP | 2002-151670 | 5/2002 |
| JP | 2003-051585 | 2/2003 |
| JP | 2003-086778 | 3/2003 |
| JP | 2004-311666 | 11/2004 |
| JP | 2004-335803 | 11/2004 |

OTHER PUBLICATIONS

English Language Abstract of JP 10-341012.
English Language Abstract of JP 5-326902.
English Language Abstract of JP 2000-164837.
English Language Abstract of JP 6-224398.
U.S. Appl. No. 10/576,023 to Toshikiyo, filed Apr. 17, 2006.
U.S. Appl. No. 10/576,273 to Toshikiyo, filed Apr. 18, 2006.
U.S. Appl. No. 11/423,776 to Toshikiyo et al., filed Jun. 13, 2006.
U.S. Appl. No. 11/423,803 to Toshikiyo et al., filed Jun. 13, 2006.
U.S. Appl. No. 11/423,989 to Ishii et al., filed Jun. 14, 2006.

* cited by examiner

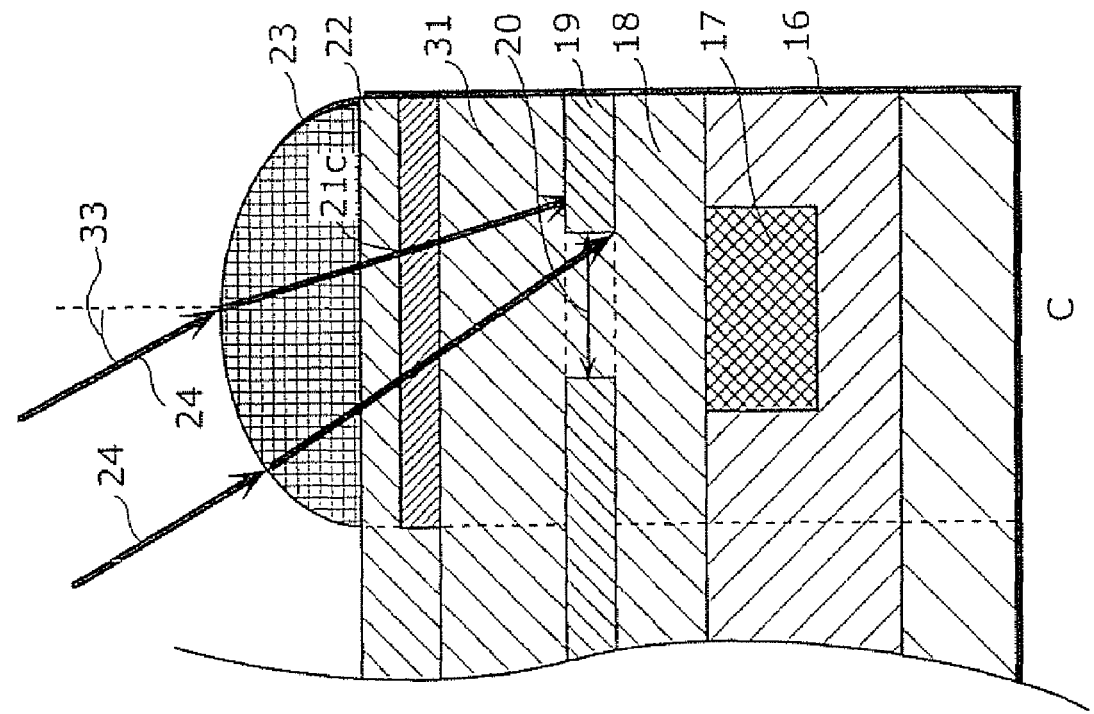
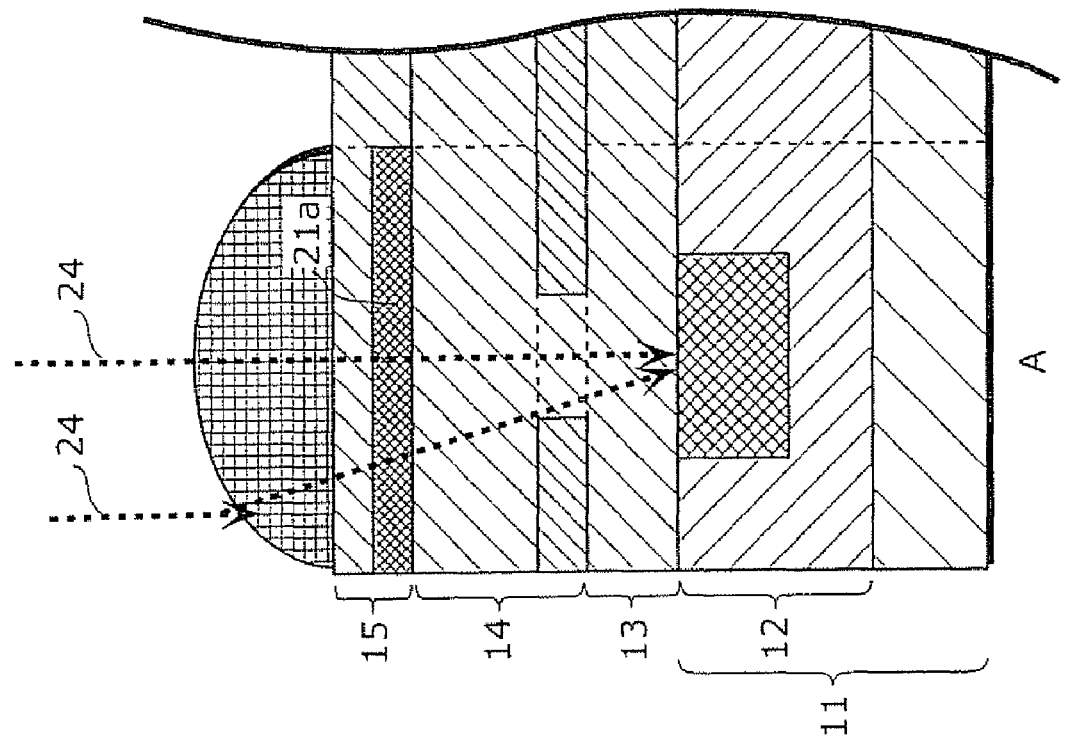
FIG. 5

FIG. 6

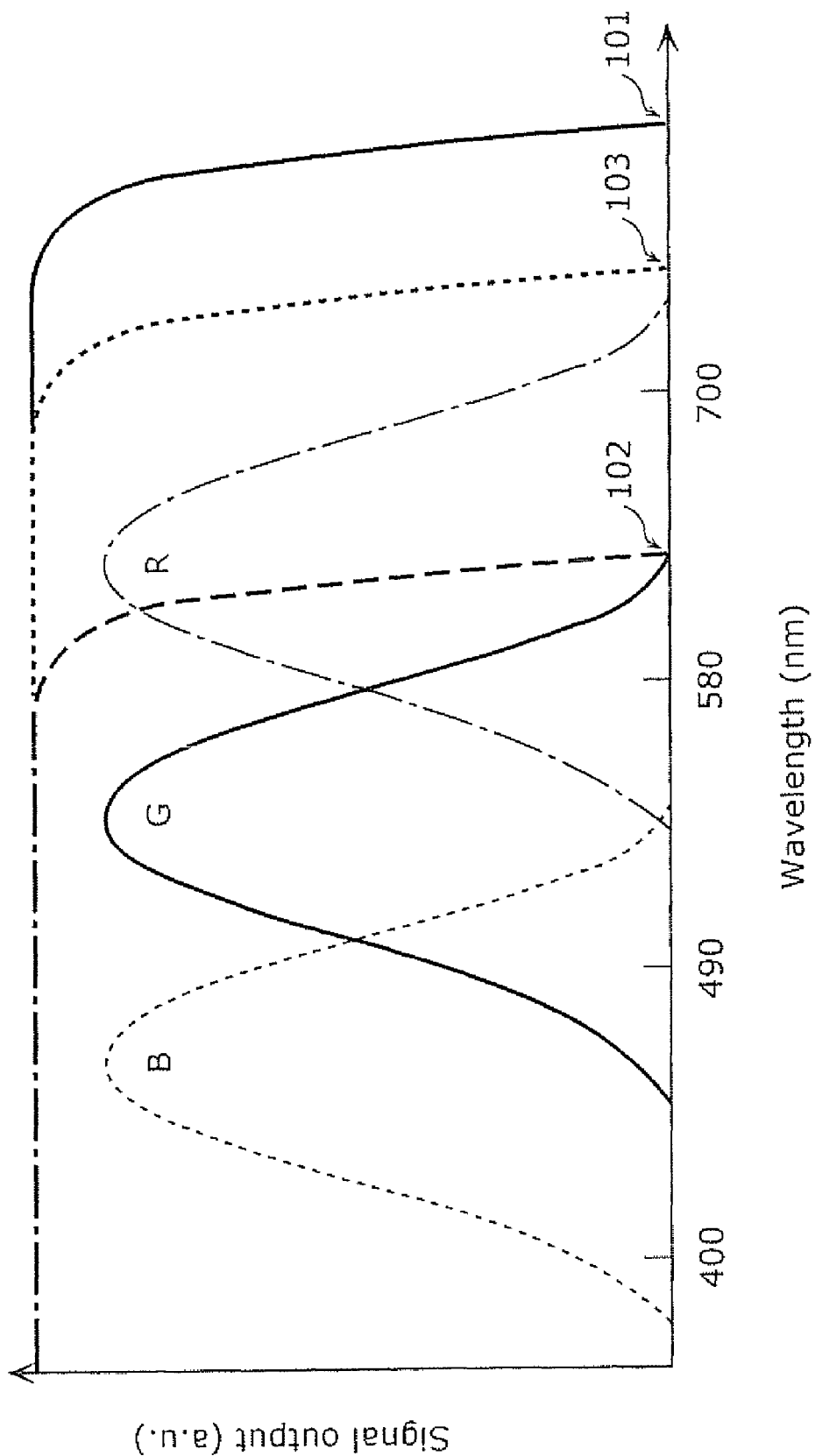

aperture width d

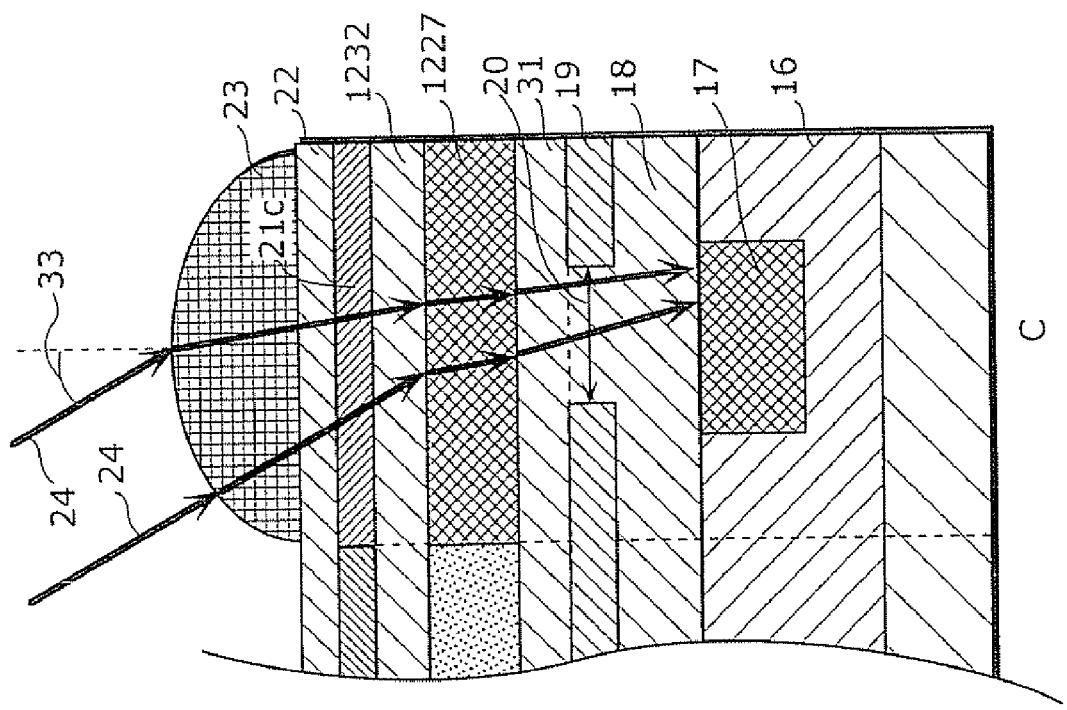
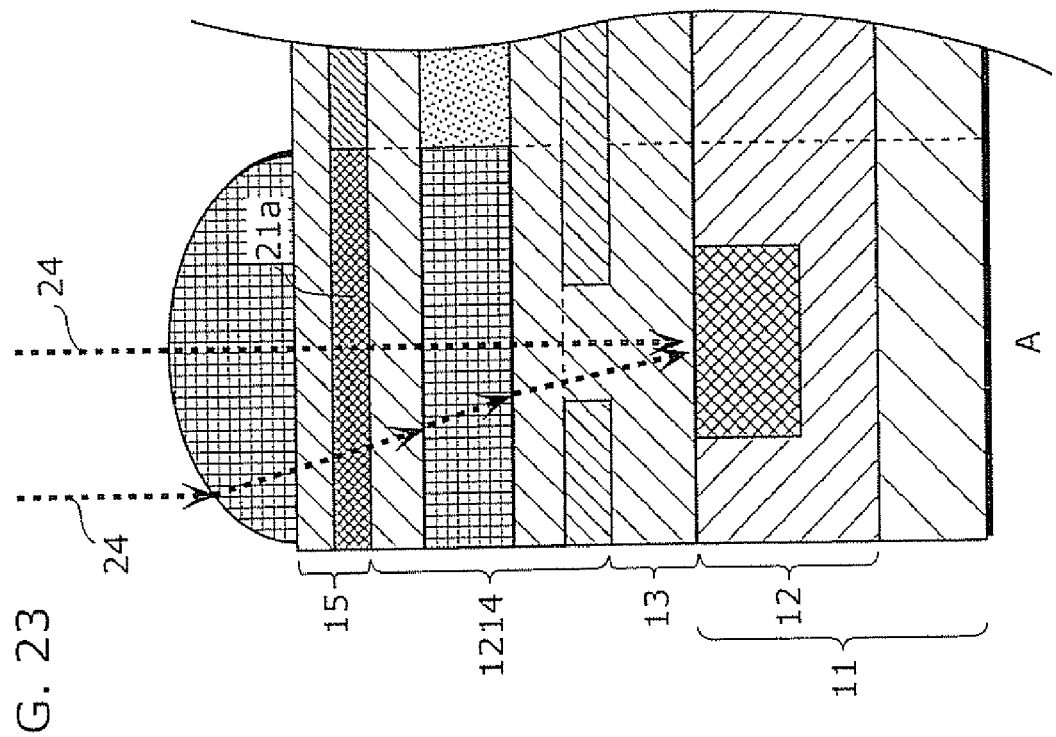
FIG. 23

SOLID-STATE IMAGE SENSOR AND MANUFACTURING METHOD THEREOF

BACKGROUND OF THE INVENTION (1) Field of the Invention

The present invention relates to a solid-state image sensor used for a digital camera and the like, and particularly to light-receiving cells which constitute the solid-state image sensor.

(2) Description of the Related Art

A general solid-state image sensor includes plural light-receiving cells formed on a semiconductor substrate, each of which has a photoelectric conversion unit which converts incident light entering through an aperture in a light-blocking film into signal charge and a color filter which is formed on the light-blocking film and separates the incident light based on colors. A primary color filter or a complementary color filter is commonly used as a color filter. Red (R), blue (B) and green (G) are used for primary color filters, and cyan (C), magenta (M) and yellow (Y) that are complementary colors of red, green and blue are respectively used for complementary color filters. In general, the solid-state image sensor using complementary color filters uses signals obtained through those three complementary color filters and the green (G) filter. One of the color filters is assigned, in a predetermined pattern, to each light-receiving cell. Accordingly, each light-receiving cell generates a signal in accordance with a luminance of a color signal obtained by color-separation through a respective color filter (e.g. refer to Japanese Laid-Open Patent Application No. 10-341012 and Japanese Laid-Open Patent Application No. 5-326902).

Furthermore, a S/N ratio is increased by forming microlenses and the like above and below color filters in order to increase the signals to be generated and realize high sensitivity (e.g. refer to Japanese Laid-Open Patent Application No. 2000-164837).

As a means of realizing high sensitivity in a solid-state image sensor, there is a suggested method of condensing light using total reflection at boundaries between high refractive index materials and low refractive index materials by positioning, in apertures of a light-blocking film, the high refractive index materials and the low refractive index materials so that the low refractive index materials surround the high refractive index materials (e.g. refer to Japanese Laid-Open Patent Application No. 6-224398).

FIG. 1 is a diagram showing a structure of a camera using a solid-state image sensor.

In this camera, incident light 24 reaches a solid-state image sensor 3 in a camera 2 through a camera lens 34.

FIG. 2 is a diagram showing an arrangement of light-receiving cells in a conventional solid-state image sensor.

In this solid-state image sensor, an image is obtained by which light-receiving cells (light-receiving cells positioned in a center A and peripheries B, C and the like) arranged in rows and columns convert, into signal charge, light entering through the camera lens 34 shown in FIG. 1.

FIG. 3 shows a cross-section diagram of light-receiving cells 1a, 1b and c of the conventional solid-state image sensor.

Each light-receiving cell is made up of an insulating layer 13, a metal layer 14 and a color filter layer 15 that are formed on a semiconductor substrate 11 made of silicon doped with N-type impurities. Here, a photoelectric conversion layer 12 is formed in the semiconductor substrate 11. The photoelectric conversion layer 12 includes P-type wells 16 formed by implanting P-type ion impurities in the semiconductor substrate 11 and photoelectric conversion units 17 that are N-type regions formed by further implanting N-type ion impurities in the respective P-type wells 16.

The insulating layer 13 is made up of an interlayer film 18 positioned on the photoelectric conversion layer 12 so as to insulate between the photoelectric conversion layer 12 and the metal layer 14.

The metal layer 14 includes a light-blocking film 19 and intralayer lenses 30. In the formation of the metal layer 14, the light-blocking film 19 is formed and the interlayer film 29 is then formed as a planarizing layer on the light-blocking film 19. Further, the intralayer lenses 30 are formed after the interlayer film 29 is formed on the light-blocking film 19. On the intralayer lenses 30, the interlayer film 31 is formed so as to cover the surfaces of the intralayer lenses 30.

The color filter layer 15 includes a color filter made up of a is blue filter film 21a, a green filter film 21b and a red filter film 21c, and an interlayer film 22 formed on the color filter.

The incident light 24 entering from above the light-receiving cells 1a, 1b and 1c, is condensed by the microlenses 23 formed on the color filter, and passes through one of the blue filter film 21a, the green filter film 21b and the red filter film 21c. The light which has passed through the color filter is condensed again by the intralayer lenses 30 and passes through the apertures 20 and reaches the photoelectric conversion units 17. In the case where the light-receiving cells 1a, 1b and 1c are the large light-receiving cells, each having a square of 5.6 µm as in the case of the conventional solid-state image sensor, the width of each aperture 20 is 2.0 µm or greater. Accordingly, for example, visible light having a red wavelength that is a long wavelength of 650 nm and the like can pass through the apertures without being affected by the aperture widths. Furthermore, near-infrared light of a longer wavelength used for a dark-field camera and the like can also pass sufficiently through the apertures.

SUMMARY OF THE INVENTION

However, as the light-receiving cells are fine-processed and their size is decreased in order to realize a high-pixel solid-state image sensor, the width of an aperture in the light-blocking film becomes closer to the wavelength of visible light such as red (R) light, green (G) light and blue (B) light. When the width of the aperture in the light-blocking film becomes smaller than the wavelength of visible light, in light which has passed through the color filter, the light in a wavelength band which is greater than a wavelength specified based on the width of the aperture is blocked. Therefore, light of a wavelength longer than the blocked wavelength cannot pass through the aperture and reach the photoelectric conversion unit. In this case, it is obvious that a transmittance of red (R) light of a longer wavelength is particularly decreased. For example, when light of a red wavelength of 650 nm in a vacuum passes through a small aperture, the light of the wavelength of 650 nm in a vacuum has a wavelength of 450 nm in the aperture filled with silicon oxide film ($SiO_2$) having a refractive index of 1.45. This is obtained by dividing the wavelength of 650 nm with said refractive index of 1.45 (650 nm/1.45=450 nm). Therefore, whereas the transmittance of this light of the wavelength of 650 nm in a vacuum is as high as zero when the aperture width is around 450 nm, the transmittance actually starts decreasing from around the aperture width of 650 nm. Accordingly, in the case where the aperture is filled with a low refractive index material such as silicon oxide film ($SiO_2$), light having a wavelength as great as or greater than the width of aperture cannot path through the aperture.

In particular, in the case where each light-receiving cell is a small light-receiving cell of a square of 3.2 µm or smaller on a side, the aperture width is 1.0 µm or smaller. With such small aperture width, in the case where the planarizing layer filling up the aperture is made of a low refractive index material, in particular, the visible light of a red wavelength that is a long wavelength and light of a long wavelength such as near-infrared light of 1.0 to 2.0 µm cannot pass through the aperture. For example, in the case where the planarizing layer filling up the aperture is made of a silicon oxide film ($SiO_2$) having a low refractive index of 1.5, low refractive index resin having a refractive index of 1.3 to 1.7 or the like, light of a long wavelength cannot pass through the aperture.

Furthermore, when the width of an aperture in the light-blocking film becomes smaller than the wavelength of visible light, it is difficult to condense light which has passed through each filter film into the aperture even in the case where a microlens and an intralayer lens are used. In particular, since it is more difficult to condense red (R) light having a longer wavelength than green (G) light and blue (B) light having shorter wavelengths, it is hard to make the red (R) light pass through the aperture and reach the photoelectric conversion unit.

FIG. 4 shows a state where light enters a solid-state image sensor (light-receiving cells). As shown in FIG. 4, while a principal ray of light which enters through the camera lens 34 vertically enters a light-receiving cell 1 positioned in a center A, it diagonally enters the light-receiving cells positioned in peripheries B and C. Therefore, in the solid-state image sensor, a state of light entering the microlens is different for each light receiving cell 1. Accordingly, if the light-receiving cells are fine-processed and their size is decreased in order to realize a high-pixel solid-state image sensor, the width of aperture 20 in the light-blocking film 19 is extremely decreased. FIG. 5 is a cross-section diagram of light-receiving cells (light-receiving cells positioned in the center A and the periphery C). As shown in FIG. 5, even in the case where the width of aperture 20 in the light-blocking film 19 is decreased, the incident light 24 vertically enters the microlens 23 in the light-receiving cell 1 positioned in the center A in a solid-state image sensor so that the incident light 24 can be condensed into the photoelectric conversion unit 17 in the light-receiving cell 1. However, the incident light 24 diagonally enters the microlens 23 in the light-receiving cell 1 positioned in the periphery C. Therefore, even in the case where the incident light 24 is condensed into the microlens 23, the light-blocking film 19 blocks the incident light 24 so that the incident light 24 cannot pass through the aperture 20. It is thus difficult to condense the incident light 24 into the photoelectric conversion unit 17.

Furthermore, in a solid-state image sensor which is characterized in a wide dynamic range, the light-receiving cells are arranged as shown in FIG. 6. In other words, light-receiving cells A which receive light with a low luminance and light-receiving cells B which receive light with a high luminance are arranged in plural rows and columns. A wide dynamic range image is obtained by synthesizing, inside or outside the solid-state image sensor, signals that are converted into signal charge by the light-receiving cells A and the light-receiving cells B. FIG. 7 is a cross-section diagram (a cross-section diagram between M and N in FIG. 6) of the light receiving cells (light-receiving cells A and B in FIG. 6). As shown in FIG. 7, in such solid-state image sensor, an aperture 20A having a large aperture width is formed in the light-receiving cell A, and an aperture 20B having a small aperture width is formed in the light-receiving cell B. Accordingly, in order to compensate the decrease in light condensing efficiency due to a realization of finer light-receiving cells, in the case where optimum light condensing efficiency in the microlens 23 is obtained in the aperture 20A having a large width, it becomes difficult for a portion of the incident light 24 to enter the aperture 20B having a small width. Therefore, the amount of incident light 24 which passes through the aperture 20B is decreased so that the sensitivity of the light-receiving cell B is extremely lowered. Furthermore, since an incident angle of the incident light 24 is larger in the peripheries than in the center in the solid-state image sensor, it becomes more difficult to condense light which passes through the aperture 20B. Consequently, the sensitivity is decreased in greater degree in of the light-receiving cell B positioned in the periphery than in the light-receiving cell B positioned in the center. Therefore, shading of sensitivity and color irregularity are caused, and quality of an image to be obtained is significantly degraded.

In order to overcome such problems, an object of the present invention is to provide a small solid-state image sensor which can significantly improve sensitivity by increasing an amount of light which passes through apertures when the widths of apertures in the light-blocking film are decreased.

In order to achieve the aforementioned object, a solid-state image sensor according to the present invention includes: a semiconductor substrate; a photoelectric conversion unit formed in the semiconductor substrate; a light-blocking film which is formed above the semiconductor substrate and has an aperture formed so as to be positioned above the photoelectric conversion unit; and a high refractive index layer formed in the aperture. The aperture has an aperture width which is smaller than a maximum wavelength in a wavelength of light in a vacuum converted from a wavelength of the light entering the photoelectric conversion unit through the aperture, and the high refractive index layer is made of a high refractive index material having a refractive index which allows light of the maximum wavelength to transmit, in which the light enters the photoelectric conversion unit through the aperture. Here, the solid-state image sensor further includes a filter film which is formed above the light-blocking film so as to be positioned above the aperture, and allows transmission of light in a predetermined wavelength band, wherein the aperture may have an aperture width smaller than a maximum wavelength of the light which is transmitted through the filter film.

In the solid-state image sensor according to the present invention, the wavelength of light which passes through an aperture is relatively shortened by filling the aperture with a high refractive index material, using a principle that the wavelength of light which passes through the aperture is obtained by dividing the wavelength in a vacuum with a refractive index (wavelength in a vacuum/(refractive index)). Accordingly, in the case where the refractive index in the aperture is N, when converting into a wavelength in a vacuum, the maximum wavelength in the transmission wavelength band of light which passes through the aperture is increased as much as the refractive index (N times) of the high refractive index material which fills up the aperture. Consequently, light can be passed through the aperture by filling the aperture with the high refractive index material, even in the case where the aperture width is decreased and the aperture width is equal to or smaller than the wavelength of light in a vacuum to be transmitted. In other words, a small solid-state image sensor which can significantly increase the sensitivity of light of a long wavelength and improve sensitivity can be realized.

Furthermore, the aperture may be filled with the high refractive index layer.

In the aforementioned configuration, the high refractive index material fills up all areas in the aperture so that an average refractive index inside all areas in the aperture can be increased. Therefore, the transmission wavelength band in a vacuum of light which passes through the aperture can be greatly shifted to a longer wavelength and the sensitivity of light having the long wavelength can be further increased.

Furthermore, as disclosed in the Japanese Laid-Open Patent Application No. 6-224398, in the case of a method of condensing light using total reflection in boundaries between a high refractive index material and a low refractive index material when positioning the low refractive index material so as to surround the high refractive index material in the aperture, the method requires to actively introduce the low refractive index material in the aperture. Therefore, the width of high refractive index material in the aperture is a value obtained by subtracting the width of low refractive index material in the aperture from the aperture width. Accordingly, a wavelength of practically transmittable light in such case is determined based on the width of the high refractive index material that is always smaller than the width of the aperture. Therefore, the aperture width is practically decreased and light of a long wavelength is restricted for the transmission. It is thus a disadvantage for the improvement in sensitivity. However, with the aforementioned configuration, the aperture width is set to be the width of a high refractive index material filled in the aperture so that an aperture width is practically increased. Therefore, transmission of light having a longer wavelength is not restricted and the sensitivity can be improved.

Furthermore, in order to achieve the aforementioned object, the high refractive index layer may be made of a high refractive index material having a refractive index of 1.8 or higher.

As in the aforementioned configuration, using a high refractive index material having a refractive index of 1.8 or higher as a material for the high refractive index layer which fills up the aperture, even in the case where the aperture width is 1.0 µm or smaller, visible light of a wavelength close to a long red wavelength and light of a long wavelength such as near-infrared light having a wavelength of 1.0 to 2.0 µm can be transmitted.

Furthermore, in order to achieve the aforementioned object, the high refractive index layer may be as thick as or thicker than the light-blocking film.

With the aforementioned configuration, by setting a thickness of a high refractive index material in the aperture to have a thickness as thick as or thicker than the thickness in a vertical direction of the aperture, the cut-off wavelength converted into a wavelength in a vacuum can be greatly shifted to the longer wavelength. Therefore, the transmission wavelength band of a longer wavelength of light which passes through the aperture can be extended and the sensitivity in the longer wavelength can be increased.

Furthermore, in order to achieve the aforementioned object, the high refractive index layer has a convex lens shape, and may condense light entering the photoelectric conversion unit through the aperture.

With the aforementioned configuration, the top surface of the high refractive index material in the aperture which allows light to be transmitted is shaped into a convex lens so that the light can be condensed at immediately above the aperture. Therefore, particularly in the case where the aperture width is close to the wavelength of visible light, the light-condensing efficiency is greatly improved.

Furthermore, even in the case where light-receiving cells are fine-processed and cell-pitch is decreased in a horizontal direction, as shown in FIG. 3 and Japanese Laid-Open Patent Application No. 2000-164837, an intralayer lens and interlayer films formed above and below the intralayer lens are necessary as in the conventional light-receiving cell, so that the vertical size of a structure formed on the light-blocking film is not changed from the conventional light-receiving cell. Accordingly, whereas the cell-pitch is decreased in a horizontal direction, the size of the light-receiving cell in the vertical direction cannot be decreased. Therefore, it is difficult to condense light into a small aperture and light condensing efficiency is extremely degraded. However, with the aforementioned configuration, the intralayer lens formed above the light-blocking film required in the configuration of the conventional solid-state image sensor can be omitted. Consequently, the height of the light-receiving cell can be decreased, which prevents the aforementioned problems from occurring.

Furthermore, in order to achieve the aforementioned object, the high refractive index material may be one of titanium oxide, tantalum oxide, and niobium oxide.

As in the aforementioned configuration, the refractive index in the aperture can be particularly set to be higher than in the case of silicon oxide having a refractive index of 1.5 which is commonly used as an insulating film, by using a high refractive index material such as titanium oxide, tantalum oxide, niobium oxide or hafnium oxide for a high refractive index layer. Consequently, a transmission wavelength band of light which passes through the aperture converted into a wavelength in a vacuum can be greatly shifted to a longer wavelength so that the sensitivity in the longer wavelength can be further increased.

Furthermore, in order to achieve the aforementioned object, the aperture width may be 1.0 µm or less.

With the aforementioned configuration, the effect of extending the transmission wavelength band of light which passes through the aperture to a longer wavelength is increased in a band of 1.0 µm or smaller that is a main absorption band made of silicon which forms a photoelectric conversion unit. Therefore, an obvious improvement in sensitivity can be realized.

As described in the above, the solid-state image sensor according to the present invention can realize finer light-receiving cells without degrading the sensitivity and can increase the number of pixels in a specific optical size (e.g. ¼ inch) of an imaging unit. Therefore, as a camera using the solid-state image sensor according to the present invention, a high-quality camera having high sensitivity and high-pixels can be realized.

In order to achieve the aforementioned object, a method of manufacturing a solid-state image sensor according to the present invention includes: forming a light-blocking film above a semiconductor substrate in which a photoelectric conversion unit is formed and forming an aperture in the light-blocking film so as to be positioned above the photoelectric conversion unit; and forming a high refractive index layer in the aperture and on the light-blocking film, wherein the forming of the high refractive index layer includes forming the high refractive index layer with a thickness which makes a surface of the high refractive index layer flat. Here, the forming of the high refractive index layer may include forming the high refractive index layer with a thickness which is half or more of a width of the aperture.

With the aforementioned structure, the area above the aperture can be planarized by the high refractive index layer having a high refractive index by forming a high refractive index layer in the aperture, and further, on that high refractive index layer, sequentially forming a high refractive index layer. Therefore, the light which enters an aperture can be allowed to enter the aperture without diffusion and the degradation in sensitivity can be prevented.

Furthermore, in order to achieve the aforementioned object, the method of manufacturing a solid-state image sensor may further include planarizing the surface of the high refractive index layer.

With the aforementioned configuration, a high refractive index layer is planarized and etched by CMP and the like after forming a high refractive index layer in the aperture and, on said that high refractive index layer in the aperture, further forming a high refractive index layer. Therefore, the degree of planarization of the high refractive index layer formed above the aperture is increased and the diffusion of light which enters the aperture can be minimized. As a result, inconsistency in the amount of light allowed to be transmitted in apertures among light-receiving cells can be minimized so that the inconsistency in sensitivity among light-receiving cells can be significantly improved.

Furthermore, in order to achieve the aforementioned object, a method of manufacturing a solid-state image sensor may further include processing the high refractive index layer positioned above the aperture into a convex lens shape.

With the aforementioned configuration, an intralayer lens is formed using a high refractive index layer after forming a high refractive index layer in the aperture and, on the high refractive index layer in the aperture, further forming a high refractive index layer. Therefore, processes of manufacturing a solid-state image sensor can be reduced by removing a specific conventional process of forming a film necessary for an intralayer lens. As a result, a lower-priced solid-state image sensor can be provided. Furthermore, since the intralayer is formed immediately above the light-blocking film, even in the case where the aperture width is small, light can be condensed efficiently and high sensitivity can be realized.

Furthermore, in order to achieve the aforementioned object, a solid-state image sensor according to the present invention includes: a semiconductor substrate; photoelectric conversion units formed in the semiconductor substrate; microlenses formed above the semiconductor substrate so as to be positioned above the respective photoelectric conversion units; and a color filter which includes filter films arranged in a two-dimensional array and which is formed above the semiconductor substrate so that the filter films are positioned above the respective photoelectric conversion units. Here, the photoelectric conversion units are a first photoelectric conversion unit and a second photoelectric conversion unit, in which the second photoelectric conversion unit is positioned below one of the filter films transmitting light of a longer wavelength than a wavelength of light transmitted by another one of the filter films positioned above the first photoelectric conversion unit, and one of the microlenses positioned above the second photoelectric conversion unit has a higher refractive index than another one of the microlenses positioned above the first photoelectric conversion unit.

With the aforementioned configuration, in the solid-state image sensor according to the present invention, a refractive index of a microlens formed above or below the filter film which transmits light of a longer wavelength can be set to be higher than a refractive index of a microlens formed above or below the filter film which transmits light of a shorter wavelength. As a result, light condensing efficiency of light of a longer wavelength which is difficult to be condensed can be improved and sensitivity of a photoelectric conversion unit which converts light of a longer wavelength into signal charge can be significantly increased. As a result, even in the case where light-receiving cells are fine-processed and the aperture width in a light-blocking film is decreased, the amount of light which passes through the small aperture in the light-blocking film can be increased by improving the light condensing efficiency. Thus, a small solid-state image sensor which can significantly increase sensitivity can be realized.

In order to achieve the aforementioned object, a solid-state image sensor according to the present invention includes: a semiconductor substrate; photoelectric conversion units formed in the semiconductor substrate; microlenses formed above the semiconductor substrate so as to be positioned above the respective photoelectric conversion units; and a color filter which includes filter films arranged in a two-dimensional array and which is formed above the semiconductor substrate so that the filter films are positioned above the respective photoelectric conversion units. Here, each microlens is made of a low refractive index material and a high refractive index material, the photoelectric conversion units are a first photoelectric conversion unit and a second photoelectric conversion unit, in which the second photoelectric conversion unit is positioned below one of the filter films transmitting light of a longer wavelength than a wavelength of the light transmitted by another one of the filter films positioned above the first photoelectric conversion unit, and a volume of a high refractive index material included in one of the microlenses positioned above said second photoelectric conversion unit is greater than a volume of a high refractive index material included in another one of the microlenses positioned above the first photoelectric conversion unit.

With the aforementioned configuration, a microlens is made of plural materials of a low refractive index material and a high refractive index material. By changing a volume ratio between the low refractive index material and the high refractive index material, it can be set an average refractive index of the microlens positioned above or below the color filter which transmits light in a long wavelength band to be higher than an average refractive index of a microlens positioned above or below a color filter which transmits light in a short wavelength band. As a result, light condensing efficiency of light of a longer wavelength which is difficult to be condensed can be improved and sensitivity of a photoelectric conversion unit which converts light of the longer wavelength into signal charge can be significantly increased.

Furthermore, in order to achieve the aforementioned object, a solid-state image sensor according to the present invention includes: a semiconductor substrate; photoelectric conversion units formed in the semiconductor substrate; microlenses formed above the semiconductor substrate so as to be positioned above the respective photoelectric conversion units; and a color filter which includes filter films arranged in a two-dimensional array and which is formed above the semiconductor substrate so that the filter films are positioned above the respective photoelectric conversion units. Here, the photoelectric conversion units are a first photoelectric conversion unit and a second photoelectric conversion unit, in which the second photoelectric conversion unit is positioned below one of the filter films transmitting light of a longer wavelength than a wavelength of light transmitted by another one of the filter films positioned above the first photoelectric conversion unit, and a height of one of the microlenses positioned above the second photoelectric conversion unit is greater than a height of another one of the microlenses positioned above the first photoelectric conversion unit.

With the aforementioned configuration, it can be set the height of the microlens formed above or below the color filter which transmits light of a longer wavelength to be higher than the height of the microlens formed above or below the color filter which transmits light of a shorter wavelength. Consequently, the light condensing efficiency of light in a long wavelength band which is difficult to be condensed can be increased so that the sensitivity of the photoelectric conversion unit which converts light in the long wavelength band into signal charge can be improved.

Furthermore, in order to achieve the aforementioned object, one of the microlenses positioned above the second photoelectric conversion unit may have a higher refractive index than another one of the microlenses positioned above the first photoelectric conversion unit.

With the aforementioned configuration, the refractive index of a microlens positioned above or below the color filter which transmits light of a longer wavelength becomes higher than the refractive index of a microlens positioned above or below the color filter which transmits light of a shorter wavelength. Consequently, in addition to the effect of increasing the height of the microlens, the refractive index is increased, so that the light condensing efficiency of light in a long wavelength band can be further increased and the sensitivity of the photoelectric conversion unit which converts light in the long wavelength band into signal charge can be significantly improved.

Furthermore, in order to achieve the aforementioned object, the high refractive index material may be one of titanium oxide, tantalum oxide, niobium oxide, and hafnium oxide.

As described in the aforementioned configuration, the refractive index of the microlens can be especially increased compared to the case of the silicon oxide film having a refractive index of 1.45 that is commonly used as an insulating film, by using, for a microlens, a high refractive index material such as titanium oxide, tantalum oxide, niobium oxide or hafnium oxide. Consequently, the light condensing efficiency of light in a long wavelength band can be increased so that the sensitivity of the photoelectric conversion unit which converts light in the long wavelength band into signal charge can be greatly improved.

Furthermore, in order to achieve the aforementioned object, a solid-state image sensor according to the present invention includes: a semiconductor substrate; photoelectric conversion units formed in the semiconductor substrate; a high refractive index film formed above the semiconductor substrate; and a color filter which has filter films arranged in a two-dimensional array and which is formed above the semiconductor substrate so that the filter films are positioned above the respective photoelectric conversion units. Here, the photoelectric conversion units are a first photoelectric conversion unit and a second photoelectric conversion unit, in which the second photoelectric conversion unit is positioned below one of the filter films transmitting light of a longer wavelength than a wavelength of the light transmitted by another one of the filter films positioned above the first photoelectric conversion unit, and the refractive index film positioned above the second photoelectric conversion unit has a higher refractive index than the refractive index film positioned above the first photoelectric conversion unit.

With the aforementioned configuration, it can be set the refractive index of the high refractive index film formed above or below the color filter which transmits light in a longer wavelength band to be higher than the refractive index of the high refractive index film formed above or below the color filter which transmits light in a shorter wavelength band. As a result, when light in a longer wavelength band which is difficult to be condensed enters a light-receiving cell at a large incident angle, the high refractive index film makes the incident light at a large incident angle easily enter the light-receiving cell by bending the incident light toward a direction of the photoelectric conversion unit. Consequently, sensitivity of a photoelectric conversion unit which converts light in a longer wavelength band into signal charge can be significantly increased.

Furthermore, in order to achieve the aforementioned object, a solid-state image sensor according to the present invention includes: a semiconductor substrate; photoelectric conversion units formed in the semiconductor substrate; a high refractive index film formed above the semiconductor substrate; and a color filter which includes filter films arranged in a two-dimensional array and which is formed above the semiconductor substrate so that the filter films are positioned above the respective photoelectric conversion units. Here, the photoelectric conversion units are a first photoelectric conversion unit and a second photoelectric conversion unit, in which the second photoelectric conversion unit is positioned below one of the filter films transmitting light of a longer wavelength than a wavelength of the light transmitted by another one of the filter films positioned above the first photoelectric conversion unit, and the refractive index film positioned above the second photoelectric conversion unit is thicker than the refractive index film positioned above the first photoelectric conversion unit.

With the aforementioned configuration, it can be set the thickness of the high refractive index film formed above or below the color filter which transmits light in a longer wavelength band to be greater than the thickness of the high refractive index film formed above or below the color filter which transmits light in a shorter wavelength band. As a result, when light in a longer wavelength band which is difficult to be condensed enters a light-receiving cell at a large incident angle, a thick high refractive index film makes the incident light at a large incident angle easily enter the light-receiving cell by bending the incident light toward a direction of the photoelectric conversion unit. Therefore, the sensitivity of the photoelectric conversion unit which converts light in a long wavelength band into signal charge can be significantly improved.

Furthermore, in order to achieve the aforementioned object, the high refractive index material may be one of titanium oxide, tantalum oxide, niobium oxide, and hafnium oxide.

As in the aforementioned configuration, the refractive index in the high refractive index layer can be particularly set to be higher than the case of silicon oxide having a refractive index of 1.45 which is commonly used as an insulating film, by using a high refractive index material such as titanium oxide, tantalum oxide, niobium oxide or hafnium oxide for a high refractive index layer. Consequently, the light condensing efficiency of light in a long wavelength band can be increased so that the sensitivity of the photoelectric conversion unit which converts light in the long wavelength band into signal charge can be improved.

In order to achieve the aforementioned object, a solid-state image sensor according to the present invention includes: a semiconductor substrate; photoelectric conversion units formed in the semiconductor substrate; and microlenses formed above the semiconductor substrate so as to be positioned above the respective photoelectric conversion units. Here, the photoelectric conversion units are a first photoelectric conversion unit and a second photoelectric conversion unit, in which light enters at a greater incident angle than an incident angle at which light enters the first photoelectric conversion unit, one of the microlenses positioned above the second photoelectric conversion unit has a higher refractive index than another one of the microlenses positioned above the first photoelectric conversion unit.

With the aforementioned structure, the refractive index of a microlens of a light-receiving cell to which light enters at a large incident angle is higher than the refractive index of a microlens to which light enters at a small incident angle. Therefore, the light condensing efficiency of a light-receiving cell to which light enters at a large incident angle is improved, and the sensitivity can be significantly increased As a result, even in the case where light-receiving cells are fine-processed and the aperture width in a light-blocking film is decreased, the amount of light which passes through a small aperture in the light-blocking film can be increased by improving the light condensing efficiency. Thus, a small solid-state image sensor which can significantly increase sensitivity can be realized.

In order to achieve the aforementioned object, a solid-state image sensor according to the present invention includes: a semiconductor substrate; photoelectric conversion units formed in the semiconductor substrate; and microlenses formed above the semiconductor substrate so as to be positioned above the respective photoelectric conversion units. Here, each microlens is made of a low refractive index material and a high refractive index material, the photoelectric conversion units are a first photoelectric conversion unit and a second photoelectric conversion unit, in which light enters at a greater incident angle than an incident angle at which light enters the first photoelectric conversion unit, and a volume of a high refractive index material included in one of the microlenses positioned above the second photoelectric conversion unit is greater than a volume of a high refractive index material included in another one of the microlenses positioned above the first photoelectric conversion unit.

With the aforementioned configuration, a microlens is made of plural materials of a low refractive index material and a high refractive index material. By changing a volume ratio between the low refractive index material and the high refractive index material, it can be set an average refractive index of the microlens of a light-receiving cell to which light enters at a large incident angle to be higher than an average refractive index of a microlens of a light-receiving cell to which light enters at a small incident angle. Consequently, the light condensing efficiency of light entering at a large incident angle which is difficult to be condensed can be increased so that the sensitivity can be greatly improved.

In order to achieve the aforementioned object, a solid-state image sensor according to the present invention includes: a semiconductor substrate; photoelectric conversion units formed in the semiconductor substrate; and microlenses formed above the semiconductor substrate so as to be positioned above the respective photoelectric conversion units. Here, each microlens is made of a low refractive index material and a high refractive index material, the photoelectric conversion units are a first photoelectric conversion unit and a second photoelectric conversion unit, in which light enters at a greater incident angle than an incident angle at which light enters the first photoelectric conversion unit, and a height of one of the microlenses positioned above the second photoelectric conversion unit is greater than a height of another one of the microlenses positioned above the first photoelectric conversion unit.

With the aforementioned configuration, the height of a microlens of a light-receiving cell to which light enters at a large incident angle is higher than the height of a microlens to which light enters at a small incident angle. Therefore, the sensitivity of the light-receiving cell to which light enters at a large incident angle can be significantly increased.

Furthermore, in order to achieve the aforementioned object, a refractive index of one of the microlenses positioned above the second photoelectric conversion unit may be greater than a refractive index of another one of the microlenses positioned above the first photoelectric conversion unit.

With the aforementioned structure, the refractive index of the microlens of a light-receiving cell to which light enters at a large incident angle is higher than the refractive index of the microlens of a light-receiving cell to which light enters at a small incident angle. Therefore, the sensitivity of the light-receiving cell to which light enters at a large incident angle can be significantly increased.

Furthermore, in order to achieve the aforementioned object, the high refractive index material may be one of titanium oxide, tantalum oxide, niobium oxide, and hafnium oxide.

As shown in the aforementioned configuration, the refractive index in microlens can be particularly set to be higher than the case of silicon oxide film having a refractive index of 1.45 which is commonly used as an insulating film, by using, for a microlens, a high refractive index material such as titanium oxide, tantalum oxide, niobium oxide or hafnium oxide. Therefore, sensitivity of the light-receiving cell to which light enters at a large incident angle can be significantly increased.

Furthermore, in order to achieve the aforementioned object, a solid-state image sensor according to the present invention includes: a semiconductor substrate; photoelectric conversion units formed in the semiconductor substrate; and a high refractive index film formed above the semiconductor substrate. Here, the photoelectric conversion units are a first photoelectric conversion unit and a second photoelectric conversion unit, in which light enters at a greater incident angle than an incident angle at which light enters the first photoelectric conversion unit, and the refractive index film positioned above the second photoelectric conversion unit has a higher refractive index than the refractive index film positioned above the first photoelectric conversion unit.

With the aforementioned configuration, it can be set the refractive index of the high refractive index film in a light-receiving cell to which light enters at a large incident angle to be higher than the refractive index of the high refractive index film in a light-receiving cell to which light enters at a small incident angle. As a result, the high refractive index film in a light-receiving cell to which light enters at a large incident angle can make the incident light at a large incident angle enter the light-receiving cell by bending the incident light toward a direction of the photoelectric conversion unit. Therefore, the sensitivity of the light-receiving cell to which light enters at a large incident angle can be significantly increased.

Furthermore, in order to achieve the aforementioned object, a solid-state image sensor according to the present invention includes: a semiconductor substrate; photoelectric conversion units formed in the semiconductor substrate; and a high refractive index film formed above the semiconductor substrate. Here, the photoelectric conversion units are a first photoelectric conversion unit and a second photoelectric conversion unit, in which light enters at a greater incident angle than an incident angle at which light enters the first photoelectric conversion unit, and the refractive index film positioned above the second photoelectric conversion unit is thicker than the refractive index film positioned above the first photoelectric conversion unit.

With the aforementioned configuration, it can be set the thickness of the high refractive index film in a light-receiving cell to which light enters at a large incident angle to be thicker than the thickness of the high refractive index film in a light-receiving cell to which light enters at a small incident angle.

Therefore, the high refractive index film in the light-receiving cell to which light enters at a large incident angle can make the incident light at a large incident angle enter the light-receiving cell by bending the incident light toward a direction of the photoelectric conversion unit. Consequently, the sensitivity of the light-receiving cell to which light enters at a large incident angle can be significantly increased.

Furthermore, in order to achieve the aforementioned object, the high refractive index material may be one of titanium oxide, tantalum oxide, niobium oxide, and hafnium oxide.

As in the aforementioned configuration, the refractive index of a high refractive index film can be particularly set to be higher than the case of the silicon oxide film having a refractive index of 1.45 which is commonly used as an insulating film, by using a high refractive index material such as titanium oxide, tantalum oxide, niobium oxide or hafnium oxide for the high refractive index layer. Therefore, the sensitivity of the light-receiving cell to which light enters at a large incident angle can be significantly increased.

Furthermore, in order to achieve the aforementioned object, a solid-state image sensor according to the present invention includes: a semiconductor substrate; light-receiving cells which are formed in the semiconductor substrate, and have photoelectric conversion units which generate signal charge in accordance with a luminance of incident light; and microlenses positioned above the respective photoelectric conversion units. Here, the light-receiving cells are a first light-receiving cell having a first aperture width, and a second light-receiving cell having a second aperture width which is greater than the first aperture width, and a refractive index of one of said microlenses in the first light-receiving cell is higher than a refractive index of another one of the microlenses in the second light-receiving cell.

Accordingly, in the solid-state image sensor according to the present invention, the refractive index of a microlens in a light-receiving cell having a small aperture width is set to be higher than the refractive index of a microlens in a light-receiving cell having a large aperture width. As a result, light-condensing efficiencies obtained by the light-receiving cell having a small aperture width and the light-receiving cell having a large aperture width can be optimized at the same time so that sensitivities of the light-receiving cells having different aperture widths can be significantly improved. Consequently, even in the case where light-receiving cells are fine-processed and the aperture width in a light-blocking film is decreased, the amount of light which passes through the small aperture width in the light-blocking film can be increased by improving the light condensing efficiency of light. Thus, a small solid-state image sensor which can significantly increase sensitivity can be realized.

Furthermore, in order to achieve the aforementioned object, a solid-state image sensor according to the present invention includes: a semiconductor substrate; light-receiving cells which are formed in the semiconductor substrate, and have photoelectric conversion units which generate signal charge in accordance with a luminance of incident light; and microlenses positioned above the respective photoelectric conversion units. Here, one of the microlenses of the first light-receiving cell and another one of the microlenses of the second light-receiving cell are respectively made of at least a low refractive index material and a high refractive index material, and a volume of the high refractive index material included in the microlens of the first light-receiving cell is greater than a volume of the high refractive index material included in the microlens of the second light-receiving cell.

Accordingly, in the case where a microlens is made of plural materials of a low refractive index material and a high refractive index material, an average refractive index of the microlens in a light-receiving cell having a small aperture width is set to be higher than an average refractive index of the microlens in a light-receiving cell having a large aperture width by setting a volume of the high refractive index material included in the microlens of the light-receiving cell having a small aperture width greater than a volume of the high refractive index material included in the microlens of the light-receiving cell having a large aperture width. As a result, light-condensing efficiencies obtained by the light-receiving cell having a small aperture width and the light-receiving cell having a large aperture width can be optimized at the same time so that sensitivities of the light-receiving cells having different aperture widths can be significantly improved.

Furthermore, in order to achieve the aforementioned object, a solid-state image sensor according to the present invention includes: a semiconductor substrate; light-receiving cells which are formed in the semiconductor substrate, and have photoelectric conversion units which generate signal charge in accordance with a luminance of incident light; and microlenses positioned above the respective photoelectric conversion units. Here, the light-receiving cells are a first light-receiving cell having a first aperture width, and a second light-receiving cell having a second aperture width which is greater than the first aperture width. The solid-state image sensor further includes: a first high refractive index interlayer film positioned above the first light-receiving cell; and a second high refractive index interlayer film positioned above the second light-receiving cell, wherein the first high refractive index interlayer film has a higher refractive index than the second high refractive index interlayer film.

Accordingly, the refractive index of the high refractive index interlayer film formed above the light-receiving cell having a small aperture width is higher than the refractive index of the high refractive index interlayer film formed above the light-receiving cell having a large aperture width. Therefore, the high refractive index interlayer film formed above a light-receiving cell to which light enters at a large incident angle can make the incident light at a large incident angle enter the light-receiving cell by bending the incident light toward a direction of the photoelectric conversion unit. As a result, light-condensing efficiencies obtained by the light-receiving cell having a small aperture width and the light-receiving cell having a large aperture width can be optimized at the same time so that sensitivities of the light-receiving cells having different aperture widths can be significantly improved.

Furthermore, in order to achieve the aforementioned object, a solid-state image sensor according to the present invention includes: a semiconductor substrate; light-receiving cells which are formed in the semiconductor substrate, and have photoelectric conversion units which generate signal charge in accordance with a luminance of incident light; and microlenses positioned above the respective photoelectric conversion units. Here, the light-receiving cells are a first light-receiving cell having a first aperture width, and a second light-receiving cell having a second aperture width which is greater than the first aperture width. The solid-state image sensor further includes: a first high refractive index interlayer film positioned above the first light-receiving cell; and a second high refractive index interlayer film positioned above the second light-receiving cell, in which the first high refractive index interlayer film is thicker than the second high refractive index interlayer film.

Accordingly, a thickness of a high refractive index interlayer film formed above the light-receiving cell having a small aperture width is thicker than a thickness of the high refractive index interlayer film formed above the light-receiving cell having a large aperture width. Therefore, the high refractive index interlayer film formed above the light receiving cell to which light enters at a large incident angle can make the incident light at a large incident angle enter the light-receiving cell by bending the incident light toward a direction of the photoelectric conversion unit. As a result, light-condensing efficiencies obtained by the light-receiving cell having a small aperture width and the light-receiving cell having a large aperture width can be optimized at the same time so that sensitivities of the light-receiving cells having different aperture widths can be significantly improved.

In order to achieve the aforementioned object, a solid-state image sensor according to the present invention includes: a semiconductor substrate; light-receiving cells which are formed in the semiconductor substrate, and have photoelectric conversion units which generate signal charge in accordance with a luminance of incident light; and microlenses positioned above the respective photoelectric conversion units. Here, the light-receiving cells are a first light-receiving cell having a first aperture width, and a second light-receiving cell having a second aperture width which is greater than the first aperture width, and one of the microlenses of the first light-receiving cell is higher in height than another one of the microlenses of the second light-receiving cell.

Accordingly, a height of the microlens positioned above the light-receiving cell having a small aperture width is set to be higher than a height of the microlens positioned above the light-receiving cell having a large aperture width. As a result, light-condensing efficiencies obtained by the light-receiving cell having a small aperture width and the light-receiving cell having a large aperture width can be optimized at the same time so that sensitivities of the light-receiving cells having different aperture widths can be significantly improved.

Furthermore, the refractive index of the microlens in the second light-receiving cell is higher than the refractive index of the microlens in the first light-receiving cell. Accordingly, the refractive index of the microlens positioned above the light-receiving cell having a small aperture width is set to be higher than the refractive index of the microlens positioned above the light-receiving cell having a large aperture width. As a result, light-condensing efficiencies obtained by the light-receiving cell having a small aperture width and the light-receiving cell having a large aperture width can be optimized at the same time so that sensitivities of the light-receiving cells having different aperture widths can be significantly improved.

The material for the microlens or the interlayer film includes at least one of titanium oxide, tantalum oxide, niobium oxide, and hafnium oxide. Thus, the refractive index can be particularly set to be higher than the case of silicon oxide film having a refractive index of 1.45 which is commonly used as an insulating film, by using a high refractive index material such as titanium oxide, tantalum oxide, niobium oxide or hafnium oxide. Therefore, light-condensing efficiencies obtained by the light-receiving cell having a small aperture width and the light-receiving cell having a large aperture width can be optimized at the same time so that sensitivities of the light-receiving cells having different aperture widths can be significantly improved.

In the solid-state image sensor according to the present invention, the transmission wavelength band of light which passes through the aperture can be kept large even in the case where the aperture width is decreased by the use of high refractive index material having a high refractive index for the aperture in the light-blocking film formed above the photoelectric conversion unit. Accordingly, even in the case where the size of light-receiving cells in the solid-state image sensor is decreased as well as the size of the apertures, an obvious decrease in sensitivity in the longer wavelength can be prevented. Thus, a small and highly-sensitive solid-state image sensor can be realized. Furthermore, the diffusion of light above the aperture can be reduced by forming high refractive index materials in apertures so as to fill up the apertures, then forming the high refractive index materials also above the apertures, and planarizing the high refractive index materials. Thus, decrease in sensitivity is prevented while preventing the inconsistency in sensitivity among light-receiving cells so that high-quality camera can be realized. In addition, a highly-sensitive and high S/N solid-state image sensor can be realized by forming high refractive index materials in the apertures so as to fill up the apertures, then forming the high refractive index materials also above the apertures, and forming microlenses using the high refractive index materials. Consequently, a high quality-camera can be realized.

In the solid-state image sensor according to the present invention, the light condensing efficiency of light in a long wavelength is improved and the sensitivity of the photoelectric conversion unit which converts light into signal charge in a long wavelength can be significantly improved, by differentiating between the followings: a refractive index of a microlens formed above or under a color filter which transmits light of a long wavelength, one of a volume of a high refractive index material composing the microlens and a height of the microlens, or one of a refractive index of the high refractive index material or a thickness of the high refractive index material; and a refractive index of a microlens formed above or under a color filter which transmit light of a shorter wavelength, one of a volume of a high refractive index material composing the microlens and a height of the microlens, or one of a refractive index of the high refractive index material or a thickness of the high refractive index material. Consequently, a highly-sensitive and high S/N solid-state image sensor can be realized so that it can be said that the present invention is useful for realizing a high-quality camera.

In the solid-state image sensor according to the present invention, the sensitivity of a light-receiving cell to which light enters at a large incident angle can be significantly increased, by differentiating between the followings: a refractive index of a microlens formed in the light-receiving cell to which light enters at a large incident angle, one of a volume of a high refractive index material composing the microlens and a height of the microlens, or one of a refractive index of the high refractive index material or a thickness of the high refractive index material; and a refractive index of a microlens formed in the light-receiving cell to which light enters at a small incident angle, one of a volume of a high refractive index material composing the microlens and a height of the microlens, or one of a refractive index of the high refractive index material or a thickness of the high refractive index material. Consequently, a highly-sensitive and high S/N solid-state image sensor can be realized so that it can be said that the present invention is useful for realizing a high-quality camera.

In the solid-state image sensor according to the present invention, the sensitivity of a light-receiving cell to which light enters at a large incident angle can be significantly increased, by differentiating between the followings: a refractive index of a microlens formed in the light-receiving cell having a small aperture width, one of a volume of a high refractive index material composing the microlens and a height of the microlens, or one of a refractive index of the high refractive index material or a thickness of the high refractive index material; and a refractive index of a microlens formed in the light-receiving cell having a large aperture width, one of a volume of a high refractive index material composing the microlens and a height of the microlens, or one of a refractive index of the high refractive index material or a thickness of the high refractive index material. Consequently, a highly-sensitive and high S/N solid-state image sensor can be realized so that it can be said that the present invention is useful for realizing a high-quality camera.

FURTHER INFORMATION ABOUT TECHNICAL BACKGROUND TO THIS APPLICATION

The disclosures of following Japanese Patent Applications, each including specification, drawings and claims, are incorporated herein by references in its entirety: Japanese Patent Application No. 2005-168725 filed on Jun. 8, 2005; Japanese Patent Application No. 2005-168726 filed on Jun. 8, 2005; Japanese Patent Application No. 2005-168701 filed on Jun. 8, 2005; and Japanese Patent Application No. 2005-168724 filed on Jun. 8, 2005.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 5 is a cross-section diagram of the light-receiving cells (light-receiving cells positioned in a center A and a periphery C) in the conventional solid-state image sensor;

FIG. 6 is a diagram showing an arrangement of light-receiving cells in a solid-state image sensor characterized in a wide dynamic range;

FIG. 9 is a diagram showing transmittance of a color filter layer and an aperture;

FIG. 23 is a cross-section diagram of the light-receiving cells (light-receiving cells positioned in the center A and the periphery C) in the solid-state image sensor according to the twelfth embodiment of the present invention;

DESCRIPTION OF THE PREFERRED EMBODIMENTS

Hereinafter, a solid-state image sensor according to embodiments of the present invention shall be described with reference to diagrams. It should be noted that the disclosure in the following embodiments does not restrict the scope of the present invention.

First Embodiment

Figure 8:
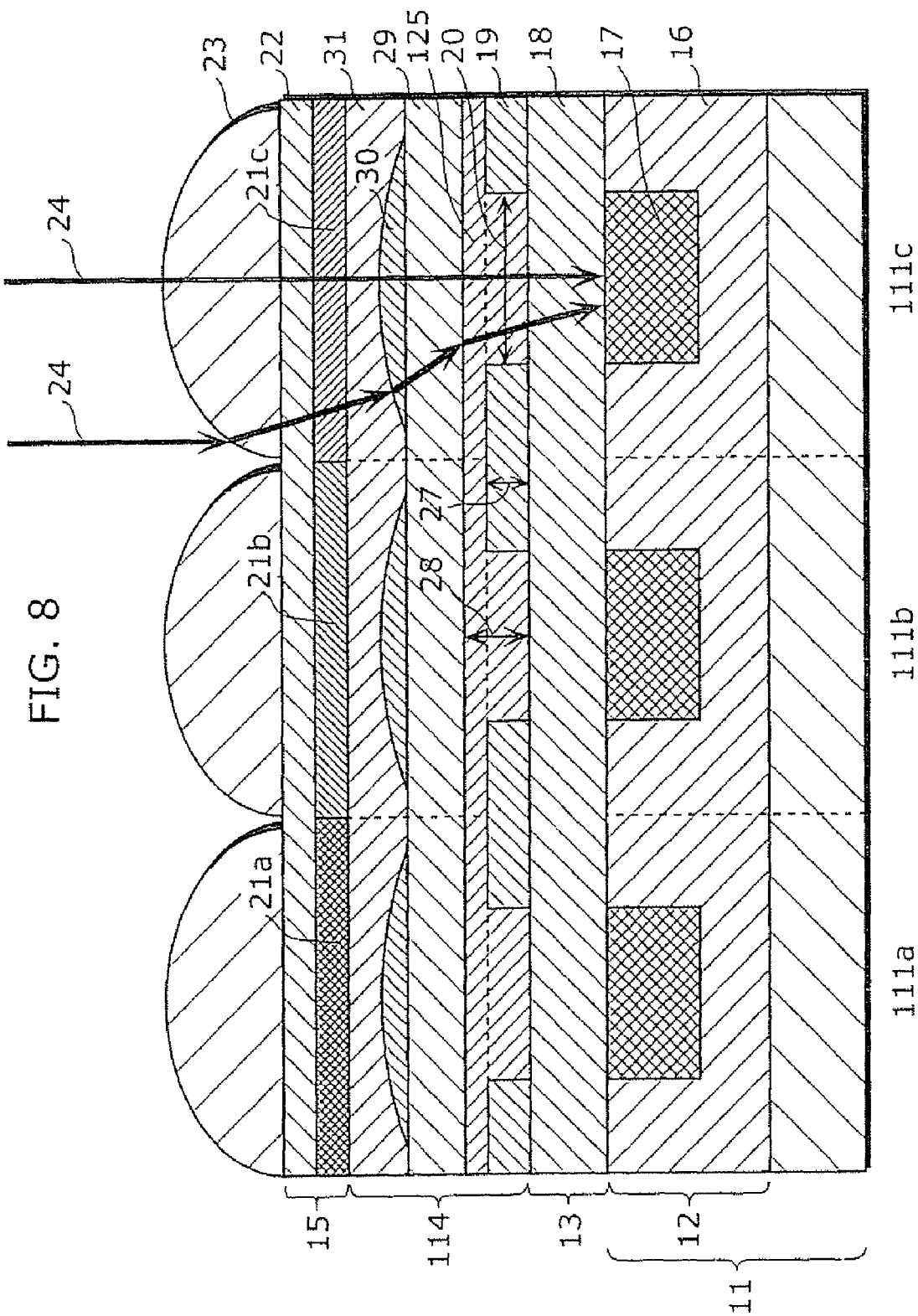
FIG. 8 is a cross-section diagram of light-receiving cells in a solid-state image sensor according to the first embodiment of the present invention.

FIG. 8 is a cross-section diagram of light-receiving cells 111a, 111b and 111c in a solid-state image sensor according to the first embodiment of the present invention. A semiconductor substrate 11, a photoelectric conversion layer 12 and an insulating layer 13 included in each light-receiving cell have same configurations as in the conventional light-receiving cell shown in FIG. 3.

While a metal layer 114 includes, as in the case of the conventional solid-state image sensor, a light-blocking film 19 and an intralayer lens 30, in the solid-state image sensor according to the first embodiment of the present invention, the metal layer 114 has a high refractive index layer 125 made of a high refractive index material and is formed so as to embed an aperture 20 in the light-blocking film 19 after the formation of the light-blocking film 19. Here, as in the configuration of the conventional light-receiving cell, an interlayer film 29 and an intralayer lens 30 are formed above the light-blocking film 19 and an interlayer film 31 is formed on the intralayer lens 30. Furthermore, a color filter layer 15 including an interlayer film 22 is formed on the metal layer 114, and a microlens 23 is formed on the color filter 15.

In the solid-state image sensor according to the first embodiment, light is condensed by the microlens 23; passes through the color filter layer 15; is then condensed again by the intralayer lens 30; and reaches the photoelectric conversion unit 17 through the aperture 20 in which the high refractive index layer 125 is formed.

Here, the aperture 20 has an aperture width which is smaller than a maximum wavelength of light which enters the photoelectric conversion unit 17. Here, the maximum wavelength is obtained by converting it into a wavelength of the light in a vacuum. In other words, the aperture has an aperture width which is smaller than the maximum wavelength of red (R) light in a vacuum. Furthermore, the high refractive index material has a refractive index which allows transmission of light having the maximum wavelength of light converted into a wavelength of the light, in a vacuum, entering the photoelectric conversion unit 17 through the aperture 20. In other words, the high refractive index material has a refractive index which allows transmission of red (R) light entering the photoelectric conversion unit 17 through the aperture 20.

FIG. 9 is a diagram showing transmittance of the color filter 15 and the aperture 20.

It is a well known fact that the aperture 20 blocks a transmission of light which enters the aperture and has a wavelength greater than a wavelength closer to the width of the aperture 20 because such light is difficult to be transmitted. When the aperture 20 has a large width (e.g. 2 μm or more), a cut-off wavelength 101 is much longer than a wavelength of spectra of the red light. Accordingly, the light which has passed through a color filter of spectra of red (R), green (G) and blue (B) can pass through the respective apertures 20. However, in the case where the width of the apertures 20 are narrowed due to a realization of finer light-receiving cells 111a, 111b and 111c, the cut-off wavelength 102 becomes as long as or shorter than a transmission wavelength of the red (R) filter film 21c. Consequently, the transmission of red light is extremely lowered in the aperture 20 positioned below the red (R) filter film 21c. Therefore, the amount of light which can reach the photoelectric conversion unit 17 is decreased and a degradation of sensitivity may be caused. In the solid-state image sensor according to the present invention, in order to solve the aforementioned problems, the high refractive index layer 125 is formed in the aperture 20. The wavelength of light which passes through the aperture 20 can be shortened to 1 divided by a refractive index (1/(refractive index=N)) of the wavelength in a vacuum, using the high refractive index layer 125 in the aperture 20. For example, in the case where titanium oxide ($TiO_2$) having a refractive index of 2.5 is used as the high refractive index layer 125, the wavelength of light which passes through the aperture 20 becomes a wavelength which is 1/2.5 of the wavelength in a vacuum. For example, the wavelength of 650 nm of the red light in a vacuum equals to a wavelength of 260 nm in the aperture 20. Accordingly, for example, the wavelength of 650 nm of the red light in a vacuum equals to a wavelength of 260 nm in the aperture 20 having an aperture width of 650 nm. The wavelength of 260 nm of the red light in the aperture 20 (650 nm in a vacuum) is significantly decreased compared to the aperture width of 650 nm. Therefore, the red light can efficiently pass through the aperture 20.

With respect to the cut-off wavelength, in the case where the refractive index in the aperture 20 is 1 and, for example, when the aperture 20 has a cut-off wavelength of 650 nm which determines an aperture width when converting it into a cut-off wavelength in a is vacuum, by embedding the titanium oxide ($TiO_2$) in the aperture 20 so that the aperture 20 has a refractive index of 2.5, the cut-off wavelength of the aperture 20 becomes 1625 nm that is obtained by multiplying 650 nm by 2.5. Accordingly, by filling the aperture 20 with a high refractive index material having a refractive index=N, a cut-off wavelength in a vacuum which allows transmission of light through the aperture 20 can be extended N times as long as the original cut-off wavelength. Therefore, even in the case where the aperture width is narrowed, the cut-off wavelength 103 can be set longer than that of visible light as shown in FIG. 9. That is to say, even in the case where the width of the aperture 20 is narrowed, the cut-off wavelength can be shifted to the longer wavelength by using a high refractive index material as a material for filling up the aperture 20. Therefore, the transmission band in a longer wavelength can be extended and the sensitivity in the longer wavelength can be increased.

It should be noted that a maximum cut-off wavelength can be realized by setting a width of the high-refractive index material in the aperture 20 so as to be equal to the width of the aperture 20.

Furthermore, titanium oxide having the refractive index of 2.5 is used as an example of a high refractive index material which composes the high refractive index layer 125. However, by setting the refractive index in the aperture 20 to 1.8 or greater, even in the case where the width of aperture 20 is 1.0 μm or smaller, visible light having a wavelength closer to a red long wavelength and near-infrared light of a long wavelength of 1.0 to 2.0 μm and the like are allowed to pass through the aperture 20. Therefore, the high refractive index material for filling up the inside of the aperture 20 is not only limited to the titanium oxide and any high refractive index material having a refractive index that is equal to 1.8 or higher, especially, 2.2 or higher can be used.

Furthermore, a thickness 28 of the high refractive index material shown in FIG. 8 is equal to or thicker than a thickness of the light-blocking film 19 that is a thickness 27 of the aperture 20. Here, the aperture 20 is filled with the high refractive index material. Accordingly, a cut-off wavelength of the aperture 20 converted into a wavelength in a vacuum can be shifted maximum to a longer wavelength. Therefore, the transmission band in the longer wavelength can be extended and the sensitivity in the longer wavelength can be increased.

Furthermore, a refractive index in the aperture 20 can be especially set to be higher than the refractive index (about 1.5) of silicon oxide that is commonly used as an insulating Film, by using, as a high refractive index material filling up the aperture 20, silicon nitride, titanium oxide, tantalum oxide, niobium oxide or the like. Therefore, the cut-off wavelength of the aperture 20 converted into a wavelength in a vacuum can be shifted maximum to a longer wavelength so that the transmission band in the longer wavelength can be extended and the sensitivity in the longer wavelength can be further increased.

Furthermore, whereas the visible light is used as an example of incident light in the solid-state image sensor of the first embodiment, similar effects can be obtained in the wavelength of the near-infrared light. Therefore, the effect of extending the transmission band of the wavelength and the obvious increase in sensitivity can be also realized for the light having a band of 1.0 µm or smaller which is equivalent to the wavelength of the near-infrared light which can be converted into signal charge by silicon.

FIG. 10 is a cross-section diagram showing a method of forming a configuration above the light-blocking film 19 in the light-receiving cells 111a, 111b and 111c in the solid-state image sensor according to the first embodiment of the present invention. FIG. 10 shows a process of forming the aperture 20 to a process of forming the interlayer film 29 above the light-blocking film 19 in the light-receiving cells 111a, 111b and 111c in the solid-state image sensor of the first embodiment.

In this forming method, first, resist is applied and patterned on the light-blocking film 19. Specifically, the resist is applied on the light-blocking film 19 and the applied resist in a region in which the aperture 20 is to be formed is removed. After that, a first process (FIG. 10(a)) is performed. In the first process, a portion of the light-blocking film 19 is removed using the resist as a mask by the dry etching techniques and the aperture 20 is formed so as to be positioned above the photoelectric conversion unit 17.

Figure 10A:
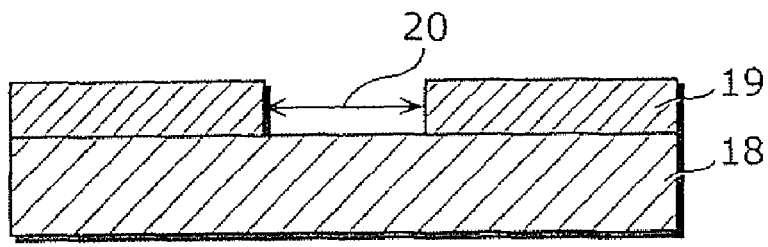
FIG. 10 is a cross-section diagram showing a method of forming a configuration on a light-blocking film in a light-receiving cell in the solid-state image sensor according to the first embodiment of the present invention.
Figure 10B:
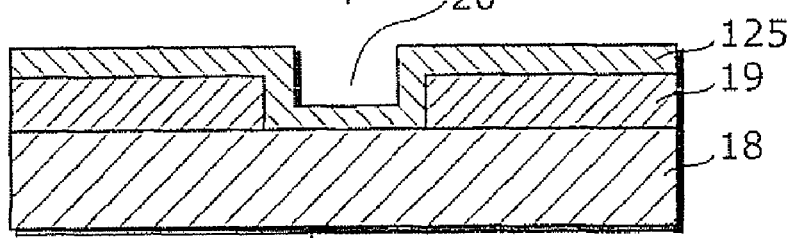
Figure 10C:
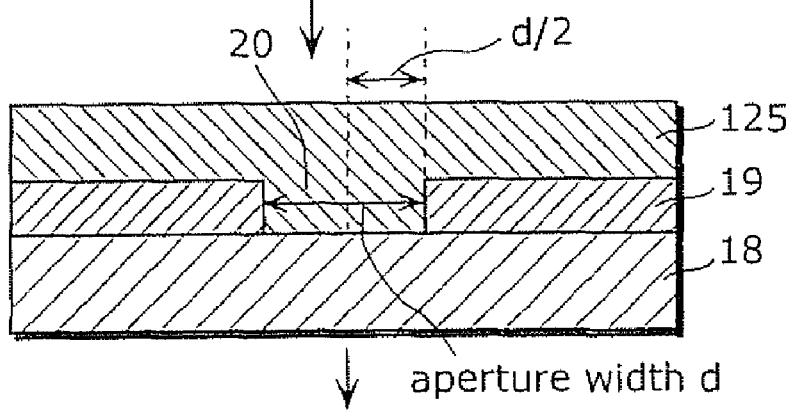

Next, a second process (FIG. 10(b)) and a third process (FIG. 10(c)) are sequentially performed. In the second process, a high refractive index layer 125 which allows transmission of light is formed in the aperture 20 and on the light-blocking film 19. In the third process, the high refractive index layer 125 is additionally formed in the aperture 20 and on the light-blocking film 19. Through performances of sequential second and third processes, the high refractive index layer 125 on the aperture 20 can planarize itself.

Figure 10D:
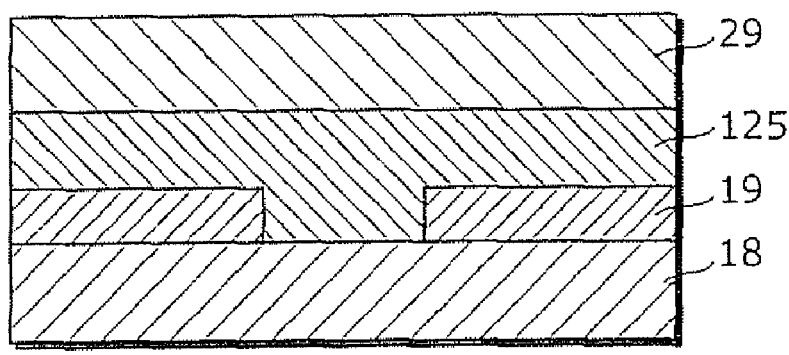

Lastly, a forth process (FIG. 10(d)) is performed. In the fourth process, an interlayer film 29 is formed above the light-blocking film 19 having a smaller refractive index than the high refractive index layer 125.

Through the first to fourth processes, it can be formed a configuration above the light-blocking film 19 in the light-receiving cells 111a, 111b and 111c in the solid-state image sensor of the first embodiment. As in the case of the solid-state image sensor of the present invention, when the width of the aperture 20 is particularly small, a high refractive index layer 125 having a flat surface can be formed by continuously forming a high refractive index material after the second process of filling the aperture 20 with the high refractive index material. This is because, with the high refractive index material which forms a concave portion in the aperture 20, a width of the concave portion is narrowed as the thickness of the high refractive index material becomes thicker so that side walls of the concave portion come in contact with each other in the end. Here, when the high refractive index material comes in contact equally with the plane surfaces and side surfaces of the light-blocking film 19, the concave portion can be planarized by setting the thickness of the high refractive index layer 125 to be equal to or thicker than a half of a width (d) of the aperture 20. Since the high refractive index layer 125 is planarized, a surface of the interlayer film 29 above the light-blocking film 19 formed on the high refractive index layer 125 can be also planarized. Therefore, the process of planarizing the interlayer film 29 using chemical mechanical polishing (CMP) and the like can be omitted or the amount of planarization such as CMP and time can be reduced.

In the case of applying this manufacturing method to a solid-state image sensor having a conventional structure in which the width (d) of the aperture 20 is large, the thickness (d/2) of the high refractive index layer 125 for filling up the concave portion is significantly widened so that the thickness of the high refractive index layer 125 is thickened when planarization is performed by the aforementioned manufacturing method. Consequently, there is caused a difficulty of condensing light. Accordingly, this manufacturing method is particularly effective for a practical use in the case where the width (d) of the aperture 20 is equal to or smaller than 1.5 µm.

In the case of using the aforementioned manufacturing method, with the characteristics of the solid-state image sensor, the high refractive index layer 125 above the aperture 20 can be easily planarized. Therefore, asperities on an interface between the high refractive index layer 125 and the interlayer film 29 above the light-blocking film 19 are flattened, and light can be transmitted to the aperture 20 without diffusion on the interface and the degradation of sensitivity can be significantly improved.

In the manufacturing method shown in FIG. 10, the interlayer film 29 is formed above the light-blocking film 19 immediately after forming the high refractive index layer 125 and planarizing its surface. However, a fifth process may be added to after the third process of forming the high refractive index material. The fifth process includes further planarizing the high refractive index layer 125 by CMP and the like. Accordingly, the diffusion of light on the interface between the high refractive index layer 125 and the interlayer film 29 above the light-blocking film 19 can be further reduced and the degradation of sensitivity can be significantly improved. Furthermore, the unevenness of the amount of light entering the apertures 20 of respective light-receiving cells can be minimized and the unevenness of sensitivities among them can also be significantly improved.

Second Embodiment

Figure 11:
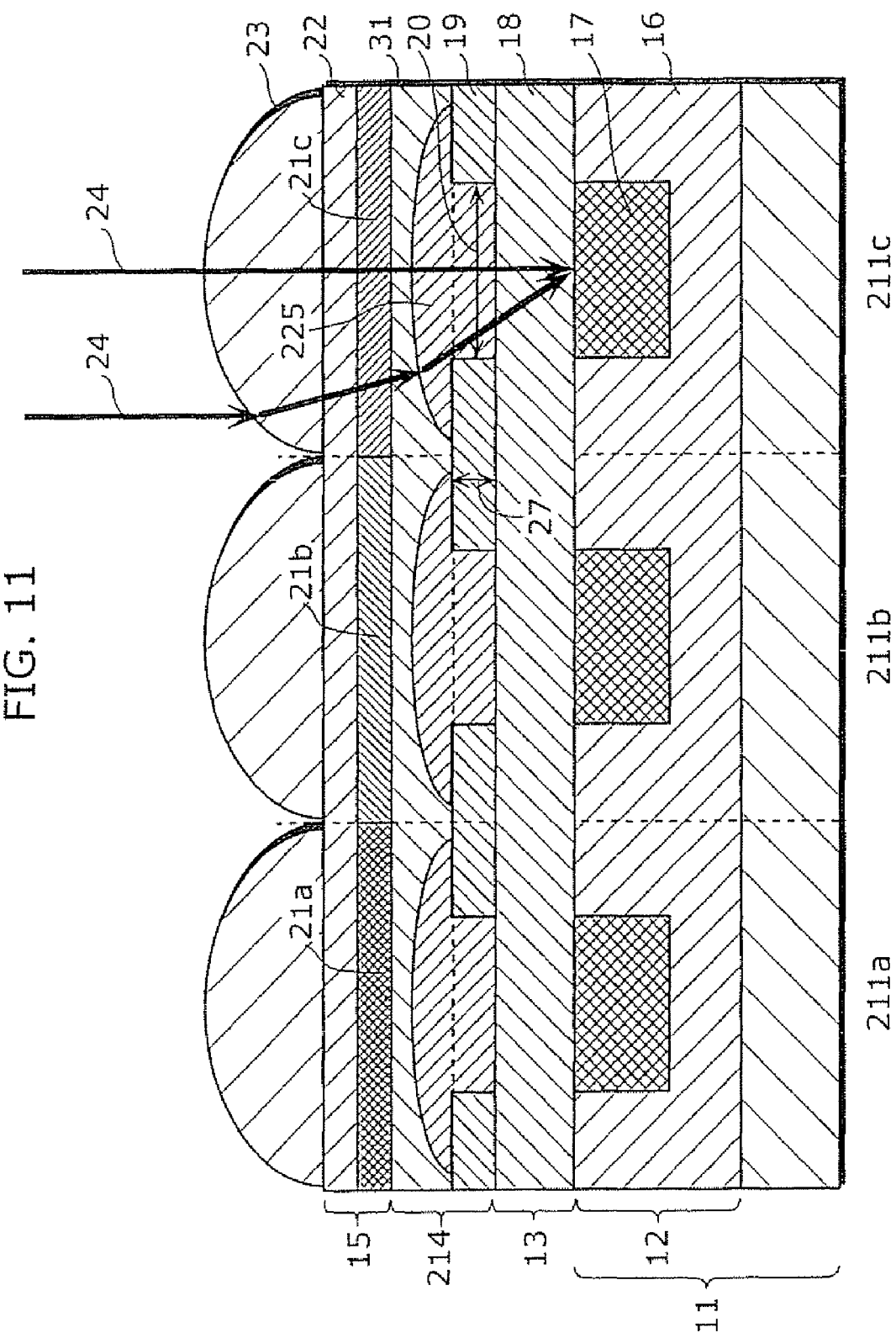
FIG. 11 is a cross-section diagram showing light-receiving cells in a solid-state image sensor according to the second embodiment of the present invention.

FIG. 11 is a cross-section diagram of the light-receiving cells 211a, 211b and 211c in a solid-state image sensor according to the second embodiment of the present invention. The semiconductor substrate 11, the photoelectric conversion layer 12 and the insulating layer 13 of each light-receiving cell has the same configuration as in the conventional light-receiving cell shown in FIG. 3.

While a metal layer 214 includes a light-blocking film 19 as in the case of the conventional solid-state image sensor, in the solid-state image sensor according to the second embodiment of the present invention, the metal layer 214 has a high refractive index layer 225 that is formed by applying a high refractive index material in and on an aperture 20 in the light-blocking film 19 after the formation of the light-blocking film 19. Herein, the high-refractive index layer 225 is processed into a shape of a convex intralayer lens. Accordingly, the interlayer film 29 and the intralayer lens 30 above the light-blocking film 19 that are required in the configuration of the conventional solid-state image sensor can be omitted so that height of an overall light-receiving cell can be lowered.

In the solid-state image sensor of the second embodiment, the incident light 24 passes through the microlens 23 and the color filter layer 15, is condensed directly by the intralayer lens made of the high refractive index layer 225 without passing through the intralayer lens 30 in the conventional solid-state image sensor, and reaches the photoelectric conversion unit 17. Accordingly, the high refractive index layer 225 in the aperture 20 is shaped in a convex intralayer lens and can condense light immediately above the aperture 20. Therefore, when the width of the aperture 20 is close to the wavelength of visible light, the light condensing efficiency can be significantly increased.

FIG. 12 is a cross-section diagram showing a method of forming a configuration above the light-blocking film 19 in the light-receiving cells 211a, 211b and 211c in the solid-state image sensor according to the second embodiment of the present invention. FIG. 12 shows a process of forming the aperture 20 to a process of forming the interlayer film 31 above the light-blocking film 19 in the light-receiving cells 211a, 211b and 211c in the solid-state image sensor of the second embodiment.

Figure 12E:
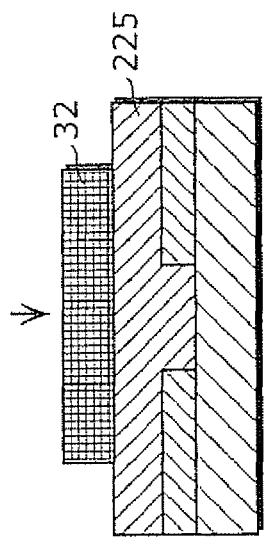
FIG. 12 is a cross-section diagram showing a method of forming a configuration on a light-blocking film in a light-receiving cell in the solid-state image sensor according to the second embodiment of the present invention.
Figure 12F:
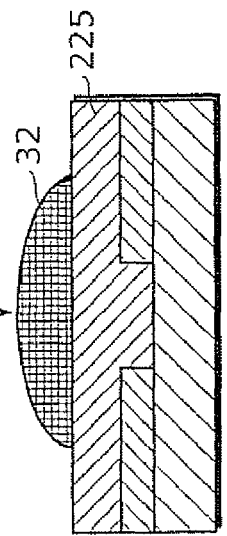
Figure 12G:
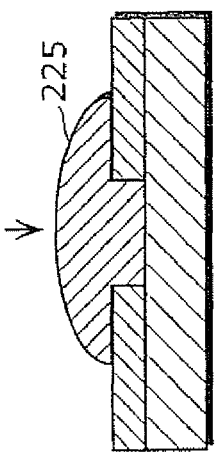
Figure 12H:
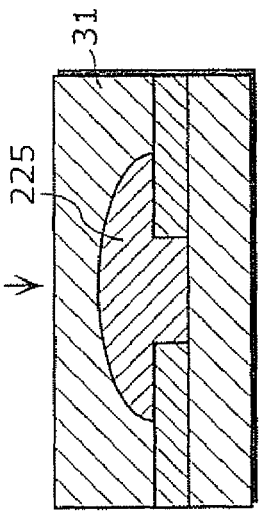
Figure 12A:
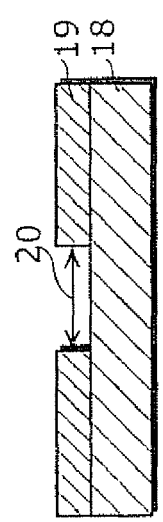
Figure 12B:
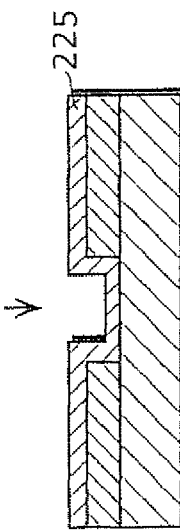
Figure 12C:
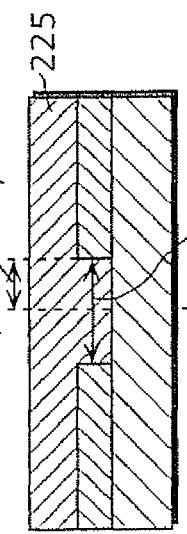

In this manufacturing method, the first to third processes (FIG. 12(a) to FIG. 12(c)) of forming the high refractive index layer 225 using the same method as the manufacturing method of the solid-state image sensor according to the first embodiment shown in FIG. 10 are performed, additional fourth to seventh processes of forming an intralayer lens using the high refractive index layer 225 are then performed, and an eighth process of forming the interlayer film 31 on the light-blocking film 19 is performed in the end. The fourth to eighth processes shall be described in detail hereinafter.

Figure 12D:
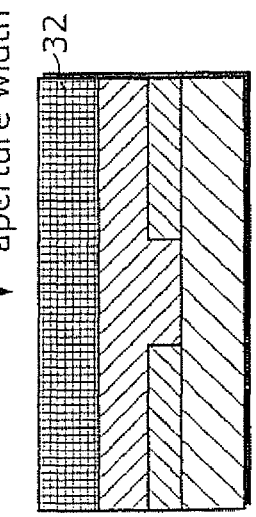

First, the fourth process of applying resist 32 on the high refractive index layer 225 is performed (FIG. 12(d)).

Next, the fifth process of exposing the applied resist to light and developing it so as not to remove the resist 32 deposited in a region in which a lens is to be formed (FIG. 12(e)).

Following that, the sixth process of shaping the remained resist 32 in a lens shape is performed by heating the remained resist 32 (FIG. 12(f)).

Next, the seventh process of forming an intralayer lens made of the high refractive index layer 225 is performed by evenly etching the lens-shaped resist 32 and the high refractive index layer 225 (FIG. 12(g)).

Lastly, the eighth process of forming an interlayer film 31 on the light-blocking layer 19 is performed (FIG. 12 (h)).

As described in the above, through the fourth to seventh processes of forming an intralayer lens using the high refractive index layer 225, a unique film forming process required for forming a conventional intralayer lens is deleted so that the process of manufacturing a solid-state image sensor can be decreased. Consequently, a solid-state image sensor can be provided at low price. Furthermore, since the intralayer lens is positioned immediately above the light-blocking film 19, even in the case where the width of the aperture 20 is narrow, the solid-state image sensor can efficiently condense light and highly-sensitive solid-state image sensor can be realized.

Third Embodiment

Figure 13:
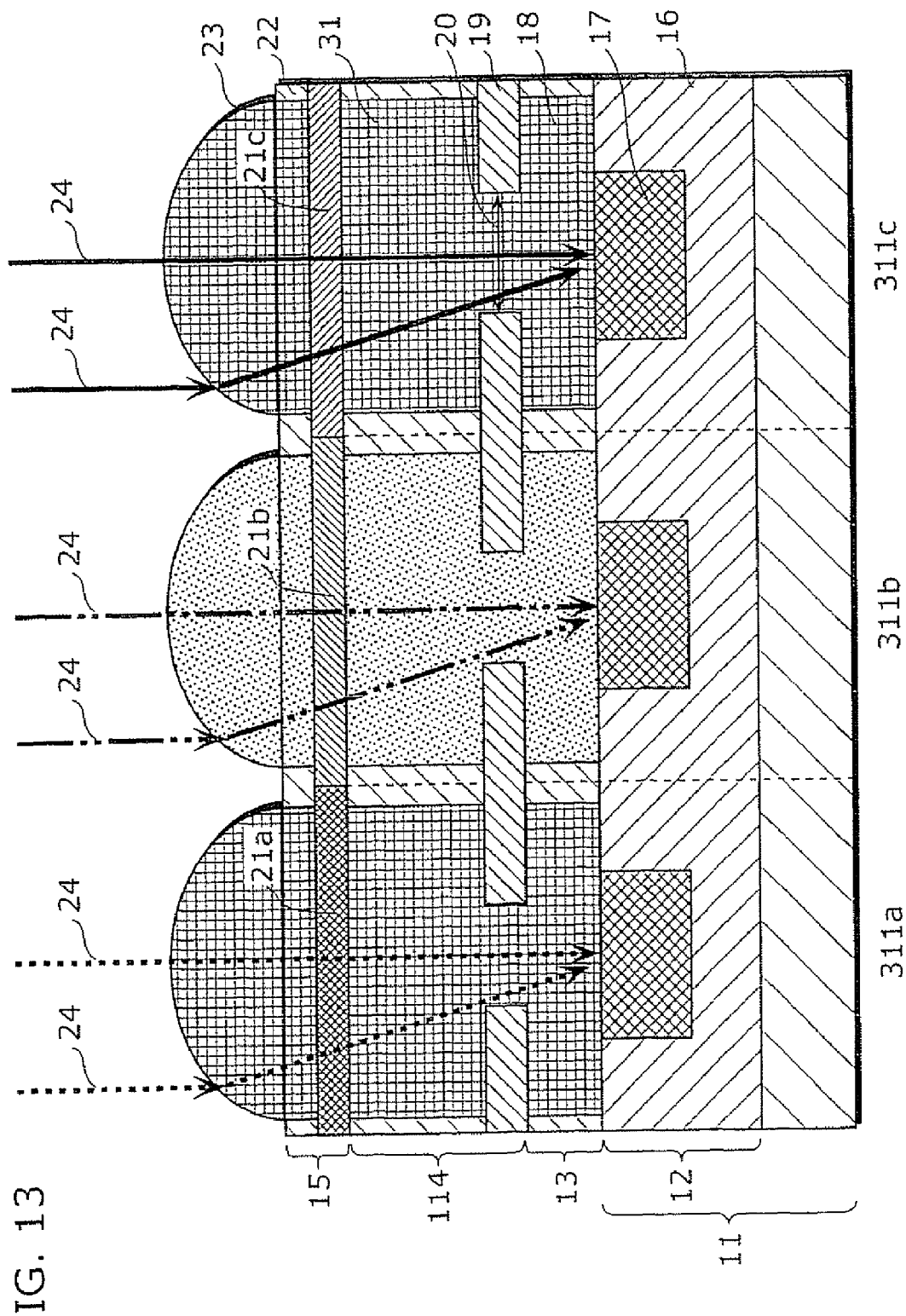
FIG. 13 is a cross-section diagram showing light-receiving cells in a solid-state image sensor according to the third embodiment of the present invention.

FIG. 13 is a cross-section diagram of the light-receiving cells 311a, 311b and 311c in a solid-state image sensor according to the third embodiment of the present invention.

The solid-state image sensor of the third embodiment is is different from the solid-state image sensor of the first embodiment in that the insulating layer 13, the metal layer 114 and the microlens 23 have the same refractive index value.

In the solid-state image sensor of the third embodiment, a light-receiving cell having a longer transmission wavelength of a filter has higher refractive indexes of the insulating film 13, an insulating layer in the metal layer 114 and a microlens 23. In addition, light receiving cells having different transmission wavelengths of respective filters have different refractive indexes of the insulating layer 13, insulating layer in the metal layer 114, and microlens 23. For example, in the light-receiving cell having a longer transmission wavelength of a filter, the insulating layer 13, the insulating layer in the metal layer 114 and the microlens 23 are made of a single material having a high refractive index so that their refractive indexes have the same refractive index value. On the other hand, in the case of a light-receiving cell having a shorter transmission wavelength of a filter, the insulating layer 13, the insulating layer in the metal layer 114 and the microlens 23 are made of a material having a small refractive index so that their refractive indexes have the same refractive index value. As a result, the manufacturing costs can be reduced. Furthermore, light of a longer wavelength can be condensed into an aperture with a small width. Therefore, the light-condensing efficiency of the light of a longer wavelength is improved and the sensitivity of the photoelectric conversion unit which converts the light into signal charge can be significantly increased.

Fourth Embodiment

Figure 14:
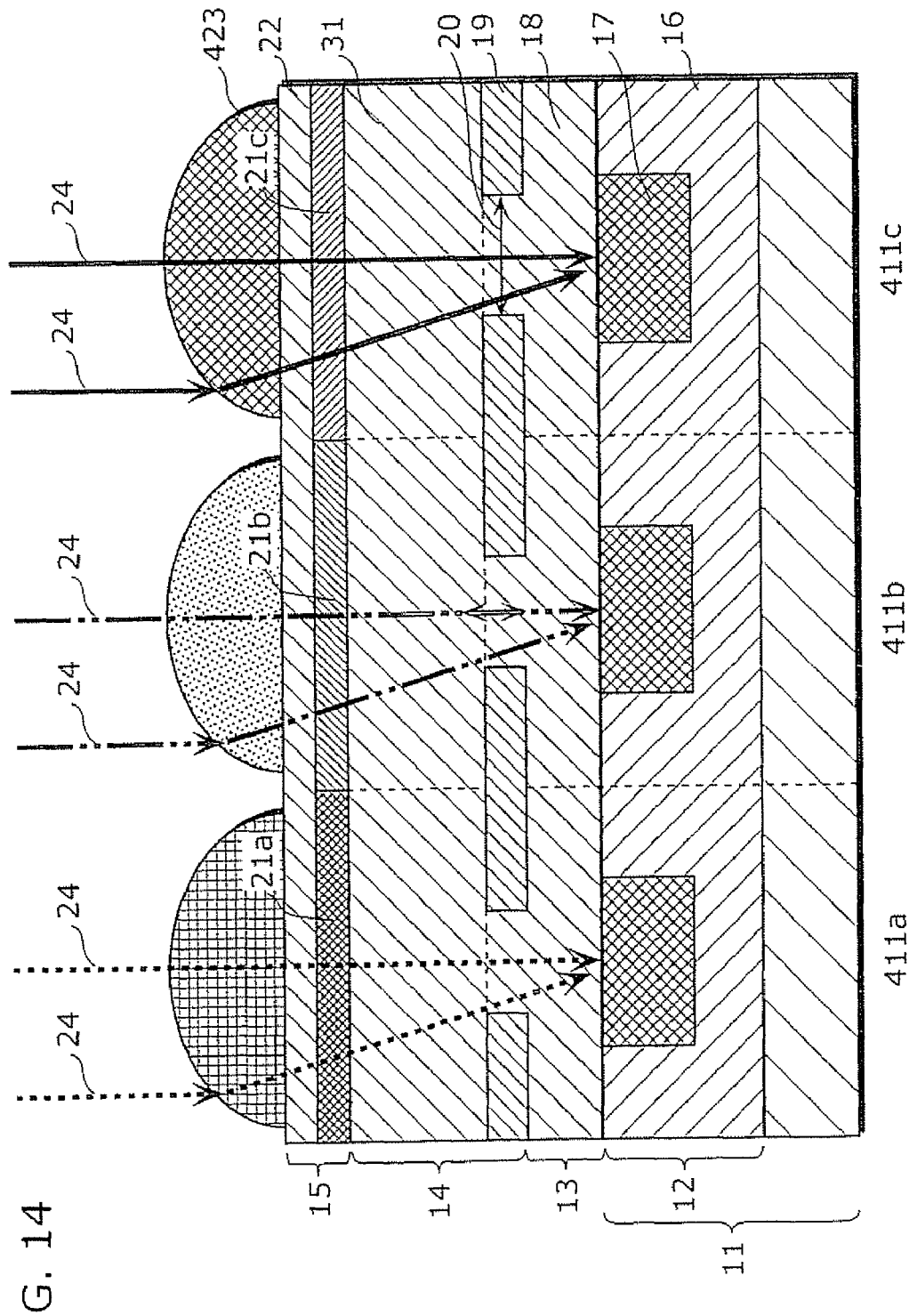
FIG. 14 is a cross-section diagram showing light-receiving cells in a solid-state image sensor according to the fourth embodiment of the present invention.

FIG. 14 is a cross-section diagram of the light-receiving cells 411a, 411b and 411c in a solid-state image sensor according to the fourth embodiment of the present invention. The semiconductor substrate 11, photoelectric conversion layer 12, insulating layer 13, and metal layer 14 and color filter 15 of each light-receiving cell in the fourth embodiment has the same configuration as in the conventional solid-state image sensor shown in FIG. 3 except that the intralayer lens 30 is not formed in the metal layer 14 in the present embodiment.

The solid-state image sensor of the fourth embodiment has a configuration in which a refractive index of a material which composes the microlens 423 formed on the color filter layer 15 differs in accordance with a transmission wavelength band of a color filter.

Here, the finer the light-receiving cells are, the narrower the widths of the apertures 20 become. For example, when the width of the aperture 20 is 2 μm or smaller, it is difficult to condense light into the aperture 20. In particular, it is well known that it is difficult to condense light when the light has passed through the red (R) filter film 21c having a transmission wavelength band in a longer wavelength. In order to overcome the problem, in the solid-state image sensor of the fourth embodiment, the refractive index of the microlens 423 is set to be higher as the transmission wavelength band of the color filter is longer. For example, the following configuration is realized in which oxide silicon film having a refractive index of 1.5 is used for the microlens 423 formed above the blue (B) filter film 21a having a transmission wavelength band in a short wavelength, silicon nitride film having a refractive index of 2.0 is used for the microlens 423 formed above the green (G) filter film 21b having a transmission wavelength band in an intermediate wavelength, and titanium oxide film having a refractive index of 2.5 is used for the microlens 423 formed above the red (R) filter film 21c having a transmission wavelength band in a long wavelength. Accordingly, the light condensing efficiency of light in a longer wavelength is improved and the sensitivity of the photoelectric conversion unit which converts light into signal charge in a longer wavelength can be significantly improved.

Fifth Embodiment

Figure 15:
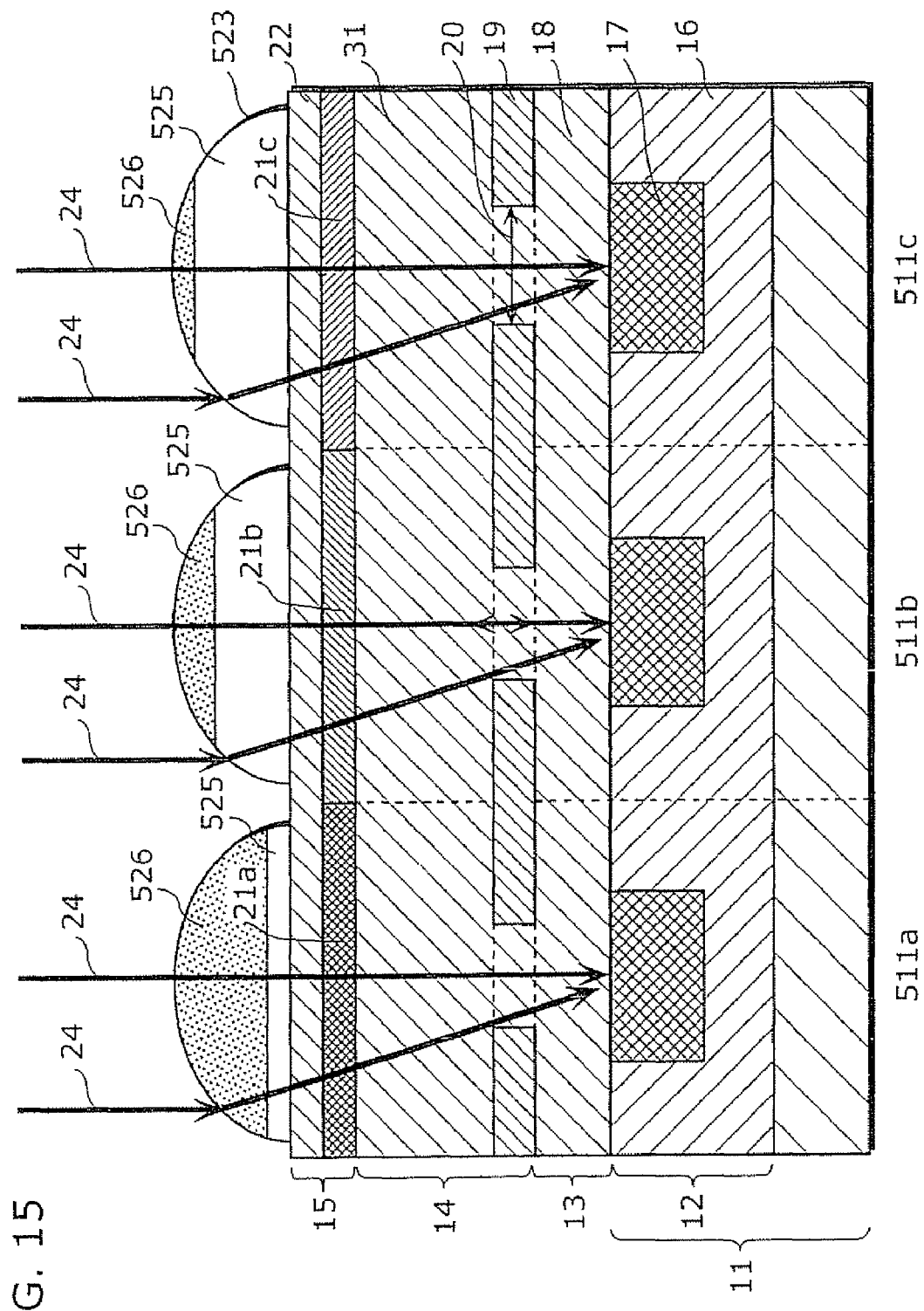
FIG. 15 is a cross-section diagram showing light-receiving cells in a solid-state image sensor according to the fifth embodiment of the present invention.

FIG. 15 is a cross-section diagram of the light-receiving cells 511a, 511b and 511c in a solid-state image sensor according to the fifth embodiment of the present invention.

Figure 1:
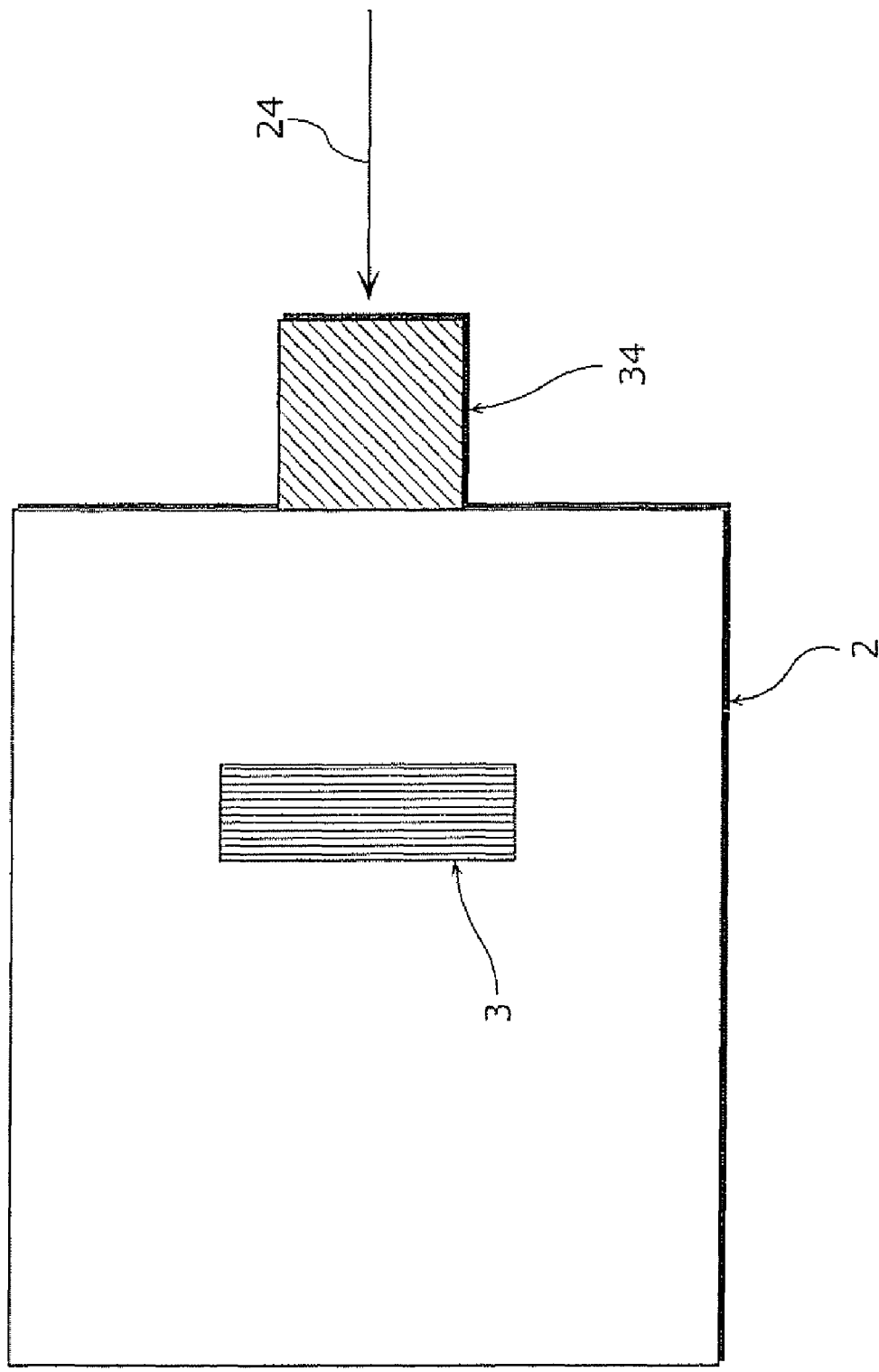
FIG. 1 is a diagram showing a camera which uses a solid-state image sensor.
Figure 2:
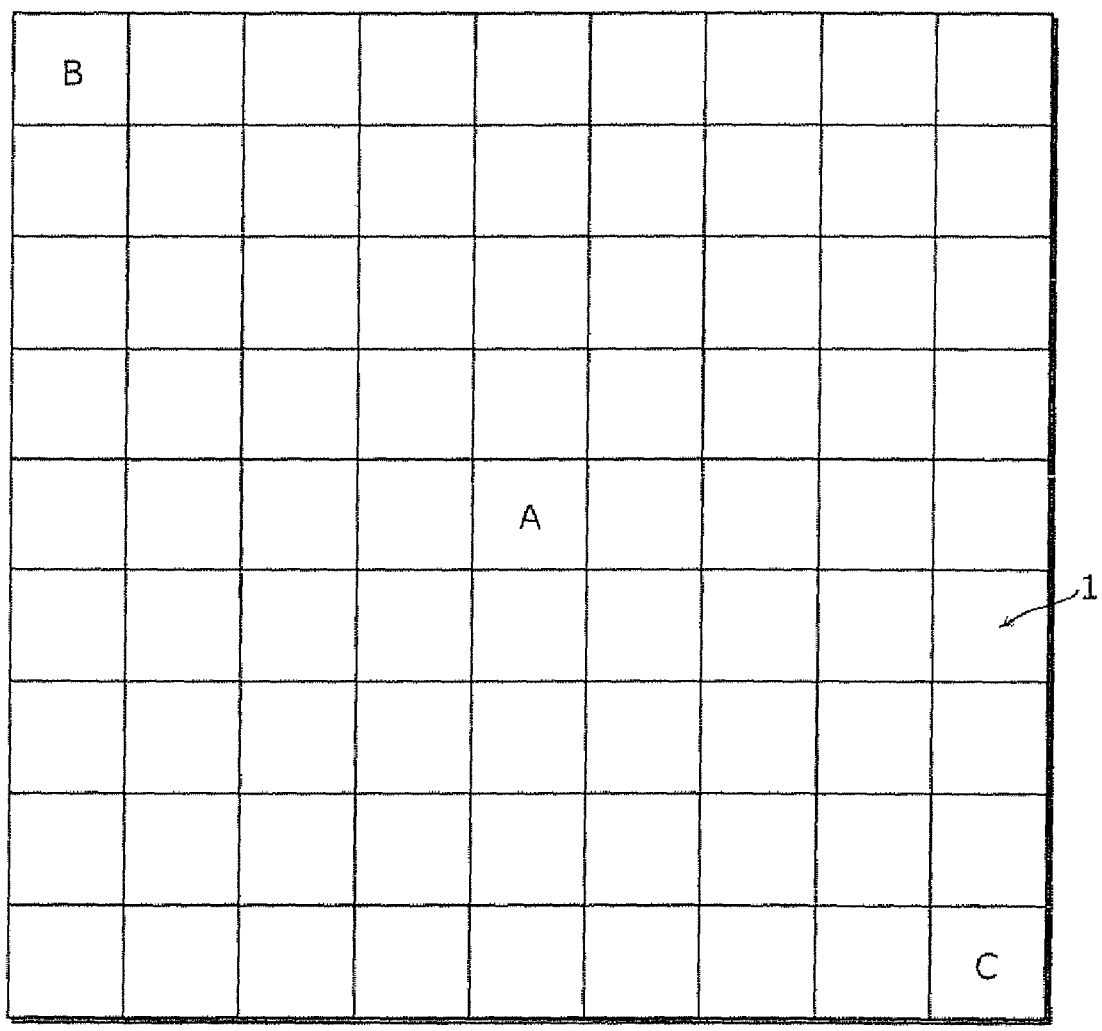
FIG. 2 is a diagram showing an arrangement of light-receiving cells in a conventional solid-state image sensor.
Figure 3:
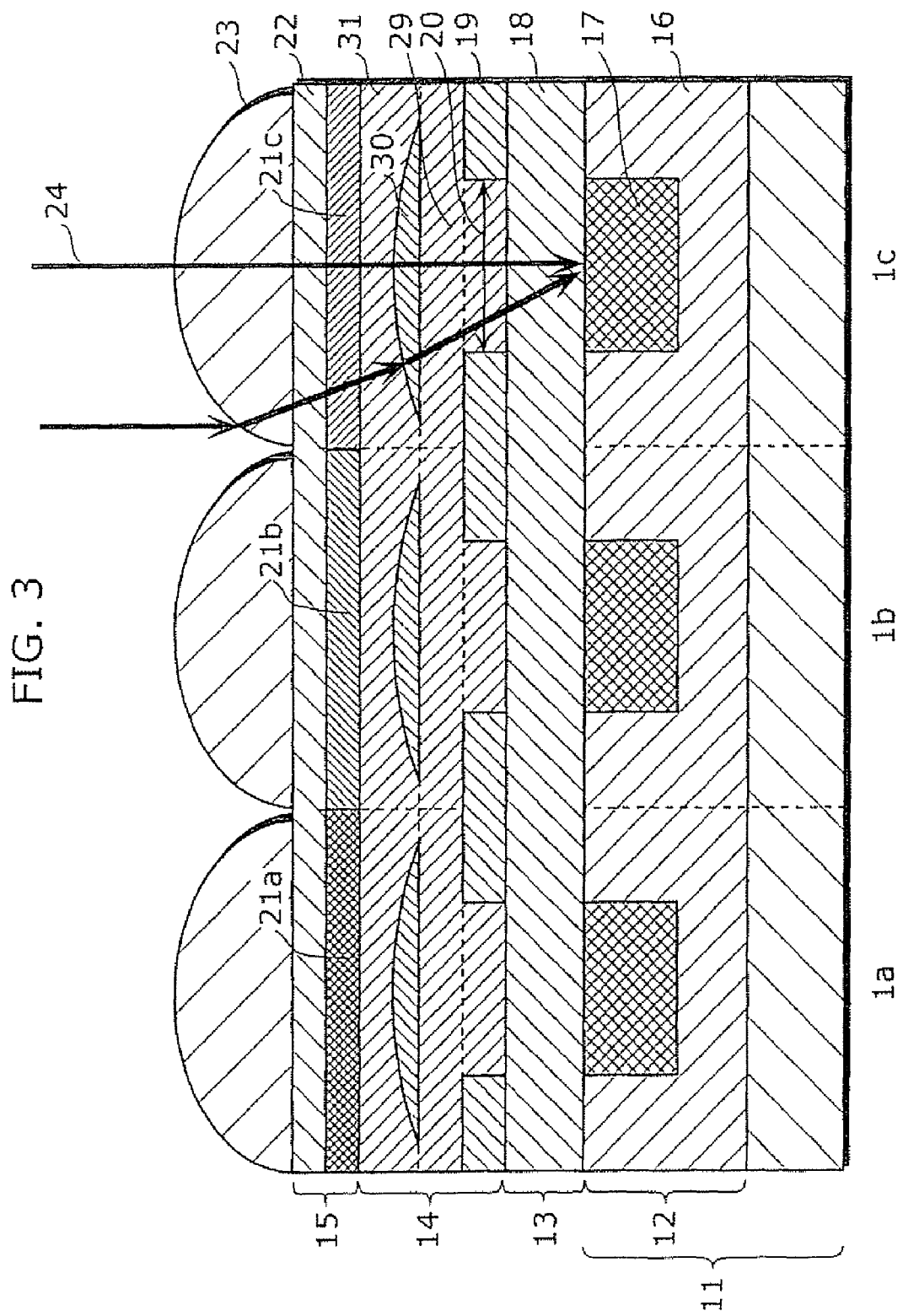
FIG. 3 is a cross-section diagram of the light-receiving cells in the conventional solid-state image sensor.
Figure 4:
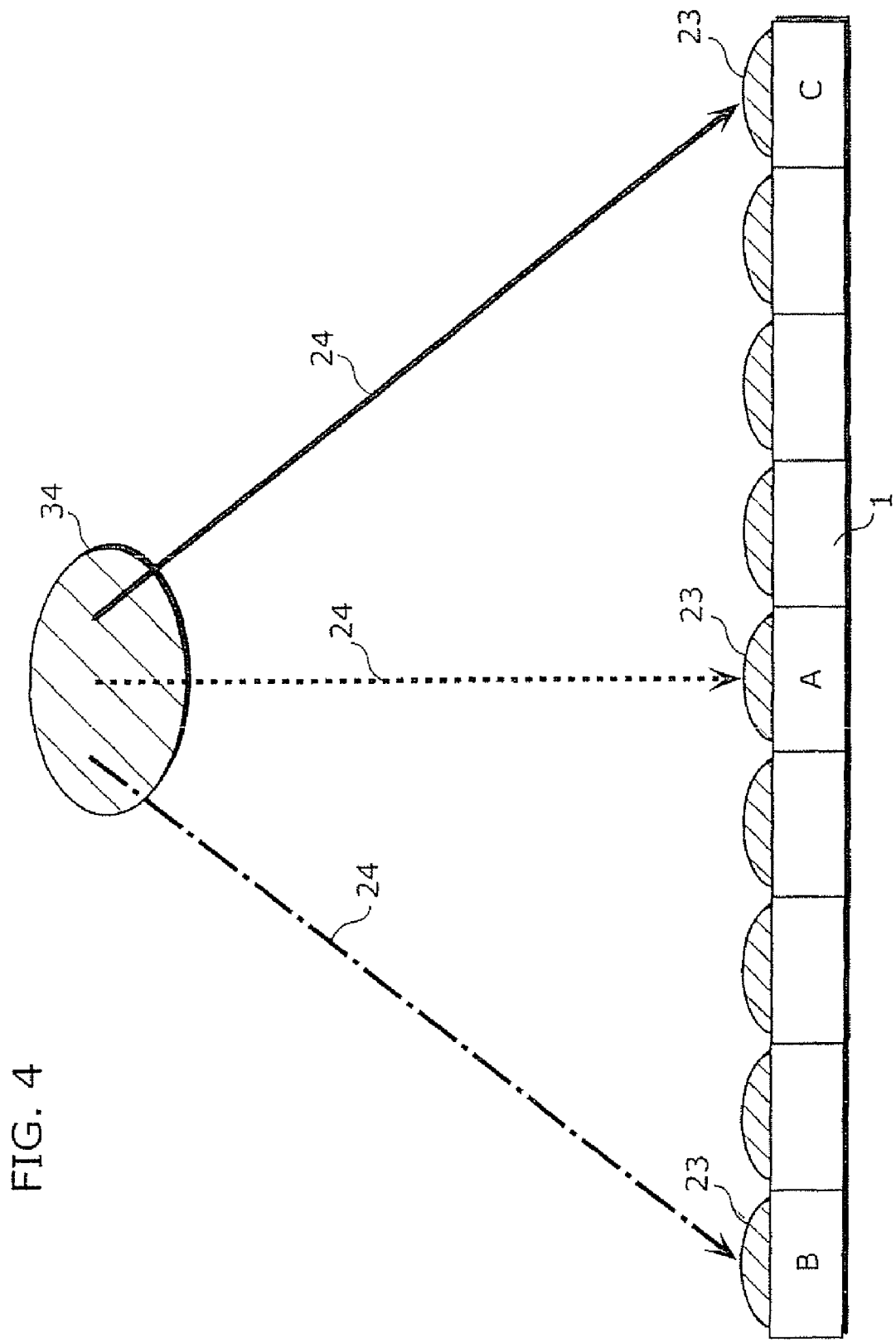
FIG. 4 is a diagram showing a state where light enters the conventional solid-state image sensor (light-receiving cells)

Each light-receiving cell includes the semiconductor substrate 11, photoelectric conversion layer 12, insulating layer 13, metal layer 14 and color filter 15 that have the same configurations as in the conventional light-receiving cell shown in FIG. 3.

The solid-state image sensor of the fifth embodiment has a configuration in which microlenses 523 formed on the color filter layer 15 of respective light-receiving cells are made of two materials of a low refractive index material 526 (e.g. silicon oxide having a refractive index of 1.5) and a high refractive index material 525 (e.g. silicon nitride having a refractive index of 2.0) having a refractive index higher than that of the low refractive index material 526.

In this solid-state image sensor, the component ratio between the low refractive index material 526 and the high refractive index material 525 in the microlens 523 formed on the color filter layer 15 varies depending on a light-transmission wavelength band of the color filter. In other words, the longer the light-transmission wavelength band of a color filter is, the greater a volume ratio of the high refractive index material 525 in the microlens 523 becomes. For example, in the microlens 523 positioned on the blue (B) filter film 21a having a light-transmission wavelength band in a short wavelength, the volume ratio between the low refractive index material 526 and the high refractive index material 525 is 9:1. In the microlens 523 positioned on the green (G) filter layer 21b having a transmission wavelength band in an intermediate wavelength, the volume ratio between the low refractive index material 526 and the high refractive index material 525 is 4:6. In the microlens 523 positioned on the red (R) filter film 21c having a transmission wavelength band in a long wavelength, the volume ratio between the low refractive index material 526 and the high refractive index material 525 is 1:9. Thus, the volume ratio of the high refractive index material 525 becomes greater when the wavelength of the transmission wavelength band is longer. Accordingly, it can be set an average refractive index of a microlens which is positioned above or below a color filter which transmits light in a longer wavelength band higher than an average refractive index of a microlens which is positioned above or below a color filter which transmits light in a shorter wavelength band. Consequently, the light condensing efficiency of light in a longer wavelength band which is difficult to be condensed can be improved and the sensitivity of the photoelectric conversion units which convert light in the longer wavelength band into signal charge can be increased.

Sixth Embodiment

Figure 16:
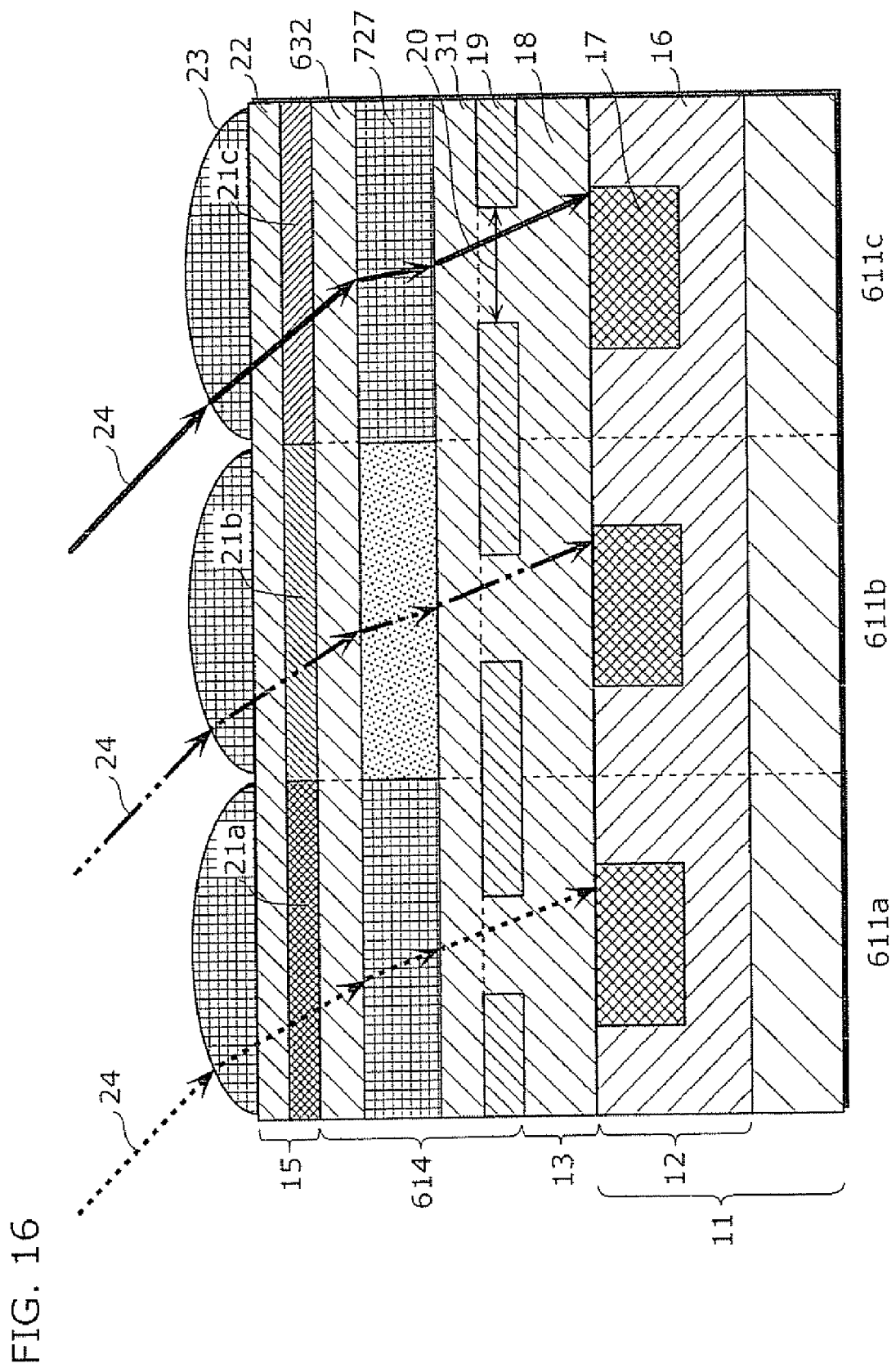
FIG. 16 is a cross-section diagram showing light-receiving cells in a solid-state image sensor according to the sixth embodiment of the present invention.

FIG. 16 is a cross-section diagram of the light-receiving cells 611a, 611b and 611c in a solid-state image sensor according to the sixth embodiment of the present invention.

Each light-receiving cell includes a semiconductor substrate 11, a photoelectric conversion layer 12, an insulating layer 13, and a color filter layer 15 that are structured as in the conventional light-receiving cells shown in FIG. 3.

The solid-state image sensor of the sixth embodiment has a metal layer 614 formed under the color filter 15 of each light-receiving cell. The metal layer 614 has a light-blocking film 19 having an aperture 20, interlayer films 31 and 632, and a high refractive index interlayer film 727.

In this solid-state image sensor, the refractive indexes of high refractive index interlayer films 727 formed under respective color filter layers 15 vary when each color filter has a different transmission wavelength band. In other words, the longer the transmission wavelength band of a color filter is, the greater a refractive index of the high refractive index interlayer film 727 becomes. For example, silicon oxide film having a refractive index of 1.5 is used as the high refractive index interlayer film 727 positioned below the blue (B) filter film 21a having a transmission wavelength band in a short wavelength; nitride silicon film having a refractive index of 2.0 is used as the high refractive index interlayer film 727 positioned below the green (G) filter film 21b having a transmission wavelength band in an intermediate wavelength; and titanium oxide having a refractive index of 2.5 is used as the high refractive index interlayer film 727 positioned below the red (R) filter film 21c having a transmission wavelength band in a long wavelength. Thus, the configuration in which the longer the wavelength in the transmission wavelength band is the higher the refractive index becomes.

With the aforementioned configuration, the refractive index of the high refractive index interlayer film 727 positioned below a color filter which transmits light in a long wavelength band becomes higher than the refractive index of the high refractive index interlayer film 727 positioned below a color filter which transmits light in a short wavelength band. Therefore, even in the case where the light in a long wavelength band which is difficult to be condensed enters light-receiving cells at a large incident angle, the high refractive index interlayer films 727 can bend that light so as to allow the light to enter the photoelectric conversion units. Consequently, the sensitivity of the photoelectric conversion units which convert light in the long wavelength band into signal charge can be significantly increased.

It should be noted that, in the solid-state image sensor of the sixth embodiment, the high refractive index interlayer films 727 are positioned below the respective color filters. However, similar effect can be obtained even in the case where the high refractive index interlayer films 727 are placed above the respective color filters.

Seventh Embodiment

Figure 17:
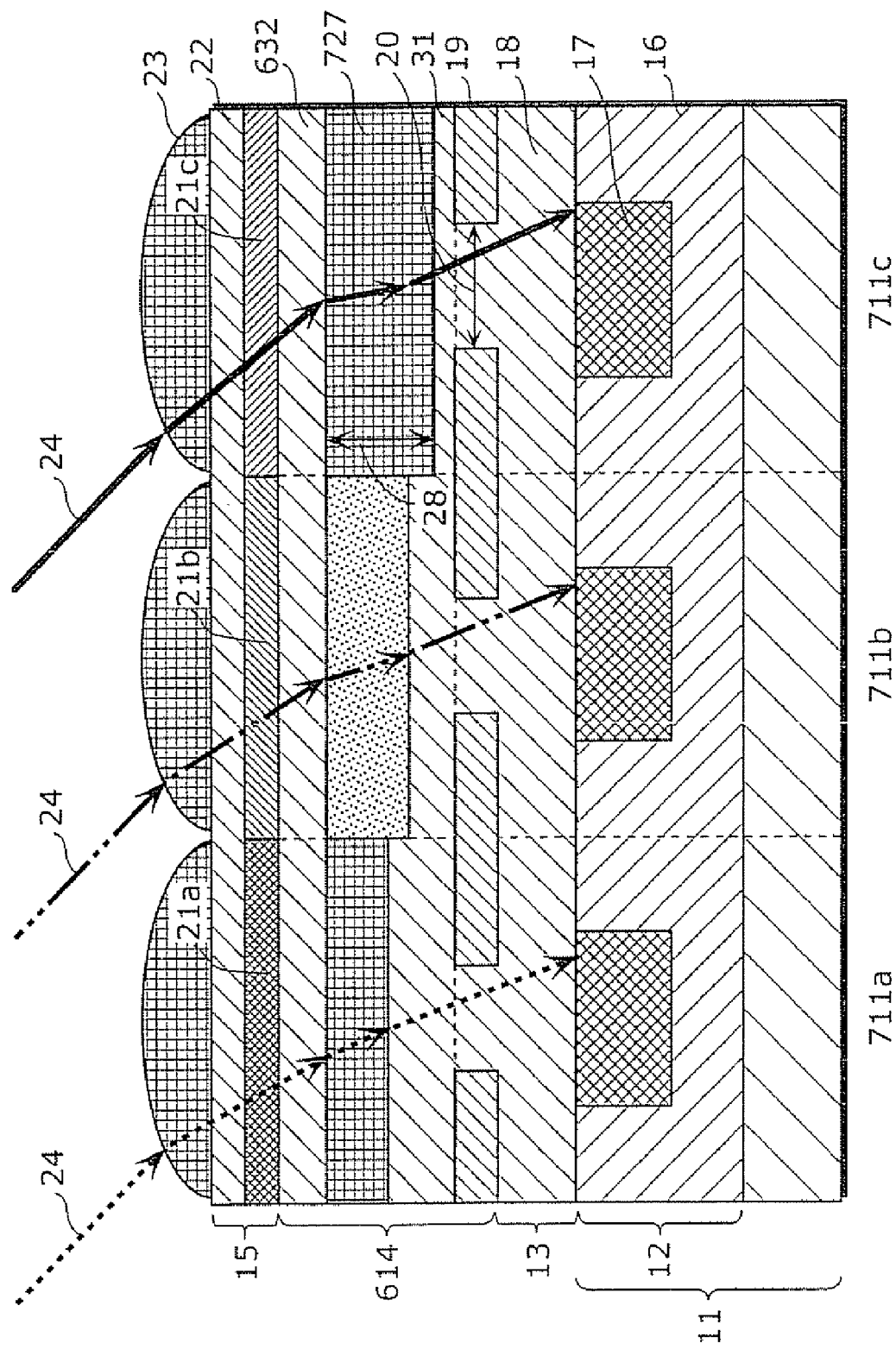
FIG. 17 is a cross-section diagram showing light-receiving cells in a solid-state image sensor according to the seventh embodiment of the present invention.

FIG. 17 is a cross-section diagram of the light-receiving cells 711a, 711b and 711c in a solid-state image sensor according to the seventh embodiment of the present invention.

The solid-state image sensor of the seventh embodiment is different from the solid-state image sensor of the sixth embodiment in that the thicknesses of the high refractive index interlayer films 727 vary by light-receiving cells.

This solid-state image sensor has a structure in which, in the case where each color filter has a different light-transmission wavelength band, the thicker the thickness of the high refractive index interlayer film 727 is the longer the light-transmission wavelength band of the color filter becomes. For example, the thickness of the high refractive index interlayer film 727 positioned below the blue (B) filter film 21a having a light-transmission wavelength band in a short length is set to 300 nm; the thickness of the high refractive index interlayer film 727 positioned below the green (G) filter film 21b having a light-transmission wavelength band in an intermediate wavelength is set to 500 nm, and the thickness of the high refractive index interlayer film 727 positioned below the red (R) filter film 21c having a light-transmission wavelength band in a long wavelength is set to 700 nm. Thus, the configuration in which the longer the wavelength in the transmission wavelength band is the greater the thickness of the high refractive index interlayer film 727 becomes is realized.

With the aforementioned configuration, the thickness of the high refractive index interlayer film 727 positioned below the color filter which transmits light in a long wavelength band becomes greater than the thickness of the high refractive index interlayer film 727 positioned below the color filter which transmits light in a short wavelength band. Therefore, when the light in a long wavelength band which is difficult to be condensed enters light-receiving cells at a large incident angle, the incident light entering with a large incident angle can be easily bent and allowed to enter the photoelectric conversion units. Consequently, the sensitivity of the photoelectric conversion units which convert light in the long wavelength band into signal charge can be significantly increased.

It should be noted that, in the solid-state image sensor of the seventh embodiment, in the case where light-transmission wavelength bands of color filters vary by light-receiving cells, the longer the light-transmission wavelength of the color filter is the greater the thickness and refractive index of the high refractive index interlayer film 727 become. However, similar effect can be obtained even in the case where only the thicknesses of the high refractive index interlayer films 727 are varied as described in the above and the refractive indexes of the high refractive index interlayer films 727 are kept to be the same value.

Furthermore, in the solid-state image sensor according to the seventh embodiment, the high refractive index interlayer films 727 are positioned under the respective color filters, similar effect can be obtained even in the case where the high refractive index interlayer films 727 are positioned above the respective color filters.

Eighth Embodiment

Figure 18:
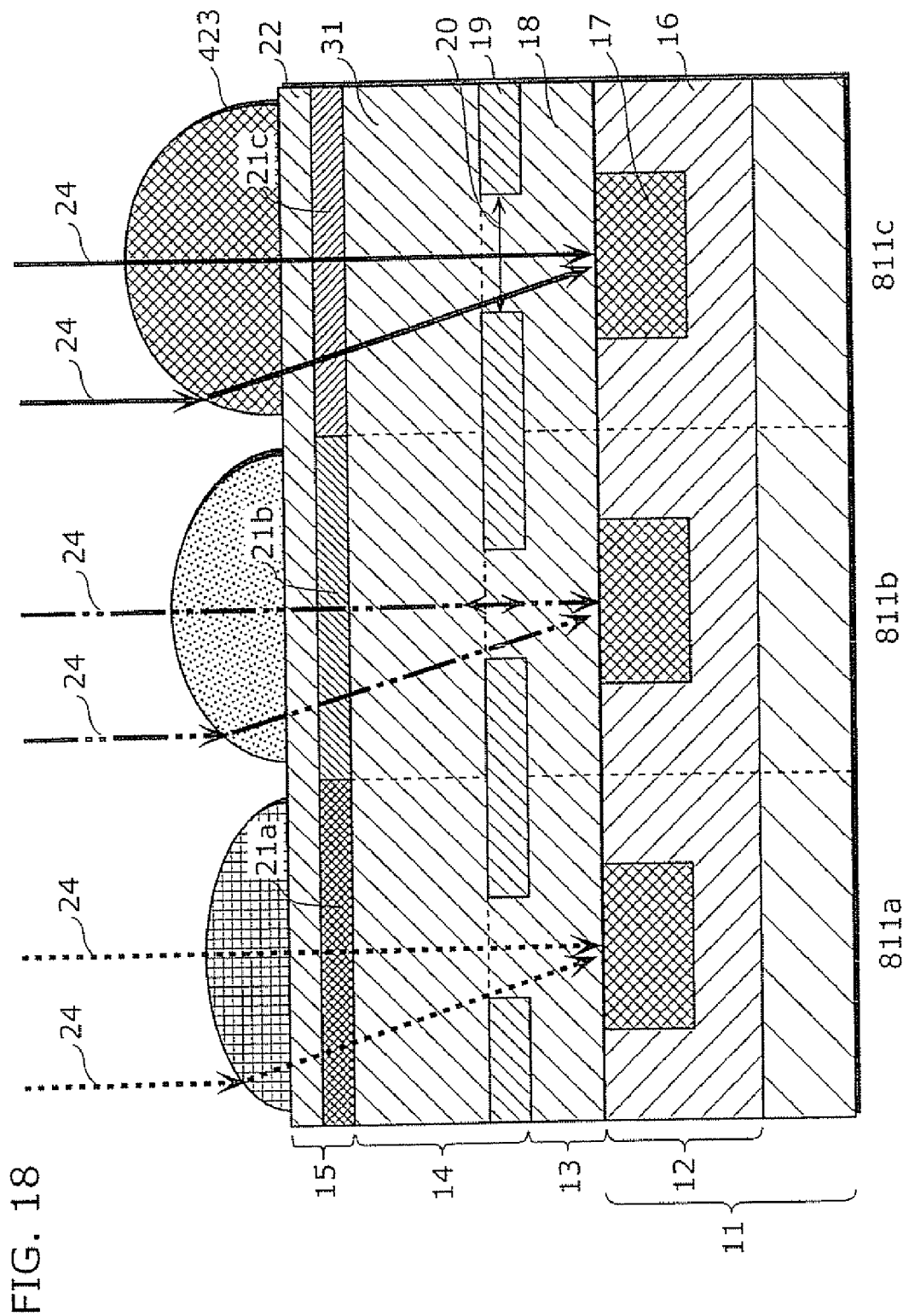
FIG. 18 is a cross-section diagram showing light-receiving cells in a solid-state image sensor according to the eighth embodiment of the present invention.

FIG. 18 is a cross-section diagram of the light-receiving cells 811a, 811b and 811c in a solid-state image sensor according to the eighth embodiment of the present invention.

The solid-state image sensor of the eighth embodiment is different from the solid-state image sensor of the fourth embodiment in that the heights of the microlenses 423 vary by light-receiving cells.

The solid-state image sensor of the eighth embodiment has a structure in which, in the case where light-transmission wavelength bands of respective color filters are different from each other, the heights of respective microlenses 423 formed on the color filter layer 15 vary. Here, the longer the transmission wavelength band of the color filter is, the higher the height of the microlenses 423 becomes. For example, the height of the microlens 423 positioned above the blue (B) filter film 21a having a light-transmission wavelength band in a short length is set to 1.0 µm; the height of the microlens 423 positioned above the green (G) filter film 21b having a light-transmission wavelength band in an intermediate wavelength is set to 1.2 µm; and the height of the microlens 423 positioned above the red (R) filter film 21c having a light-transmission wavelength band in a long wavelength is set to 1.4 µm. Thus, the configuration in which the longer the light-transmission wavelength band is the higher the height of the microlens 423 becomes is realized. Consequently, the light condensing efficiency of light in a long wavelength band can be improved and the sensitivity of the photoelectric conversion units which convert light in the long wavelength band into signal charge can be increased.

It should be noted that, in the solid-state image sensor of the eighth embodiment, the greater the incident angle of light which enters a light-receiving cell, the higher the height and refractive index of a microlens 423. However, similar effect can be obtained even in the case where only the heights of the microlenses 423 are varied as described in the above and the refractive indexes of the microlenses 423 are kept to be the same value.

Ninth Embodiment

Figure 19:
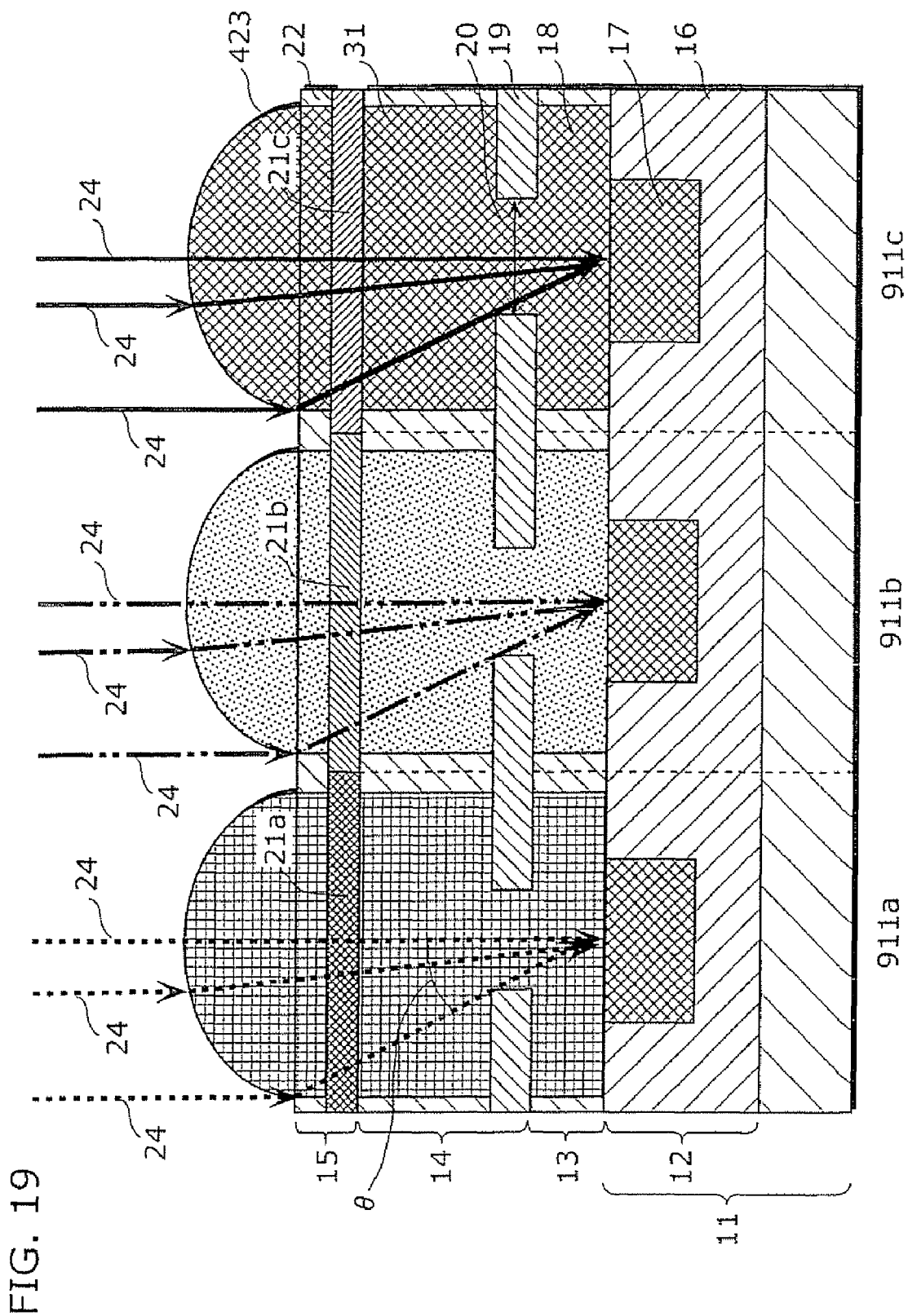
FIG. 19 is a cross-section diagram showing light-receiving cells in a solid-state image sensor according to the ninth embodiment of the present invention.

FIG. 19 is a cross-section diagram of the light-receiving cells 911a, 911b and 911c in a solid-state image sensor according to the ninth embodiment of the present invention.

The solid-state image sensor of the ninth embodiment is different from the solid-state image sensor of the fourth embodiment in that light-receiving cells having respective filter films in the same light-transmission wavelength band have same refractive indexes of the insulating film 13, an insulating layer in the metal layer 14 and a microlens 423. For example, in a light-receiving cell having a filter film in a same light-transmission wavelength band, a single material is used for the insulating layer 13, the insulating layer in the metal layer 14 and the microlens 423 so that their refractive indexes are set to be the same value. Consequently, the manufacturing costs can be lowered.

It should be noted that the light-condensing efficiency of each microlens 423 can be represented by the following expression (Formula 1).

$$s = k \times \lambda / NA \quad (NA = n \cdot \sin \theta) \qquad \text{[Formula 1]}$$

s: a spread diameter of a spot on which light focuses k: a coefficient determined by an image formation condition λ: a wavelength n: a refractive index of a medium positioned below a microlens θ: an aperture angle of the microlens (θ shown in FIG. 19)

With the expression (Formula 1), the spread diameter s of a spot on which light focuses is proportional to the wavelength λ and inverse proportional to the refractive index n, when the coefficient k and the aperture angle θ of the microlens are constant values. Accordingly, when the refractive index n of the microlens 423 is changed in accordance with the wavelength λ of light to be condensed, the spread diameter s of the spot on which light focuses can be determined as a constant value despite the wavelength λ of the light to be condensed.

For example, red light and blue light shall be focused. Here, it is described that the wavelength of red light is "$\lambda_R$", the wavelength of blue light is "$\lambda_B$", the refractive index of the microlens 423 of a cell which condenses red light is "$n_R$", and the refractive index of the microlens 423 of a cell which condenses a blue light is "$n_B$". Since the wavelength $\lambda_R$ of the red light is longer than the wavelength $\lambda_B$ of the blue light, a constant spread diameter s of a spot on which light focuses can be set for both of the red light and the blue light by setting $n_R$ to be larger than $n_B$.

Furthermore, with the aforementioned expression (Formula 1), the spread diameter s of a spot on which light focuses is decreased as the aperture angle θ of a microlens is increased. Accordingly, when the refractive index n is decreased as the aperture angle θ of the microlens is increased, a constant value can be set to the spread diameter s of the spot on which light focuses so despite the degree of the aperture angle of the microlens.

Tenth Embodiment

Figure 20:
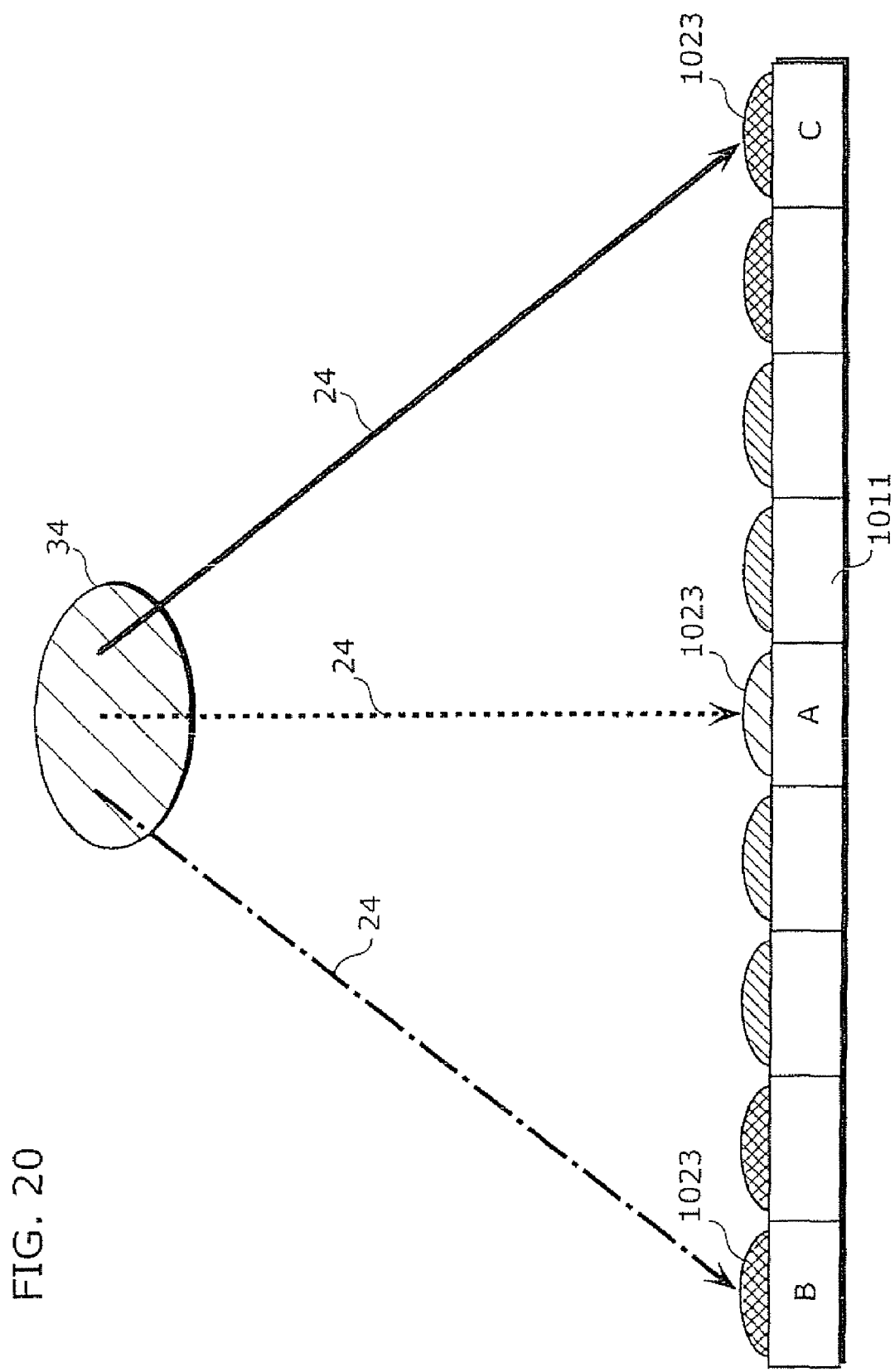
FIG. 20 is a diagram showing a state where light enters a solid-state image sensor (light-receiving cells) according to the tenth embodiment of the present invention.

FIG. 20 is a diagram showing a state where light enters a solid-state image sensor (light-receiving cells) according to the tenth embodiment of the present invention.

As shown in FIG. 20, a principal ray of light which enters through a camera lens 34 vertically enters a light-receiving cell 1011 positioned in the center A, while diagonally entering light-receiving cells 1011 positioned in the peripheries B and C.

Herein, in the solid-state image sensor of the tenth embodiment, refractive indexes of the microlenses 1023 of light-receiving cells 1011 vary depending on the positions of the respective light-receiving cells 1011. Specifically, the refractive indexes of the microlenses 1023 of the light-receiving cells 1011 positioned in the peripheries B and C to which light enters diagonally are greater than the refractive index of the microlens 1023 of the light-receiving cell 1011 positioned in the center A.

Figure 21:
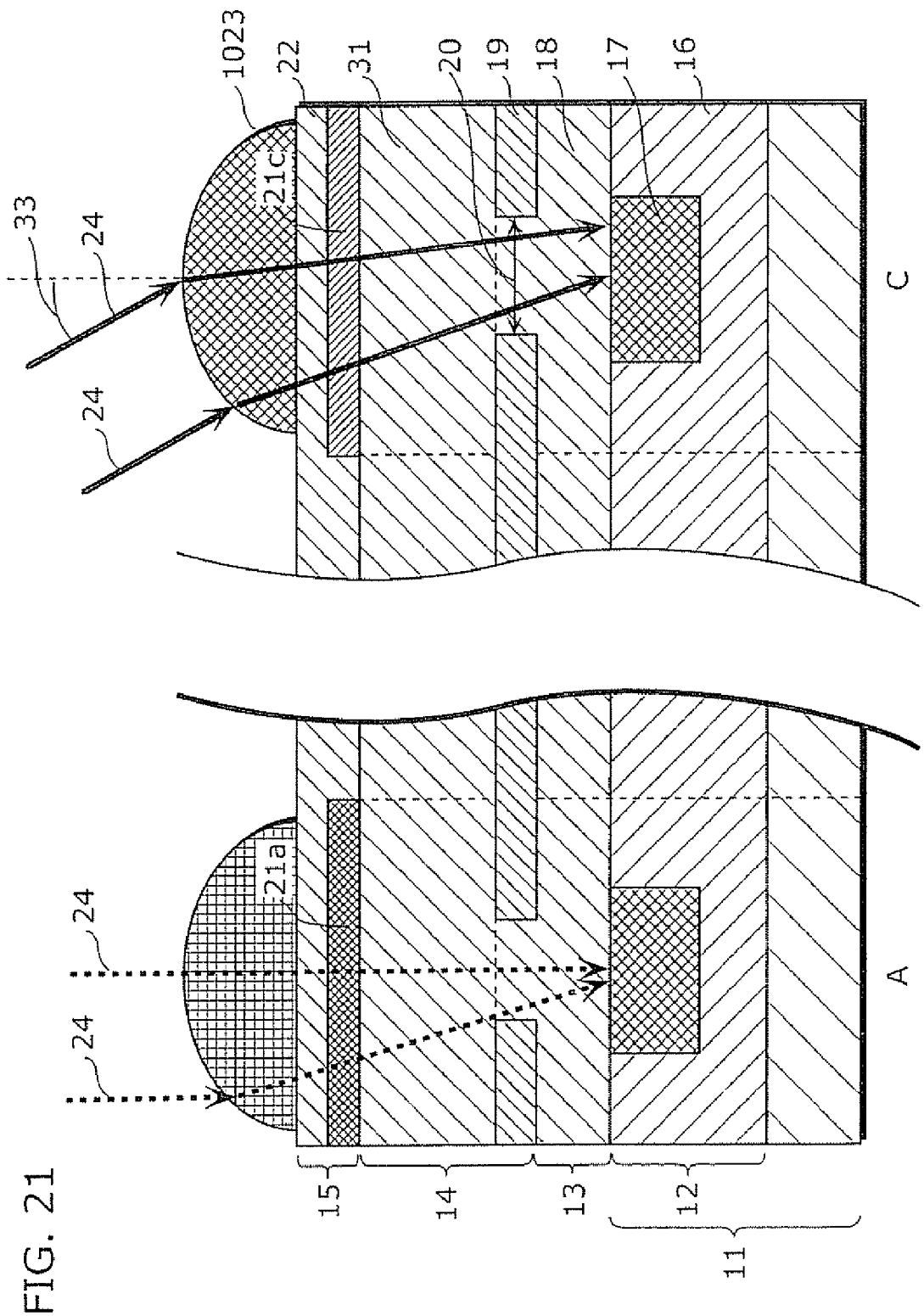
FIG. 21 is a cross-section diagram of the light-receiving cells (light-receiving cells positioned in the center A and the periphery C) in the solid-state image sensor according to the tenth embodiment of the present invention.

FIG. 21 is a cross-section diagram of the light-receiving cells (light-receiving cells positioned in the center A and the periphery C) in the solid-state image sensor according to the tenth embodiment of the present invention.

Each light-receiving cell includes a semiconductor substrate 11, a photoelectric conversion layer 12, an insulating layer 13, a metal layer 14 and a color filter layer 15 that are configured as in the conventional light-receiving cell shown in FIG. 5.

The solid-state image sensor of the tenth embodiment has a configuration in which refractive indexes of a material which composes microlenses 1023 formed on the color filter layer 15 vary depending on an incident angle of light.

Here, the finer the light-receiving cells are, the narrower the widths of the apertures 20 become. For example, when the width of an aperture 20 is 1 μm or narrower, it is difficult to condense light into the aperture 20. In particular, it is well known that the light is difficult to be condensed when the incident angle 33 of light entering the photoelectric conversion unit 17 is large. In order to overcome the problem, in the solid-state image sensor of the tenth embodiment, the greater the incident angle 33 is the higher the refractive index of microlens 1023 of a light-receiving cell becomes. For example, silicon oxide having a refractive index of 1.5 is used for the microlens 1023 of the light-receiving cell positioned in the center A to which light enters at the incident angle 33 of 0 degree, and silicon nitride having a refractive index of 2.0 is used for the microlens 1023 of the light-receiving cell placed in the periphery C to which light enters at the incident angle 33 of 30 degrees. Consequently, the configuration in which the refractive indexes are set to be higher as greater the incident angles 33. Accordingly, the light-condensing efficiency by a light receiving cell to which light enters at a large incident angle 33 can be improved and the sensitivity of that light receiving cell can be increased.

Eleventh Embodiment

Figure 22:
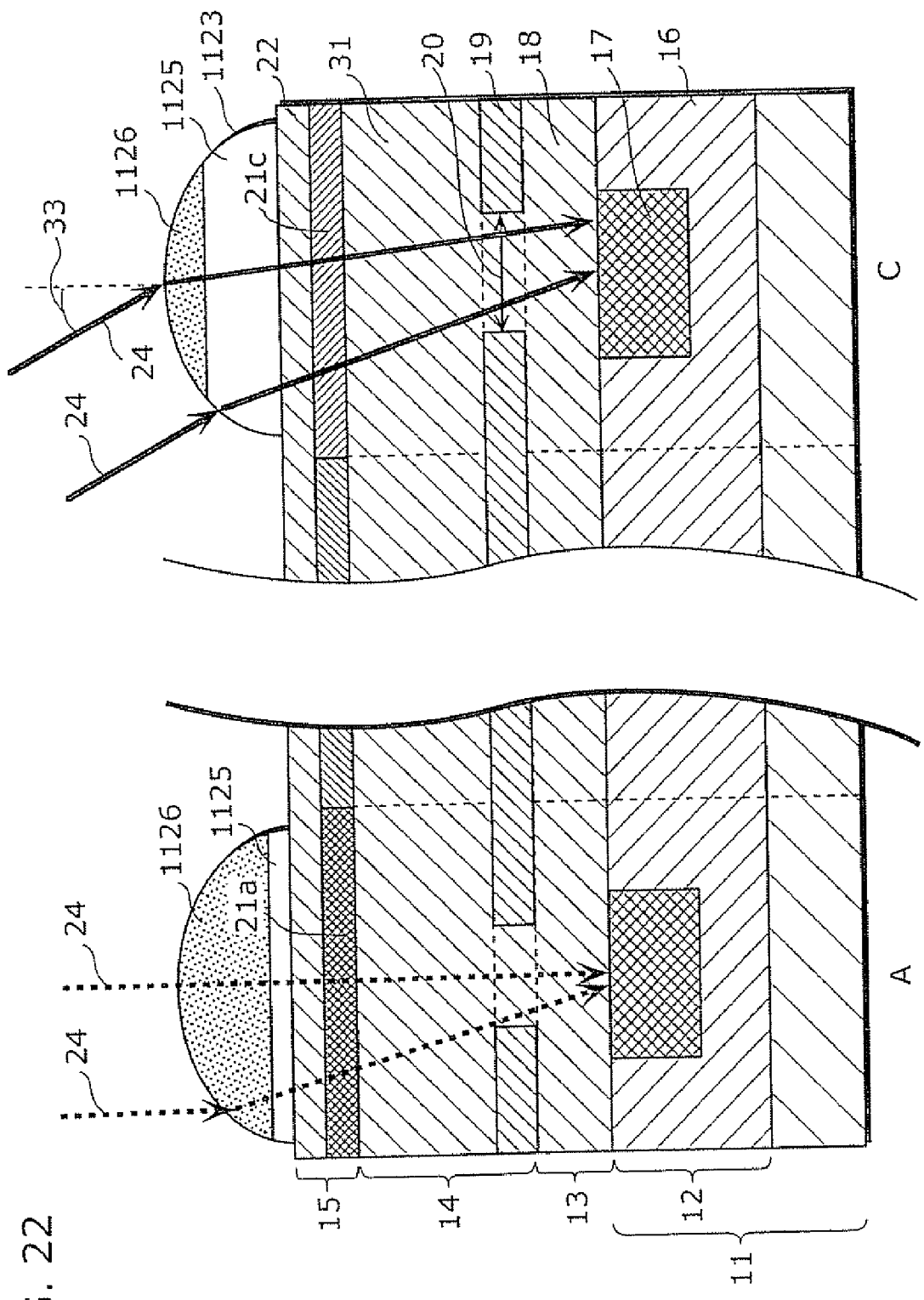
FIG. 22 is a cross-section diagram of the light-receiving cells (light-receiving cells positioned in the center A and the periphery C) in the solid-state image sensor according to the eleventh embodiment of the present invention.

FIG. 22 is a cross-section diagram of the light-receiving cells (light-receiving cells positioned in the center A and the periphery C) in the solid-state image sensor according to the eleventh embodiment of the present invention.

Each light-receiving cell includes a semiconductor substrate 11, a photoelectric conversion layer 12, an insulating layer 13, a metal layer 14 and a color filter 15 that are structured as in the conventional light-receiving cell shown in FIG. 5.

The solid-state image sensor of the eleventh embodiment has a structure in which a microlense 1123 of each light-receiving cell is made of two materials of a low refractive index material 1126 (e.g. silicon oxide having a refractive index of 1.5) and a high refractive index material 1125 (e.g. silicon nitride having a refractive index of 2.0) having a refractive index higher than that of the low refractive index material 1126.

In this solid-state image sensor, a volume ratio between the low refractive index material 1126 and the high refractive index material 1125 in the microlens 1123 differs depending on an incident angle 33 of light entering each light-receiving cell. In other words, in a light-receiving cell to which light enters at a larger incident angle 33, the composition ratio between the low refractive index material 1126 and the high refractive index material 1125 in the microlens 1123 is changed so that the volume ratio of the high refractive index material is increased. For example, the volume ratio between the low refractive index material 1126 and the high refractive index material 1125 is set to 9:1 in the microlens 1123 of the light-receiving cell (the light-receiving cell positioned in the center A) to which light enters at an incident angle of 0 degree, and the volume ratio between the low refractive index material 1126 and the high refractive index material 1125 is set to 1:9 in the microlens 1123 of the light receiving cell (the light-receiving cell positioned in the periphery C) to which light enters at an incident angle 33 of 30 degrees. Accordingly, an average refractive index of the microlens 1123 in a light-receiving cell to which light enters at a large incident angle can be set greater than an average refractive index of the microlens 1123 in a light-receiving cell to which light enters at a small incident angle 33. Consequently, the light condensing efficiency of a light-receiving cell to which light enters at a large incident angle 33 which is difficult to be condensed can be increased, and the sensitivity in that light-receiving cell can be improved.

Twelfth Embodiment

FIG. 23 is a cross-section diagram of the light-receiving cells (light-receiving cells positioned in the center A and the periphery C) in a solid-state image sensor according to the twelfth embodiment of the present invention.

Each light-receiving cell includes a semiconductor substrate 11, a photoelectric conversion layer 12, an insulating layer 13, a metal layer 14 and a color filter 15 that are configured as in the conventional light-receiving cell shown in FIG. 5.

The solid-state image sensor of the twelfth embodiment has a metal layer 1214 formed under the color filter 15 of each light-receiving cell. The metal layer 1214 has a light-blocking film 19 having an aperture 20, interlayer films 31 and 1232, and a high refractive index interlayer film 1227.

This solid-state image sensor has a configuration in which refractive indexes of the high refractive index interlayer films 1227 are varied by the light-receiving cells when incident angles 33 of light entering the respective light-receiving cells are different. Specifically, the larger the incident angle 33 of light entering a light-receiving cell is the higher the refractive index of the high-refractive index interlayer film 1227. For example, silicon oxide film having a refractive index of 1.5 is used for the high refractive index interlayer film 1227 of a light-receiving cell to which light enters at an incident angle 33 of 0 degree, and silicon nitride film having a refractive index of 2.0 is used for the high refractive index interlayer film 1227 of a light-receiving cell to which light enters at an incident angle 33 of 30 degrees. Consequently, the configuration in which the greater the incident angle 33 of light is the higher the refractive index of the high refractive interlayer film 1227 becomes is realized.

With the aforementioned configuration, the refractive index of the high refractive index interlayer film 1227 of a light-receiving cell to which light enters at a large incident angle 33 is higher than the refractive index of the high refractive index interlayer film 1227 of a light-receiving cell to which light enters at a small incident angle 33. Therefore, the sensitivity of the light-receiving cell to which light enters at a large incident angle 33 can be significantly increased.

It should be noted that, in the solid-state image sensor of the twelfth embodiment, the high refractive index interlayer films 1227 are positioned below the color filters. However, similar effect can be obtained even in the case where the high refractive index interlayer films 1227 are positioned above the respective color filters.

Furthermore, in the solid-state image sensor of the twelfth embodiment, the high refractive index interlayer films 1227 are positioned above the light-blocking film 19. However, similar effect can be obtained even in the case where the high refractive index interlayer films 1227 are positioned below the light-blocking film 19

Thirteenth Embodiment

Figure 24:
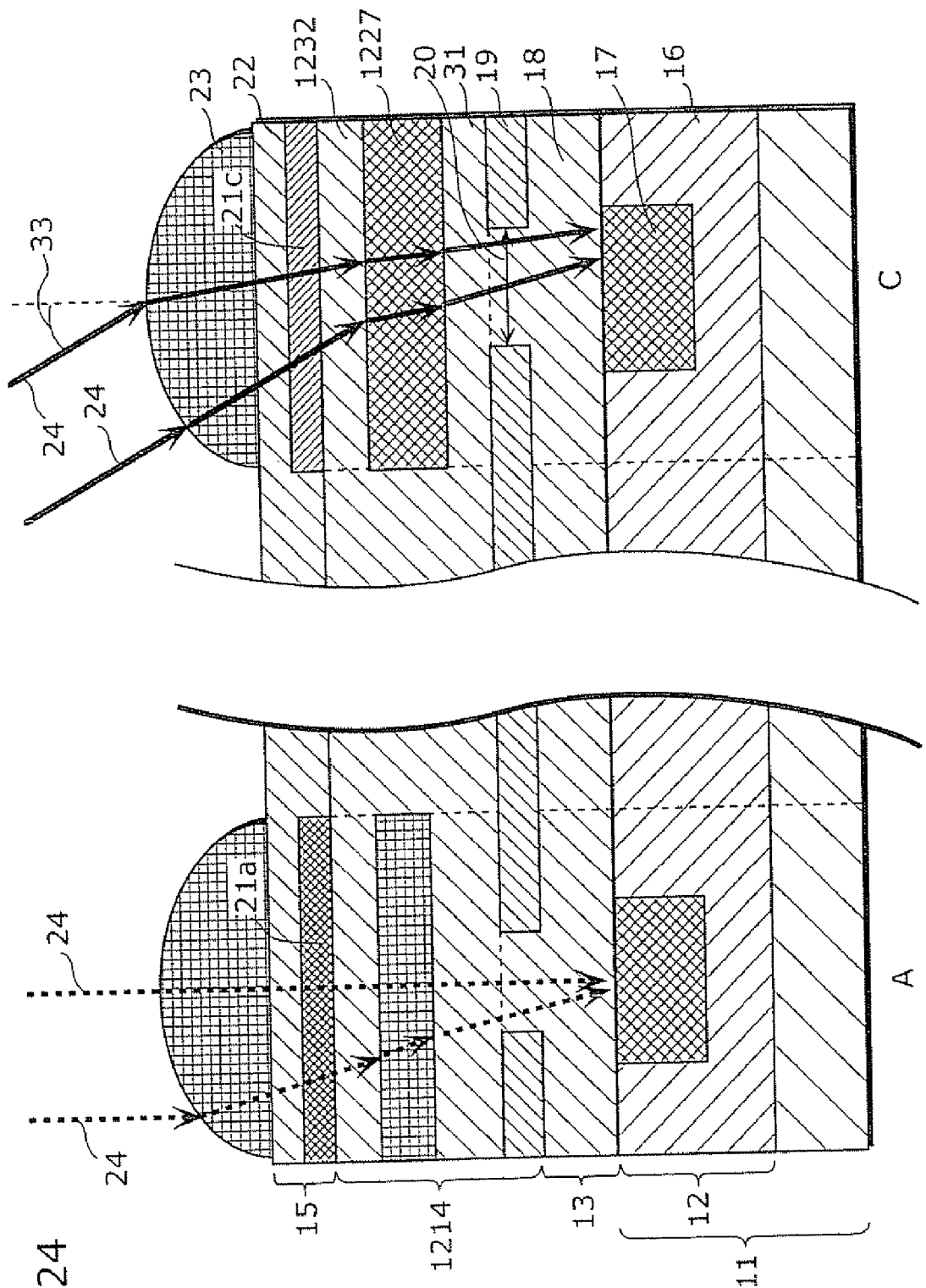
FIG. 24 is a cross-section diagram of the light-receiving cells (light-receiving cells positioned in the center A and the periphery C) in the solid-state image sensor according to the thirteenth embodiment of the present invention.

FIG. 24 is a cross-section diagram of light-receiving cells (light-receiving cells positioned in the center A and the periphery C) in the solid-state image sensor according to the thirteenth embodiment of the present invention.

The solid-state image sensor of the thirteenth embodiment is different from the solid-state image sensor of the twelfth embodiment in that thicknesses of high refractive index interlayer films 1227 varies by the light-receiving cells.

This solid-state image sensor has a configuration in which thicknesses of the high refractive index interlayer films 1227 are varied by the light-receiving cells when incident angles 33 of light entering the respective light-receiving cells are different. Specifically, the larger the incident angle 33 of light entering a light-receiving cell is, the thicker the thickness of the high-refractive index interlayer film 1227 becomes. For example, the thickness of the high refractive index interlayer film 1227 of a light-receiving cell to which light enters at an incident angle 33 of 0 degree is set to 300 nm, and the thickness of the high refractive index interlayer film 1227 of a light-receiving cell to which light enters at an incident angle 33 of 30 degrees is set to 500 nm. Consequently, the configuration in which the greater the incident angle 33 of light entering a respective light-receiving cell is the thicker the thickness of the high refractive interlayer film 1227 becomes is realized.

With the aforementioned configuration, the thickness of the high refractive index interlayer film 1227 of a light-receiving cell to which light enters at a large incident angle 33 is thicker than the thickness of the high refractive index interlayer film 1227 of a light-receiving cell to which light enters at a small incident angle 33. Therefore, the sensitivity of the light-receiving cell to which light enters at a large incident angle 33 can be significantly increased.

It should be noted that, in the solid-state image sensor of the thirteenth embodiment, in the case where incident angles 33 of light entering light-receiving cells vary by the light-receiving cells, the larger the incident angle 33 of light entering a light-receiving cell is, the greater the high-refractive index interlayer film 1227 and the refractive index become. However, similar effect can be obtained even in the case where only the thicknesses of the high refractive index interlayer films 1227 are varied by the light-receiving cells and the refractive indexes are kept to be the same value.

It should be noted that, in the solid-state image sensor of the thirteenth embodiment, the high refractive index interlayer films 1227 are positioned below the color filters. However, similar effect can be obtained even in the case where the high refractive index interlayer films 1227 are positioned above the color filters.

Furthermore, in the solid-state image sensor of the thirteenth embodiment, the high refractive index interlayer films 1227 are positioned above the light-blocking film 19. However, similar effect can be obtained even in the case where the high refractive index interlayer films 1227 are positioned below the light-blocking film 19.

Fourteenth Embodiment

Figure 25:
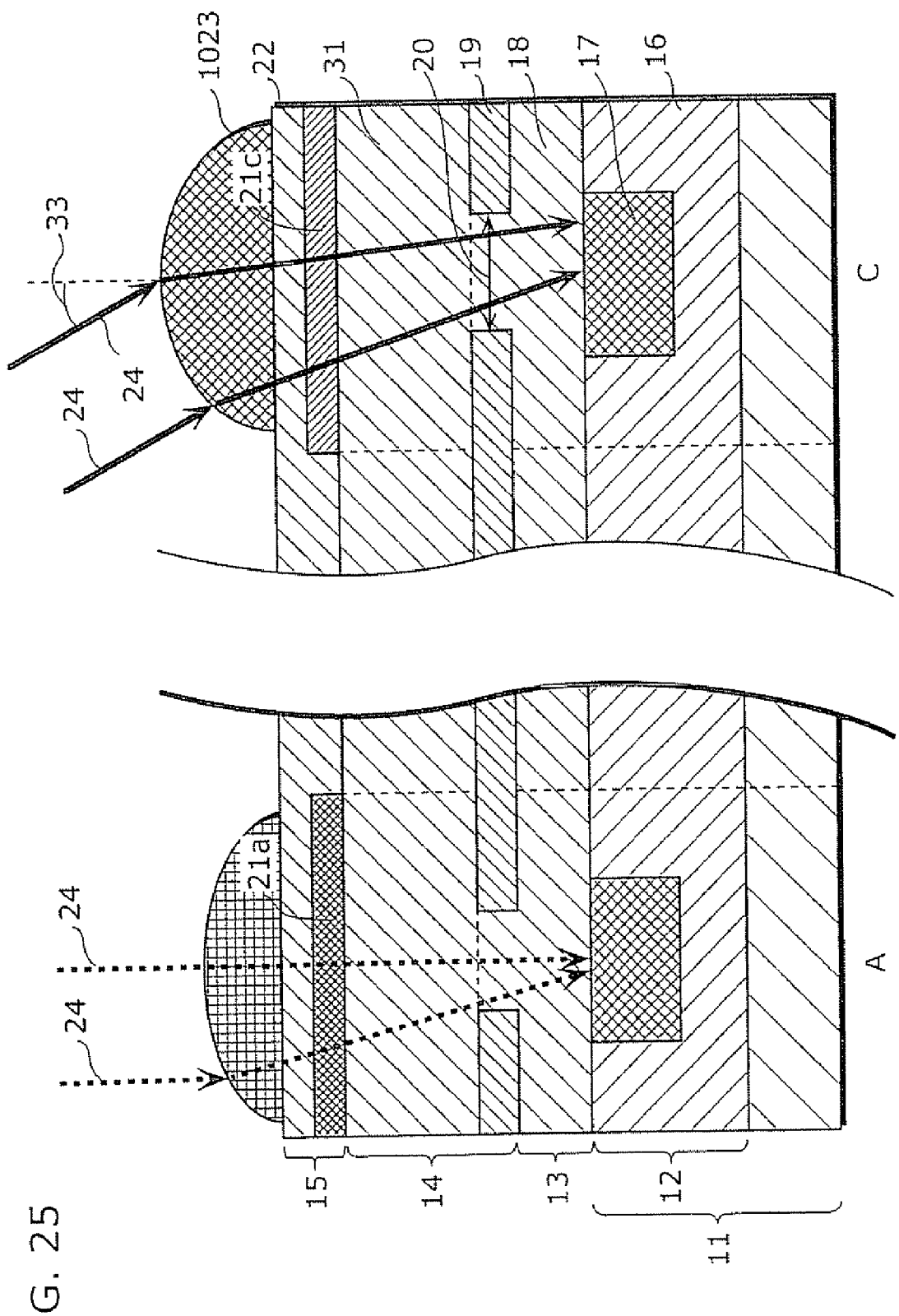
FIG. 25 is a cross-section diagram of the light-receiving cells (light-receiving cells positioned in the center A and the periphery C) in the solid-state image sensor according to the fourteenth embodiment of the present invention.

FIG. 25 is a cross-section diagram of light-receiving cells (light-receiving cells positioned in the center A and the periphery C) in the solid-state image sensor according to the fourteenth embodiment of the present invention.

The solid-state image sensor of the fourteenth embodiment is different from the solid-state image sensor of the tenth embodiment in that the heights of the microlenses 1023 vary by the light-receiving cells.

The solid-state image sensor of the fourteenth embodiment has a structure in which heights of the microlenses 1023 are varied by the light-receiving cells when incident angles 33 of light entering respective light-receiving cells are different. Here, the larger the incident angle 33 of light is, the higher the height of the microlens 1023 becomes. For example, the height of a microlens 1023 of a light-receiving cell to which light enters at an incident angle 33 of 0 degree is set to 1.0 μm, and the height of a microlens 1023 of a light-receiving cell to which light enters at an incident angle 33 of 30 degrees is set to 1.2 μm. Thus, the configuration in which the larger the incident angle 33 of light is the higher the height of the microlens 1023 becomes is realized.

With the aforementioned configuration, the height of the microlens 1023 of a light-receiving cell to which light enters at a large incident angle 33 is higher than the height of the microlens 1023 of a light-receiving cell to which light enters at a small incident angle 33. Therefore, the sensitivity of the light-receiving cell to which light enters at a large incident angle 33 can be significantly increased.

It should be noted that, in the solid-state image sensor of the fourteenth embodiment, the larger the incident angle 33 of light entering a light-receiving cell is the greater the height of microlens 1023 and the refractive index become. However, similar effect can be obtained even in the case where only the heights of the microlenses 1023 are varied by the light-receiving cells and the refractive indexes are kept to be the same value.

Fifteenth Embodiment

Figure 26:
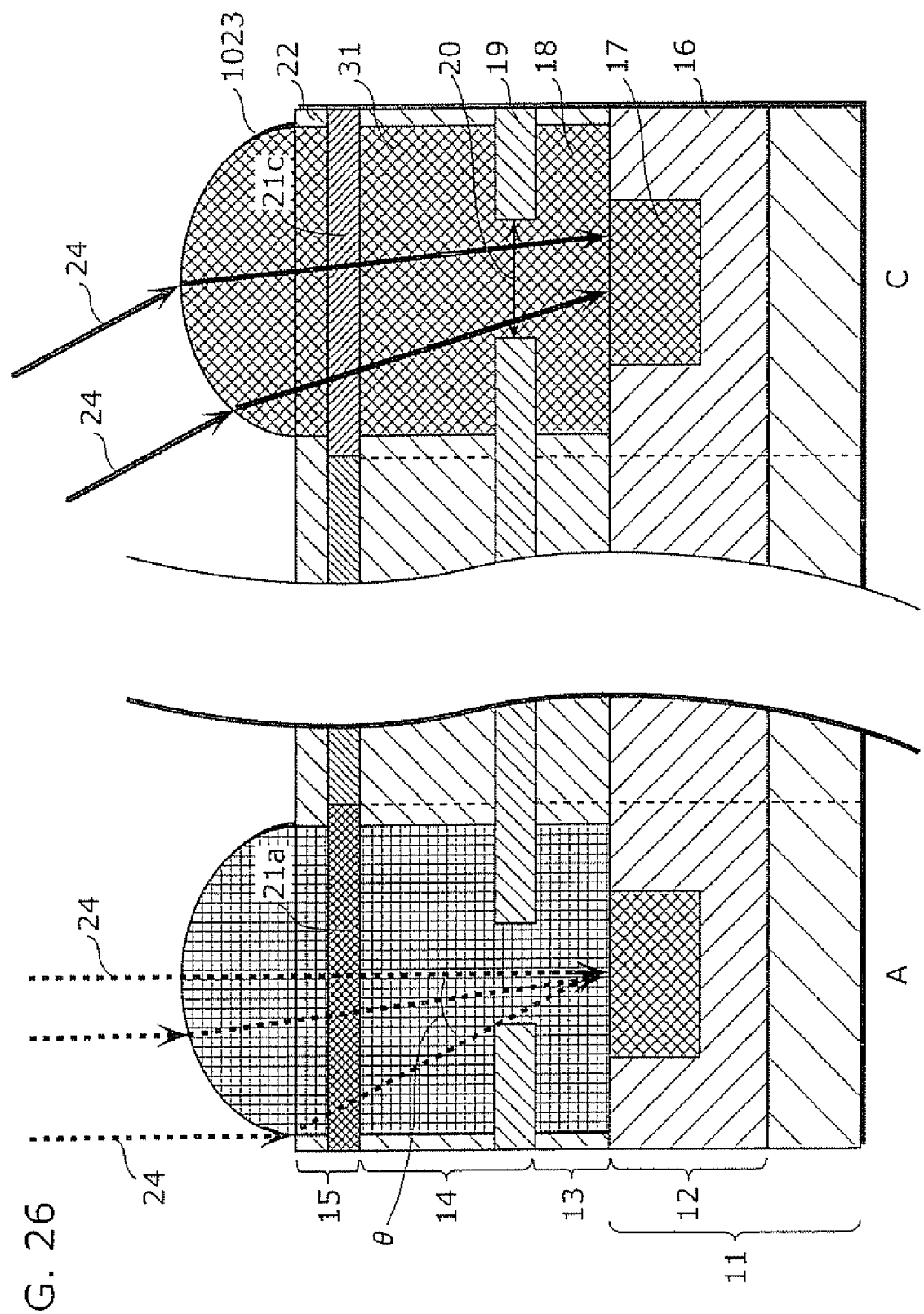
FIG. 26 is a cross-section diagram of the light-receiving cells (light-receiving cells positioned in the center A and the periphery C) in the solid-state image sensor according to the fifteenth embodiment of the present invention.

FIG. 26 is a cross-section diagram of light-receiving cells (light-receiving cells positioned in the center A and the periphery C) in the solid-state image sensor according to the fifteenth embodiment of the present invention.

The solid-state image sensor of the fifteenth embodiment is different from the solid-state image sensor of the tenth embodiment in that refractive indexes of the insulating layer 13, an insulating layer in the metal film 14 and the microlens 1023 have the same value in the light-receiving cells to which light enters at a same incident angle. For example, the insulating layer 13, the insulating layer in the metal layer 14 and the microlens 1023 are made of a single material having a refractive index so that their refractive indexes have the same value in the light-receiving cells to which light enters at the same incident angle. Consequently, the manufacturing costs can be lowered.

It should be noted that light-condensing efficiency of each microlens 1023 can be described by the following expression (Formula 2).

$$s = k \times \lambda / NA \quad (NA = n \cdot \sin \theta) \qquad [\text{Formula 2}]$$

s: a spread diameter of a spot on which light focuses
k: a coefficient determined by an image formation condition
$\lambda$: a wavelength
n: a refractive index of a medium positioned below a microlens
$\theta$: an aperture angle of the microlens ($\theta$ shown in FIG. 26)

When the sport diameters s to which light focuses are the same among light-receiving cells, it is difficult for the light to enter the aperture in the photoelectric conversion unit to which light enters at a greater incident angle. Herein, with the expression (Formula 2), the spread diameter s of a spot can be decreased as the refractive index n is increased. Accordingly, light can be allowed to enter the photoelectric conversion unit by increasing the refractive index n even in the case of a photoelectric conversion unit to which light enters at a large incident angle.

Sixteenth Embodiment

Figure 6:
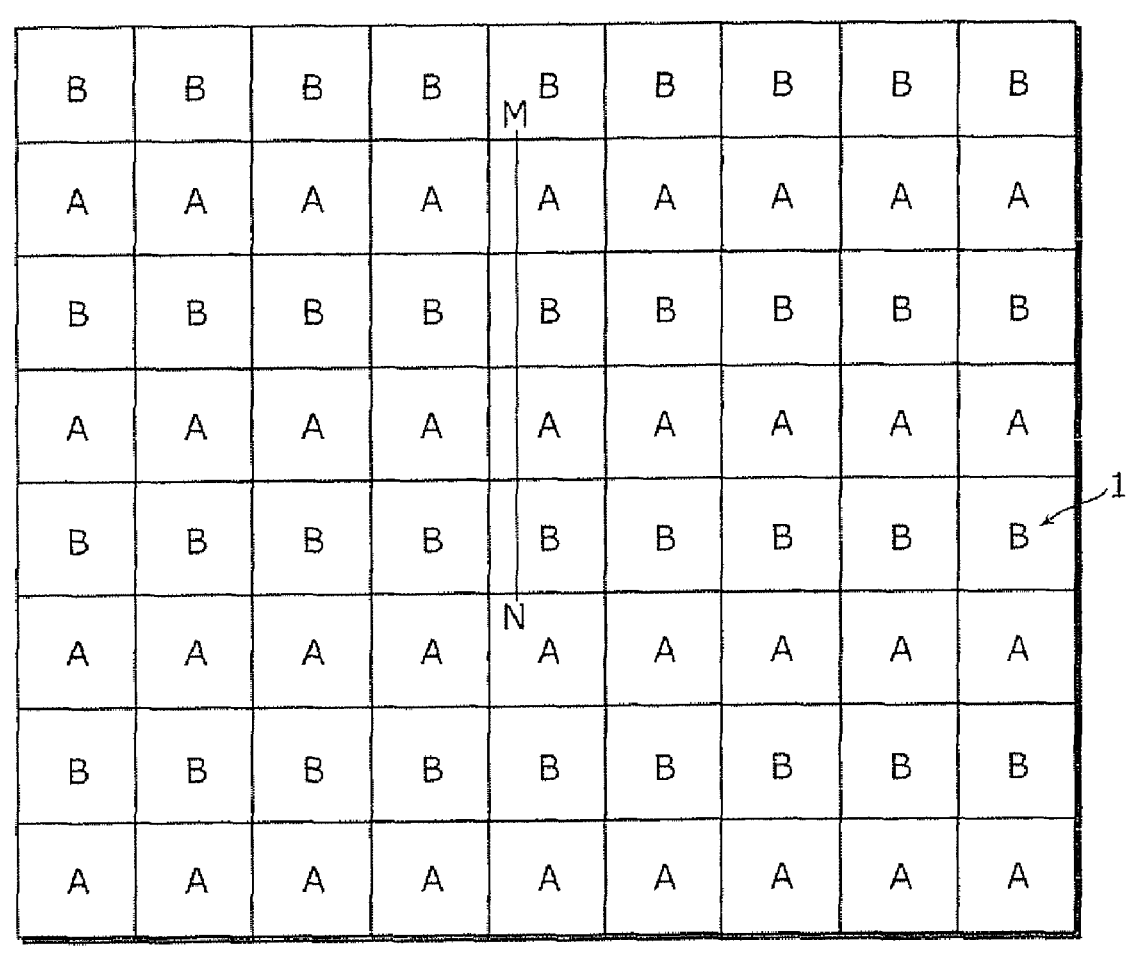
Figure 7:
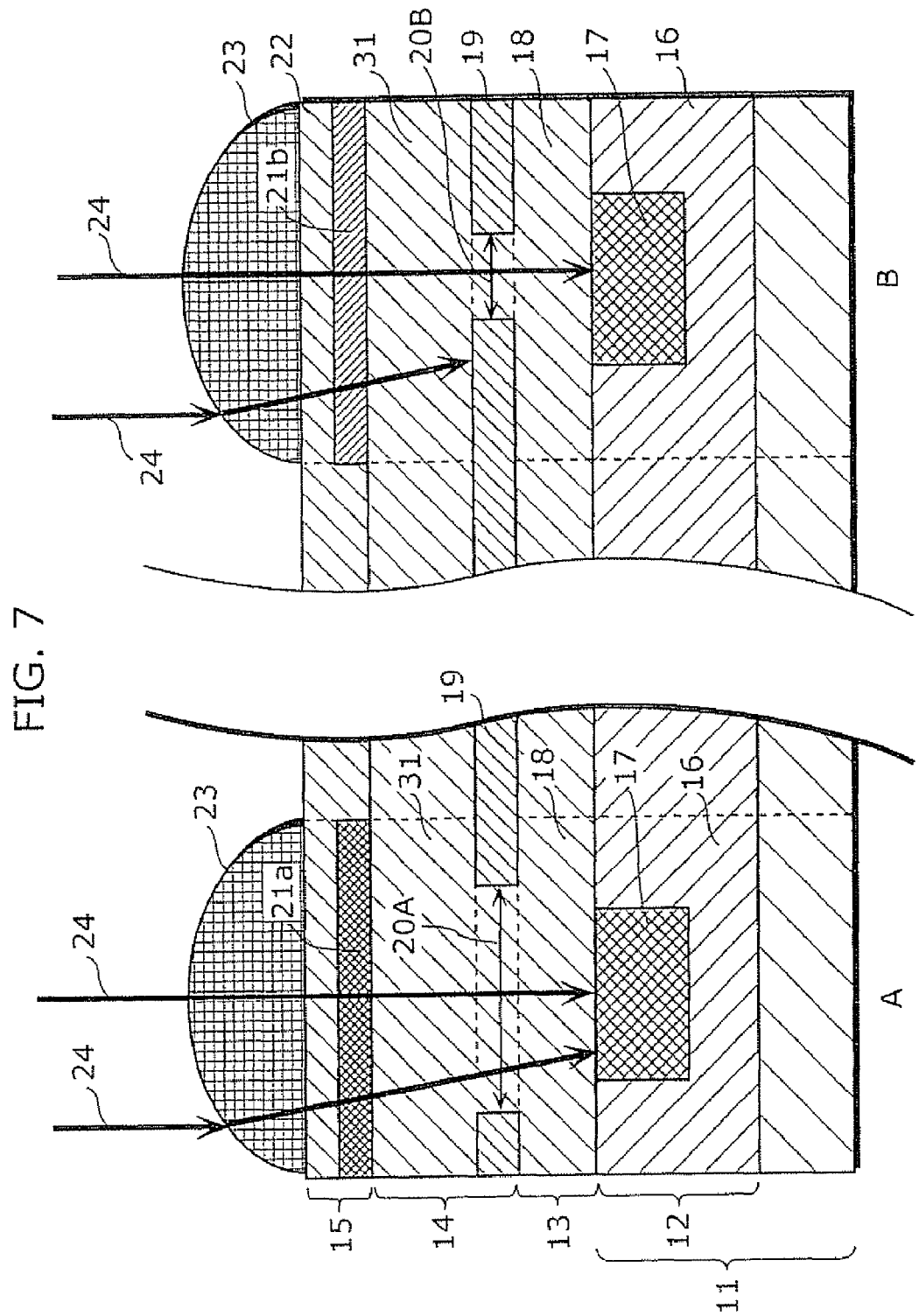
FIG. 7 is a cross-section diagram of light-receiving sells A and B in the conventional solid-state image sensor characterized in the wide dynamic range.
Figure 27:
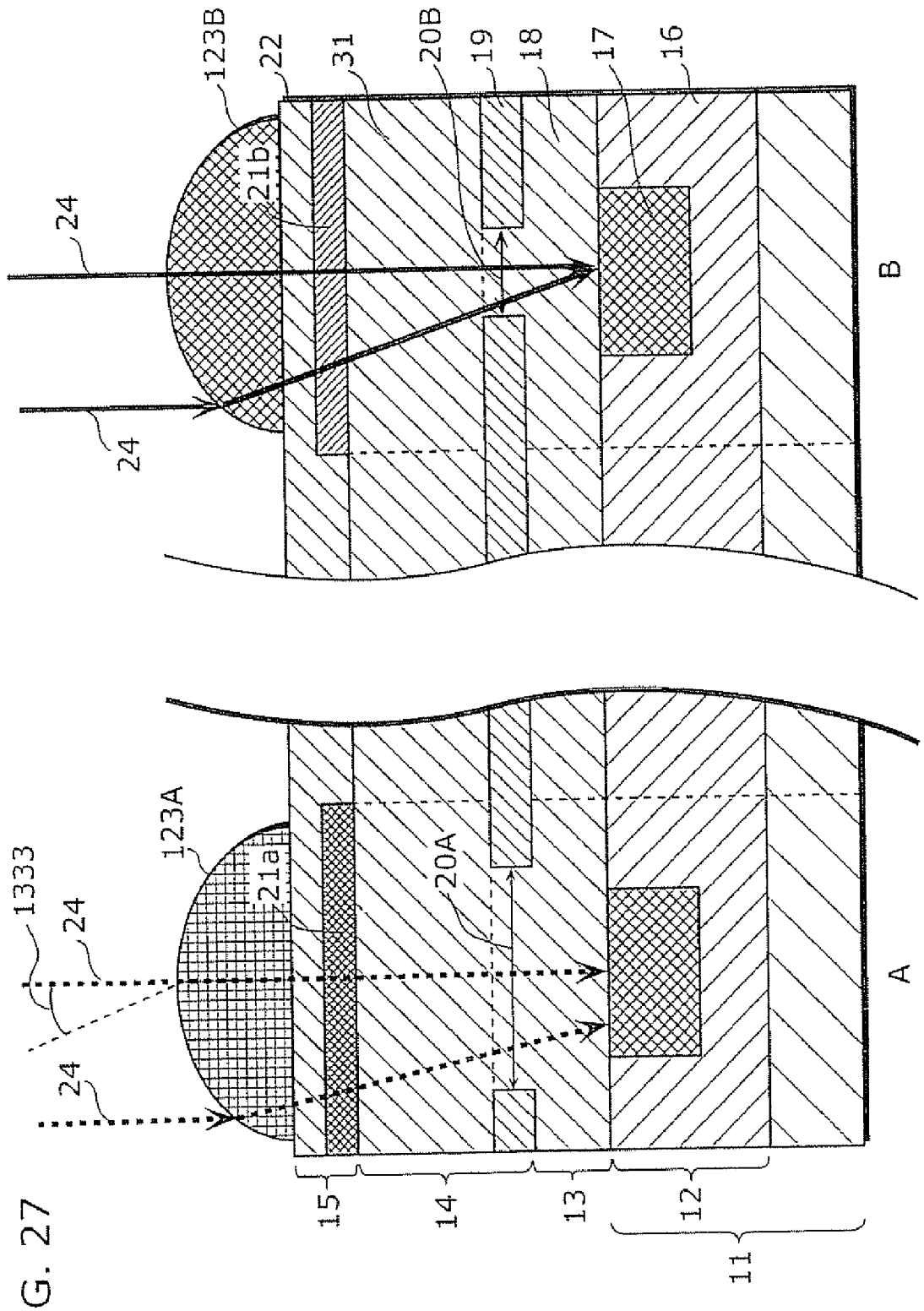
FIG. 27 is a cross-section diagram of light-receiving cells A and B in a solid-state image sensor according to the sixteenth embodiment.

FIG. 27 is a cross-section diagram of light-receiving cells (light-receiving cells A and B in FIG. 6) in the solid-state image sensor according to the sixteenth embodiment of the present invention. Each light-receiving cell includes a substrate 11 having a photoelectric conversion layer 12, an insulating layer 13, a metal layer 14 and a color filter layer 15 that are configured as in the conventional solid-state image sensor shown in FIG. 7.

The sixteenth embodiment is characterized in that, refractive indexes of the microlenses 123A and 123B formed on the color filter layer 15 are different from each other in the case where aperture widths are varied by the light-receiving cells 1. In the case where a wide dynamic range is realized in a solid-state image sensor in which aperture widths are varied, a refractive index of the microlenses 123B formed on the light-receiving cell B having a small aperture width is set to be higher than the refractive index of the microlenses 123A formed on the light-receiving cell A having a large aperture width in order to optimize the light condensing efficiencies in said light-receiving cell B and said light-receiving cell A at the same time. For example, silicon oxide having a refractive index of 1.5 is used for the microlens 123A of the light-receiving cell A in which the width of aperture 20A is 2.5 μm, and silicon nitride having a refractive index of 2.0 is used for the microlens 123B of the light-receiving cell B in which the width of aperture 20B is 0.7 μm.

Accordingly, the light condensing efficiencies in the light-receiving cell B having a small aperture width and the light-receiving cell A having a large aperture width can be optimized at the same time. Therefore, the sensitivity of the light-receiving cells which include light-receiving cells having a small aperture width and light-receiving cells having a large aperture width can be significantly increased. Additionally, when the refractive index becomes higher for the larger incident angle of incident light, the light condensing efficiency can be more increased and further improvement in sensitivity is achieved.

Seventeenth Embodiment

Figure 28:
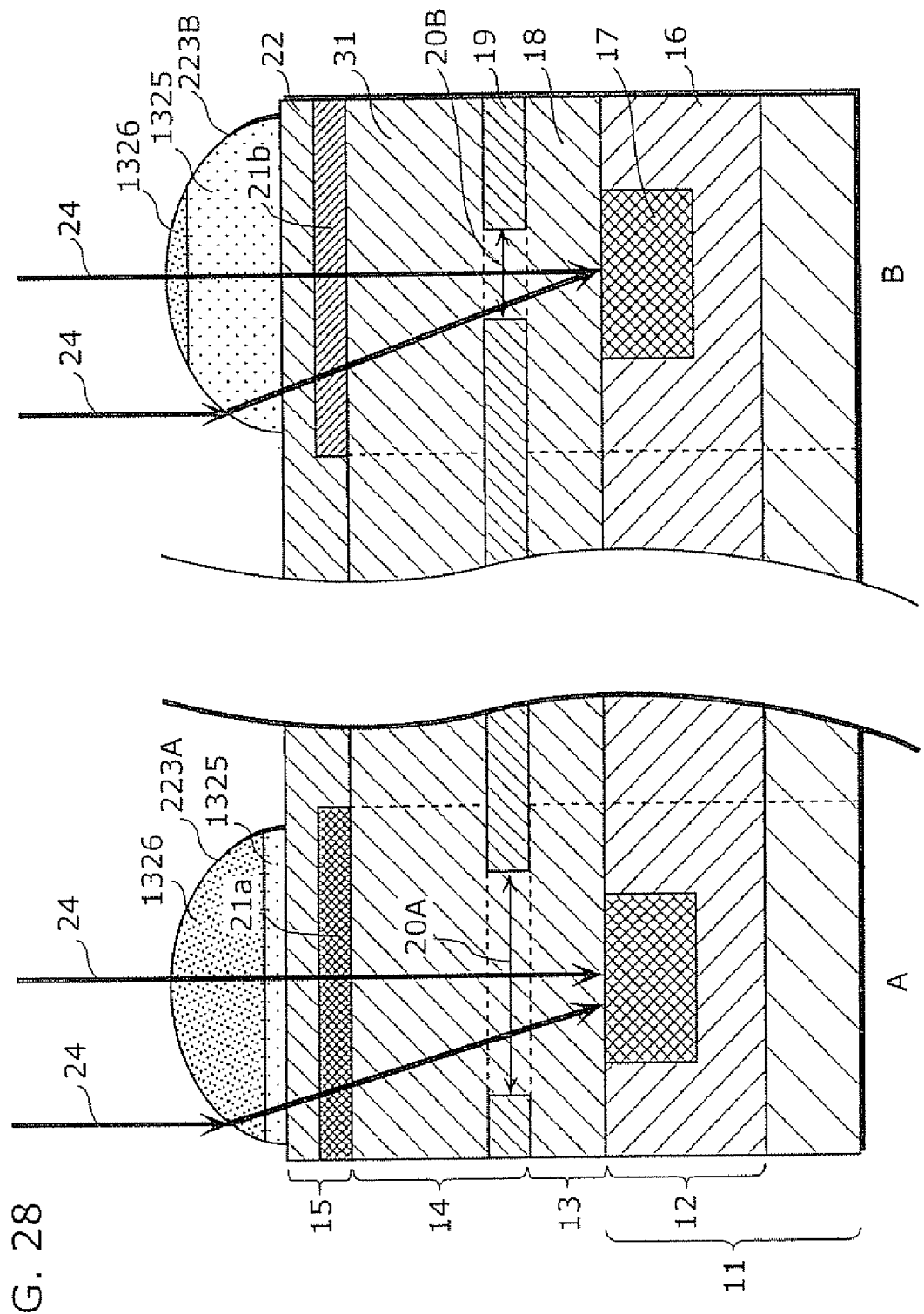
FIG. 28 is a cross-section diagram of light-receiving cells A and B in a solid-state image sensor according to the seventeenth embodiment.

FIG. 28 is a cross-section diagram of light-receiving cells A and B in a solid-state image sensor according to the seventeenth embodiment of the present invention. Each light-receiving cell includes a substrate 11 having a photoelectric conversion layer 12, an insulating layer 13, a metal layer 14 and a color filter layer 15 that are configured as in the conventional solid-state image sensor shown in FIG. 7.

In the seventeenth embodiment, microlenses 223A and 223B of each light-receiving cell is made of two types of materials of low refractive index material 1326 (e.g. silicon oxide having a refractive index of 1.5) and a high refractive index material 1325 (e.g. silicon nitride having a refractive index of 2.0).

In the case where each light-receiving cell 1 has a different aperture width, the composition ratio between the low refractive index material 1326 and the high refractive index material 1325 are changed for the microlens 223A of the light-receiving cell A in which an aperture width is large and for the microlens 223B of the light-receiving cell B in which an aperture width is small so that the light-receiving cell B has a higher volume ratio of the high refractive index material 1325 than that of the light-receiving cell A. For example, it is determined that the volume ratio between the low refractive index material 1326 and the high refractive index material 1325 is 9:1 in the microlens 223A of the light-receiving cell A, and the volume ratio between the low refractive index material 1326 and the high refractive index material 1325 is 1:9 in the microlens 223B of the light-receiving cell B.

Consequently, the light-condensing efficiencies in the light-receiving cell B having a small aperture width and the light-receiving cell A having a large aperture width can be optimized at the same time, so that the sensitivity of light-receiving cells including the light-receiving cells A and B can be significantly improved.

Furthermore, an average refractive index of the microlens 223B for the light which enters at a large incident angle is set to be higher than an average refractive index of the microlens 223A for the light which enters at a small incident angle. Accordingly, each light-receiving cell can obtain the equal light-condensing efficiency despite the incident angle of light entering the light-receiving cell.

Eighteenth Embodiment

Figure 29:
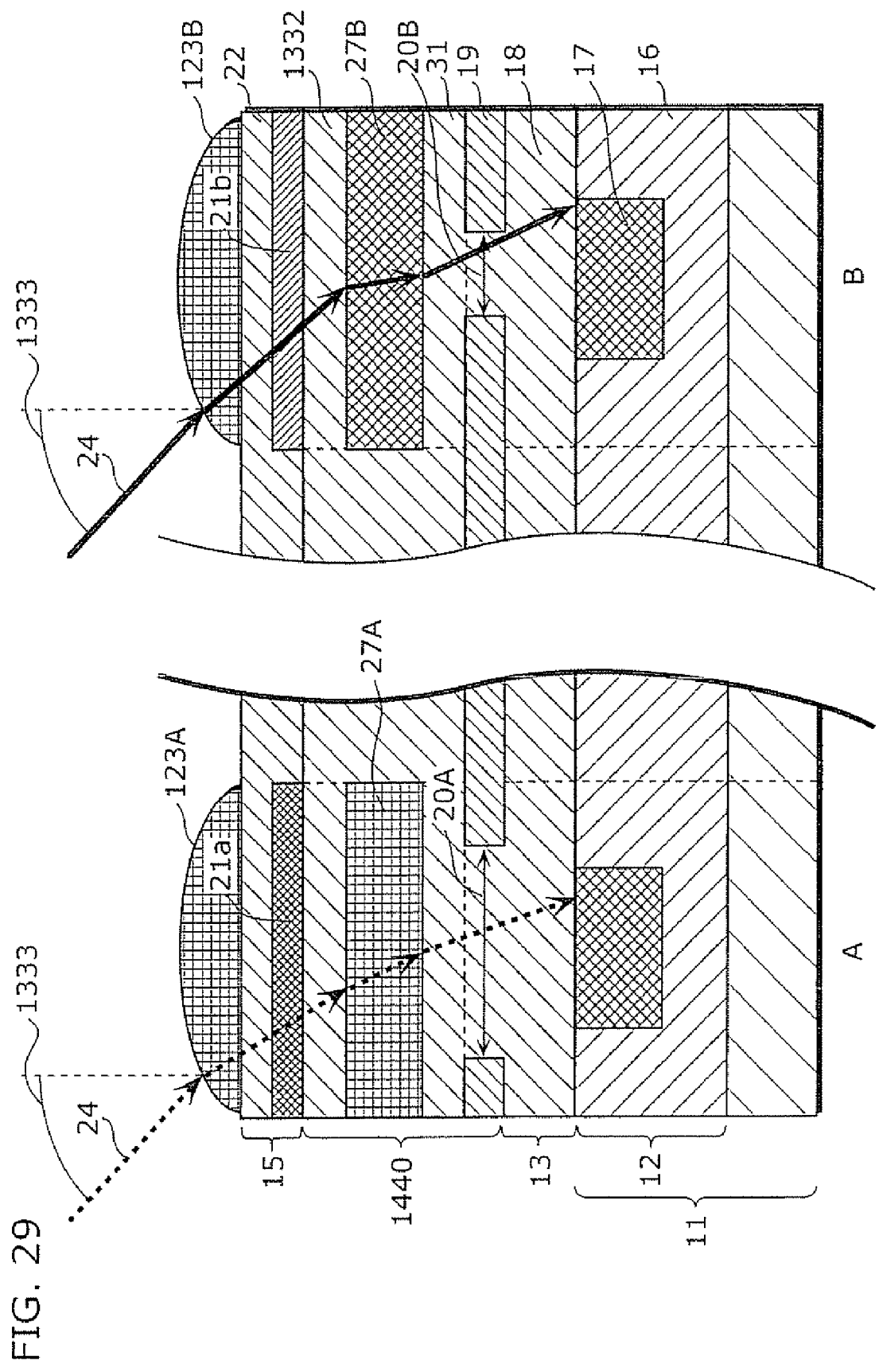
FIG. 29 is a cross-section diagram of light-receiving cells A and B in a solid-state image sensor according to the eighteenth embodiment.

FIG. 29 is a cross-section diagram of light-receiving cells A and B in a solid-state image sensor according to the eighteenth embodiment of the present invention. Each light-receiving cell includes a substrate 11 having a photoelectric conversion layer 12, an insulating layer 13, and a color filter 15 that are structured as in the conventional solid-state image sensor shown in FIG. 7.

In the eighteenth embodiment, high refractive index interlayer films 27A and 28B and the interlayer film 1332 are formed in the metal layer 1440 under the color filter layer 15 in each light-receiving cell 1.

In the case where aperture widths are varied by light-receiving cells 1, refractive indexes of the high refractive index interlayer films 27A and 27B in the light-receiving cells 1 are different. Therefore, the light-receiving cell B having a smaller aperture width has a higher refractive index of the high refractive index interlayer film 27B than the high refractive index interlayer film 27A in the light-receiving cell A having a larger aperture width. For example, silicon oxide having a refractive index of 1.5 is used for the high refractive index interlayer film 27A in the light-receiving cell A having a larger aperture width, and silicon nitride having a refractive index of 2.0 is used for the high refractive index interlayer film 27B in the light-receiving cell B having a smaller aperture width. Furthermore, it is adopted a configuration in which the greater the incident angle 1333 of light is the higher the refractive index becomes.

Consequently, light-condensing efficiencies obtained by the light-receiving cell B and the light-receiving cell A can be optimized at the same time so that sensitivities of the light-receiving cells which have different aperture widths of the light-receiving cells B and A can be significantly improved.

It should be noted that, in the solid-state image sensor of the eighteenth embodiment, the high refractive index interlayer films 27A and 27B are positioned below the color filter layer 15. However, similar effect can be obtained even in the case where the high refractive index interlayer films 27A and 27B are positioned above the color filter layer.

Furthermore, in the solid-state image sensor of the eighteenth embodiment, the high refractive index interlayer films 27A and 27B are positioned above the light-blocking film 19. However, similar effect can be obtained even in the case where the high refractive index interlayer films 27A and 27B are positioned below the light-blocking film 19.

Nineteenth Embodiment

Figure 30:
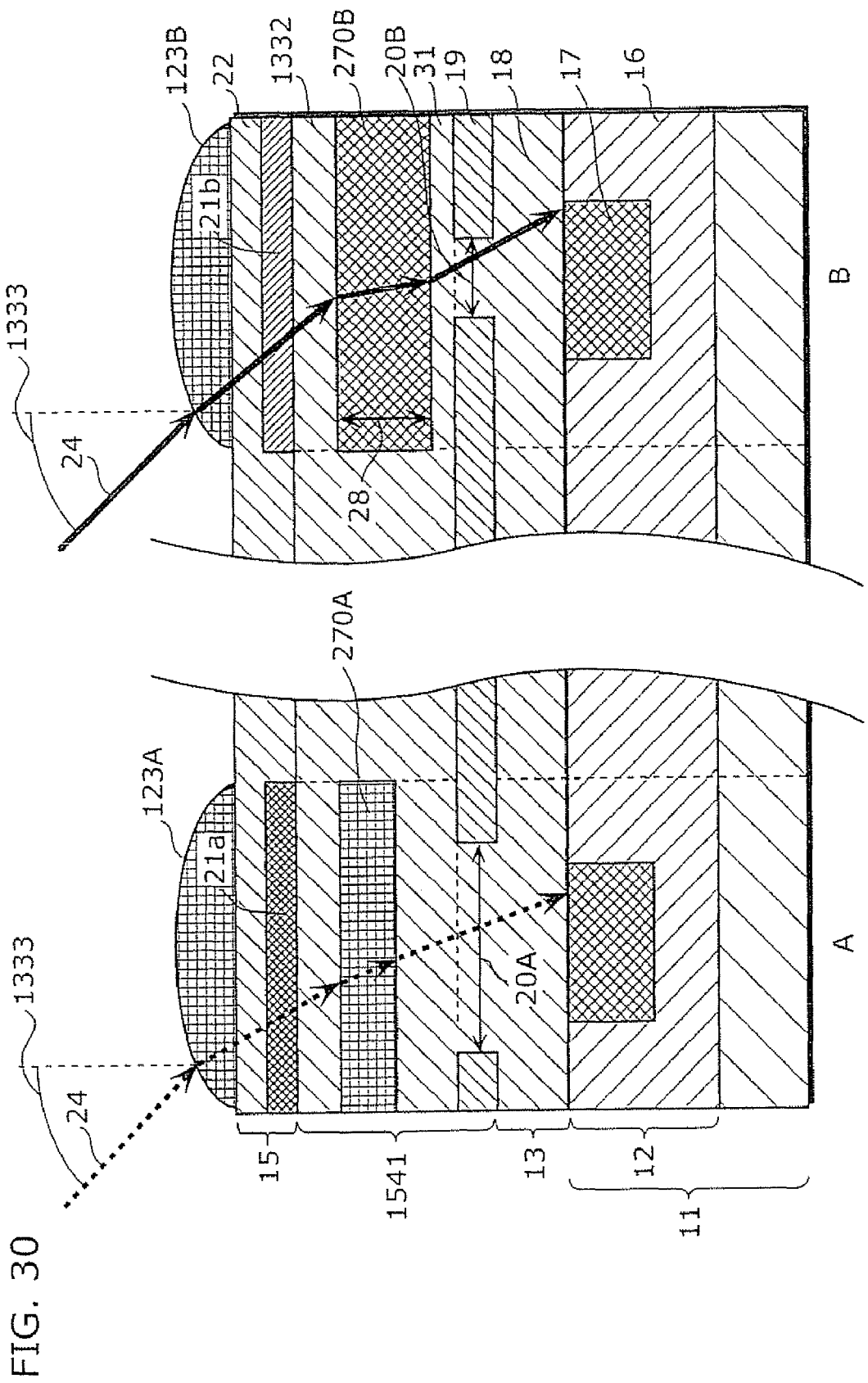
FIG. 30 is a cross-section diagram of light-receiving cells A and B in a solid-state image sensor according to the nineteenth embodiment.

FIG. 30 is a cross-section diagram of light-receiving cells A and B in a solid-state image sensor according to the nineteenth embodiment of the present invention. The solid-state image sensor of the nineteenth embodiment is different from that of the eighteenth embodiment in that the thicknesses of the high refractive index interlayer films 270A and 270B that are formed in the metal layer 1541 under the color filter layer are varied by the light-receiving cells.

In the case where aperture widths are varied by the light-receiving cells 1, thickness of the high refractive index interlayer films 270A and 270B above the light-receiving cells 1 are different. Therefore, in the light-receiving cell B having a smaller aperture width, the thickness of the high refractive index interlayer film 270B is thicker than the thickness of the high refractive index interlayer film 270A in the light-receiving cell A having a larger aperture width. For example, thickness of the high refractive index interlayer film 270A in the light-receiving cell A having a large aperture width is set to 300 nm, and thickness of the high refractive index interlayer film 270B in the light-receiving cell B having a small 20 aperture width is set to 500 nm. Furthermore, it is adopted a structure in which the larger the incident angles 1333 of light, the thicker the thicknesses of high refractive index interlayer films 270A and 270B.

Consequently, light-condensing efficiencies obtained by the light-receiving cell B and the light-receiving cell A can be optimized at the same time so that sensitivities of the light-receiving cells which have different aperture widths of the light-receiving cells A and B can be significantly improved.

In the nineteenth embodiment, in the case where incident angles of light are different, the larger the incident angles 1333 are, the greater the thicknesses and refractive indexes of the high refractive index interlayer films 270A and 270B become. However, similar effect can be obtained even in the case where only the thicknesses of the high refractive index interlayer films 270A and 270B are changed and the refractive indexes are kept to be the same value among the high refractive index interlayer films 270 A and 270B.

Furthermore, whereas the high refractive index interlayer films 270A and 270B are formed under the color filter layer 15 in the nineteenth embodiment, the high refractive index interlayer films 270A and 270B may be formed on the color filter layer 15.

In addition, in the nineteenth embodiment, it is described that the high refractive index interlayer films 270A and 270B are formed above the light-blocking film 19. However, similar effect can be obtained even in the case where the high refractive index interlayer films 270A and 270B are formed below the light-blocking film 19.

Twentieth Embodiment

Figure 31:
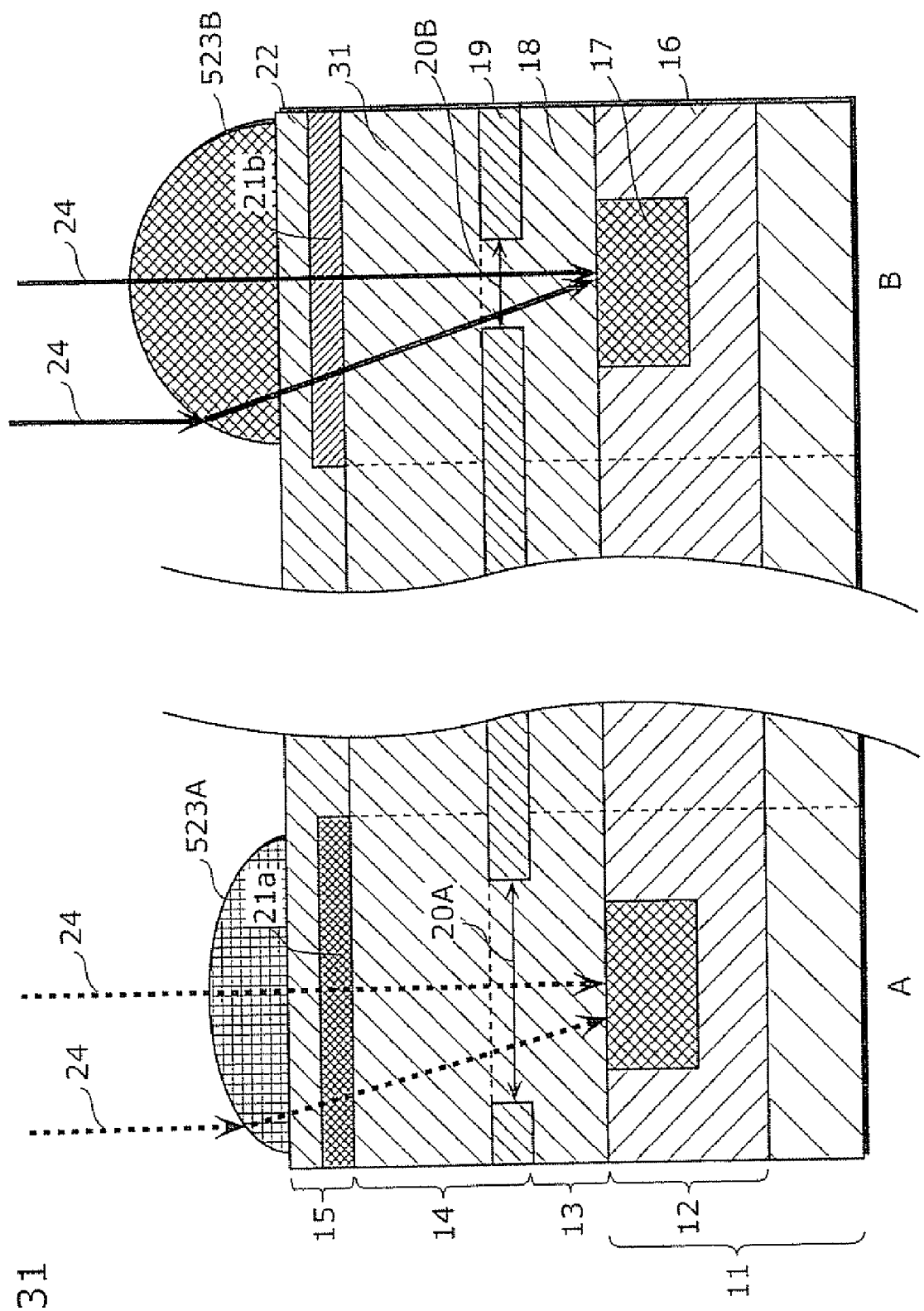
FIG. 31 is a cross-section diagram of light-receiving cells A and B in a solid-state image sensor according to the twentieth embodiment.

FIG. 31 is a cross-section diagram showing light-receiving cells A and B in a solid-state image sensor according to the twentieth embodiment of the present invention. Each light-receiving cell includes a substrate 11 having a photoelectric conversion layer 12, an insulating layer 13, a metal layer 14 and a color filter layer 15 that are configured as in the conventional solid-state image sensor shown in FIG. 7.

In the twentieth embodiment, in the case where aperture widths are varied by the light-receiving cells, the heights of microlenses 523A and 523B are different. Specifically, the height of the microlens 523B in the light-receiving cell B having a smaller aperture width is higher than the height of the microlens 523A in the light-receiving cell A having a larger aperture width. For example, it can be set the height of the microlens 523 as 1.0 μm and the height of the microlens 523B as 1.2 μm.

Consequently, light-condensing efficiencies obtained by the light-receiving cell B and the light-receiving cell A can be optimized at the same time so that sensitivities of the light-receiving cells including both of the light-receiving cells A and B can be significantly improved.

Twenty-First Embodiment

Figure 32:
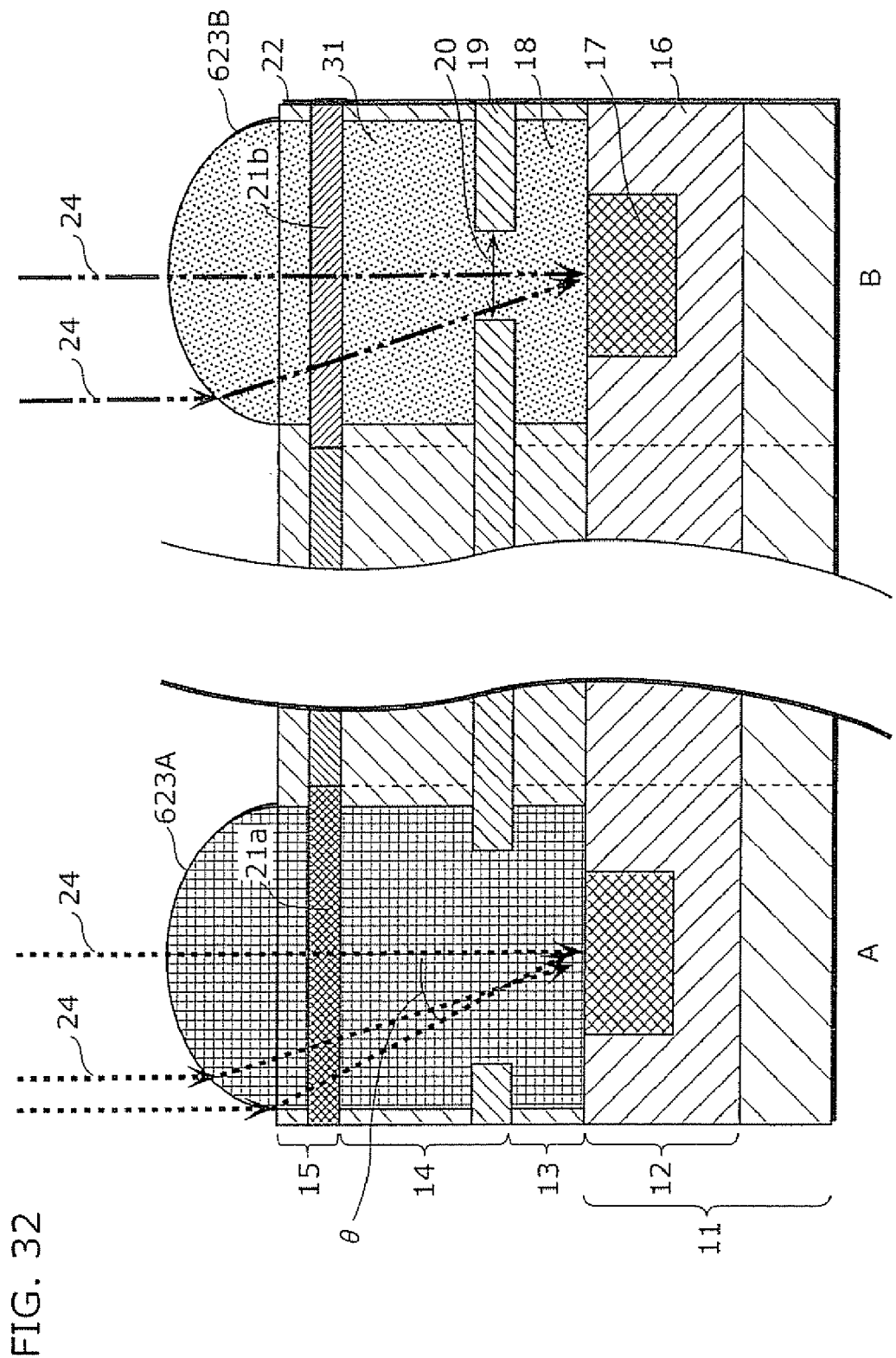
FIG. 32 is a cross-section diagram of light-receiving cells A and B in a solid-state image sensor according to the twenty-first embodiment.

FIG. 32 is a cross-section diagram showing light-receiving cells A and B in a solid-state image sensor according to the twenty-first embodiment of the present invention. Each light-receiving cell includes a substrate 11 having a photoelectric conversion layer 12, an insulating layer 13, an insulating layer in a metal layer 14 and a color filter layer 15 that are configured as in the conventional solid-state image sensor shown in FIG. 7.

The twenty-first embodiment describes a configuration in which refractive indexes of the insulating layer 13, an insulating layer in the metal layer 14, and the microlenses 623A and 623B are set to be the same value respectively in the light-receiving cell A having a smaller aperture width and in the light-receiving cell B having a larger aperture width. For example, single material is used to form the insulating film 13, the insulating film in the metal layer 14, and the microlenses 623A and 623B so that their refractive indexes are set to be the same value.

It should be noted that light-condensing efficiency of each microlens can be described by the following expression (Formula 3).

$$s = k \times \lambda / NA \quad (NA = n \cdot \sin\theta) \qquad \text{[Formula 3]}$$

s: a spread diameter of a spot on which light focuses k: a coefficient determined by an image formation condition λ: a wavelength n: a refractive index of a medium positioned below a microlens θ: an aperture angle of the microlens (θ shown in FIG. 32)

With the aforementioned expression (Formula 3), the spread diameter s of a spot on which light focuses is inversely proportional to the refractive index n. Here, an aperture width is smaller in the light-receiving cell B compared to the light-receiving cell A. Therefore, it is necessary to make the spread diameter s of the spot on which light focuses in the light-receiving cell B smaller than that in the light-receiving cell A. The spread diameter s of the spot on which light focuses in the light-receiving cell B can be made smaller than that in the light-receiving cell A by increasing the refractive index n of the microlens in the light-receiving cell B than in the light-receiving cell A.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, the solid-state image sensor based on the aforementioned embodiments may be used for a camera.

Furthermore, it is described that silicon oxide and the like are used as materials for the microlens or the high refractive index interlayer film. However, any material having a higher refractive index than that of the silicon oxide film which is commonly used as an insulating film may be applicable. For example, the material may be titanium oxide, tantalum oxide, niobium oxide or hafnium oxide.

INDUSTRIAL APPLICABILITY

The present invention can be used for a solid-state image sensor and the like, in particular for the solid-state image sensor used for a digital camera, a digital video camera, and the like.

What is claimed is:

1. A solid-state image sensor comprising:
a semiconductor substrate;
photoelectric conversion units formed in said semiconductor substrate;
microlenses formed above said semiconductor substrate so as to be positioned above the respective photoelectric conversion units; and
a color filter which includes filter films arranged in a two-dimensional array and which is formed above said semiconductor substrate so that the filter films are positioned above the respective photoelectric conversion units,
wherein each microlens is made of a low refractive index material and a high refractive index material,
said photoelectric conversion units are a first photoelectric conversion unit and a second photoelectric conversion unit, said second photoelectric conversion unit being positioned below one of the filter films transmitting light of a longer wavelength than a wavelength of the light transmitted by another one of the filter films positioned above said first photoelectric conversion unit, and
a volume of a high refractive index material included in one of the microlenses positioned above said second photoelectric conversion unit is greater than a volume of a high refractive index material included in another one of the microlenses positioned above said first photoelectric conversion unit.

2. A solid-state image sensor comprising:
a semiconductor substrate;
photoelectric conversion units formed in said semiconductor substrate; and
microlenses formed above said semiconductor substrate so as to be positioned above the respective photoelectric conversion units,
wherein each microlens is made of a low refractive index material and a high refractive index material,
said photoelectric conversion units are a first photoelectric conversion unit and a second photoelectric conversion unit, in which light enters at a greater incident angle than an incident angle at which light enters said first photoelectric conversion unit, and
a volume of a high refractive index material included in one of the microlenses positioned above said second photoelectric conversion unit is greater than a volume of a high refractive index material included in another one of the microlenses positioned above said first photoelectric conversion unit.

3. A solid-state image sensor comprising:
a semiconductor substrate;
light-receiving cells which are formed in said semiconductor substrate, and have photoelectric conversion units which generate signal charge in accordance with a luminance of incident light; and
microlenses formed above the respective photoelectric conversion units,
wherein one of said microlenses of a first light-receiving cell and another one of said microlenses of a second light-receiving cell are respectively made of at least a low refractive index material and a high refractive index material, and
a volume of the high refractive index material included in said microlens of said first light-receiving cell is greater than a volume of the high refractive index material included in said microlens of said second light-receiving cell.

* * * * *